United States Patent
Das

(10) Patent No.: US 10,229,897 B2
(45) Date of Patent: Mar. 12, 2019

(54) MULTI-LAYER SEMICONDUCTOR STRUCTURE AND METHODS FOR FABRICATING MULTI-LAYER SEMICONDUCTOR STRUCTURES

(71) Applicant: Massachusetts Institute of Technology, Cambridge, MA (US)

(72) Inventor: Rabindra N. Das, Lexington, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 0 days.

(21) Appl. No.: 15/271,755

(22) Filed: Sep. 21, 2016

(65) Prior Publication Data

US 2017/0194248 A1 Jul. 6, 2017

Related U.S. Application Data

(63) Continuation of application No. PCT/US2015/044608, filed on Aug. 11, 2015.
(Continued)

(51) Int. Cl.
*H01L 25/10* (2006.01)
*H01L 23/48* (2006.01)
(Continued)

(52) U.S. Cl.
CPC .......... *H01L 25/105* (2013.01); *H01L 21/187* (2013.01); *H01L 21/30625* (2013.01);
(Continued)

(58) Field of Classification Search
CPC ............... H01L 21/187; H01L 21/2007; H01L 21/8221; H01L 25/0657; H01L 25/074; H01L 27/0688
See application file for complete search history.

(56) References Cited

U.S. PATENT DOCUMENTS 4,316,200 A 2/1982 Ames et al.
4,612,083 A * 9/1986 Yasumoto ............. H01L 21/187
148/DIG. 164
(Continued)

FOREIGN PATENT DOCUMENTS

WO WO 2016/025451 A1 2/2016
WO WO 2016/025478 A1 2/2016
(Continued)

OTHER PUBLICATIONS

U.S. Appl. No. 15/342,478, dated Nov. 3, 2016, Oliver, et al.
(Continued)

*Primary Examiner* — Bryan R Junge
(74) *Attorney, Agent, or Firm* — Daly, Crowley, Mofford & Durkee, LLP

(57) ABSTRACT

A multi-layer semiconductor device (or structure) includes at least two semiconductor structures, each of the at least two semiconductor structures having first and second opposing surfaces. Additionally, each of the at least two semiconductor structures includes a first section having first and second opposing surfaces and a plurality of electrical connections extending between select portions of the first and second surfaces. Each of the at least two semiconductor structures also includes a second section having first and second opposing surfaces, with the first surface of the second section disposed over and coupled to the second surface of the first section. Methods for fabricating a multi-layer semiconductor structure from a plurality of semiconductor structures are also provided.

27 Claims, 25 Drawing Sheets

Related U.S. Application Data

(60) Provisional application No. 62/035,713, filed on Aug. 11, 2014.

(51) Int. Cl.

| | | |
|---|---|---|
| *H01L 23/522* | (2006.01) | |
| *H01L 23/532* | (2006.01) | |
| *H01L 25/065* | (2006.01) | |
| *H01L 25/00* | (2006.01) | |
| *H01L 21/48* | (2006.01) | |
| *H01L 23/538* | (2006.01) | |
| *H01L 23/498* | (2006.01) | |
| *H01L 23/00* | (2006.01) | |
| *H01L 21/18* | (2006.01) | |
| *H01L 21/306* | (2006.01) | |
| *H01L 21/768* | (2006.01) | |
| *H01L 23/528* | (2006.01) | |

(52) U.S. Cl.
CPC .... *H01L 21/4846* (2013.01); *H01L 21/76898* (2013.01); *H01L 23/481* (2013.01); *H01L 23/49822* (2013.01); *H01L 23/49827* (2013.01); *H01L 23/49838* (2013.01); *H01L 23/528* (2013.01); *H01L 23/5226* (2013.01); *H01L 23/5329* (2013.01); *H01L 23/5383* (2013.01); *H01L 23/5385* (2013.01); *H01L 23/5386* (2013.01); *H01L 23/53209* (2013.01); *H01L 24/16* (2013.01); *H01L 25/00* (2013.01); *H01L 25/0657* (2013.01); *H01L 25/50* (2013.01); *H01L 2224/16225* (2013.01); *H01L 2224/16227* (2013.01); *H01L 2224/73253* (2013.01); *H01L 2224/92144* (2013.01); *H01L 2225/06513* (2013.01); *H01L 2225/06541* (2013.01); *H01L 2225/1023* (2013.01); *H01L 2225/1058* (2013.01); *H01L 2225/1082* (2013.01); *H01L 2225/1094* (2013.01); *H01L 2924/15192* (2013.01); *H01L 2924/15311* (2013.01)

(56) References Cited

U.S. PATENT DOCUMENTS

| | | | |
|---|---|---|---|
| 5,057,877 | A | 10/1991 | Briley et al. |
| 5,156,997 | A | 10/1992 | Kumar et al. |
| 5,179,070 | A | 1/1993 | Harada et al. |
| 5,371,328 | A | 12/1994 | Gutierrez et al. |
| 5,650,353 | A * | 7/1997 | Yoshizawa .......... H01L 21/2007 148/DIG. 12 |
| 5,773,875 | A | 6/1998 | Chan |
| 6,108,214 | A | 8/2000 | Fuse |
| 6,297,551 | B1 | 10/2001 | Dudderar et al. |
| 6,324,755 | B1 | 12/2001 | Borkowski et al. |
| 6,346,469 | B1 | 2/2002 | Greer |
| 6,355,501 | B1 | 3/2002 | Fung et al. |
| 6,396,371 | B2 | 5/2002 | Streeter et al. |
| 6,436,740 | B1 | 8/2002 | Jen et al. |
| 6,485,565 | B1 | 11/2002 | Springer |
| 6,678,167 | B1 | 1/2004 | Degani et al. |
| 6,819,000 | B2 | 11/2004 | Magerlein et al. |
| 6,825,534 | B2 | 11/2004 | Chen et al. |
| 6,838,774 | B2 | 1/2005 | Patti |
| 7,427,803 | B2 | 9/2008 | Chao et al. |
| 7,589,390 | B2 | 9/2009 | Yao |
| 7,624,088 | B2 | 11/2009 | Johnson et al. |
| 7,932,515 | B2 | 4/2011 | Bunyk |
| 7,939,926 | B2 | 5/2011 | Kaskoun et al. |
| 7,993,971 | B2 | 8/2011 | Chatterjee et al. |
| 8,202,785 | B2 | 6/2012 | Castex et al. |
| 8,354,746 | B2 | 1/2013 | Huang et al. |
| 8,466,036 | B2 | 6/2013 | Brindle et al. |
| 8,487,444 | B2 | 7/2013 | Law et al. |
| 8,492,911 | B2 | 7/2013 | Bachman et al. |
| 8,513,058 | B2 * | 8/2013 | Iwamatsu .......... H01L 21/76898 257/278 |
| 8,519,543 | B1 | 8/2013 | Song et al. |
| 8,546,188 | B2 | 10/2013 | Liu et al. |
| 8,563,403 | B1 * | 10/2013 | Farooq ............ H01L 21/8221 257/E21.597 |
| 8,564,955 | B2 | 10/2013 | Schmidt et al. |
| 8,736,068 | B2 | 5/2014 | Bartley et al. |
| 8,754,321 | B2 | 6/2014 | Schroeder et al. |
| 8,828,860 | B2 | 9/2014 | Gruber et al. |
| 8,928,128 | B2 | 1/2015 | Karikalan et al. |
| 8,954,125 | B2 | 2/2015 | Corcoles Gonzalez et al. |
| 9,076,658 | B1 | 7/2015 | Brown et al. |
| 9,171,792 | B2 | 10/2015 | Sun et al. |
| 9,577,005 | B2 * | 2/2017 | Yokoyama .......... H01L 31/0224 |
| 2001/0005059 | A1 * | 6/2001 | Koyanagi .......... H01L 21/8221 257/778 |
| 2001/0016383 | A1 | 8/2001 | Chen et al. |
| 2002/0094661 | A1 * | 7/2002 | Enquist .......... H01L 21/2007 438/455 |
| 2003/0067073 | A1 | 4/2003 | Akram et al. |
| 2004/0124538 | A1 | 7/2004 | Reif et al. |
| 2004/0188845 | A1 | 9/2004 | Iguchi et al. |
| 2006/0191640 | A1 * | 8/2006 | Johnson .......... B32B 37/10 156/382 |
| 2007/0087544 | A1 | 4/2007 | Chang et al. |
| 2007/0119812 | A1 * | 5/2007 | Kerdiles .......... C03C 27/00 216/34 |
| 2007/0207592 | A1 * | 9/2007 | Lu .......... H01L 21/6835 438/455 |
| 2008/0093747 | A1 | 4/2008 | Enquist et al. |
| 2008/0122115 | A1 | 5/2008 | Popa et al. |
| 2008/0169559 | A1 | 7/2008 | Yang |
| 2008/0230916 | A1 | 9/2008 | Saito et al. |
| 2008/0290790 | A1 | 11/2008 | Jin |
| 2008/0316714 | A1 | 12/2008 | Eichelberger et al. |
| 2009/0078966 | A1 | 3/2009 | Asai et al. |
| 2009/0173936 | A1 | 7/2009 | Bunyk |
| 2009/0186446 | A1 | 7/2009 | Kwon et al. |
| 2009/0233436 | A1 | 9/2009 | Kim et al. |
| 2010/0001399 | A1 | 1/2010 | Topacio |
| 2010/0026447 | A1 | 2/2010 | Keefe et al. |
| 2010/0122762 | A1 * | 5/2010 | George .......... H01L 21/187 156/64 |
| 2010/0130016 | A1 | 5/2010 | DeVilliers |
| 2010/0148371 | A1 | 6/2010 | Kaskoun et al. |
| 2010/0171093 | A1 | 7/2010 | Kabir |
| 2011/0049675 | A1 | 3/2011 | Nagai et al. |
| 2011/0140271 | A1 | 6/2011 | Daubenspeck et al. |
| 2011/0143506 | A1 * | 6/2011 | Lee .......... H01L 23/481 438/238 |
| 2011/0168434 | A1 * | 7/2011 | Farooq .......... H01L 21/2007 174/257 |
| 2011/0189820 | A1 * | 8/2011 | Sasaki .......... H01L 21/02008 438/107 |
| 2011/0204505 | A1 | 8/2011 | Pagaila et al. |
| 2011/0237069 | A1 | 9/2011 | Miyazaki |
| 2011/0248396 | A1 | 10/2011 | Liu et al. |
| 2012/0032340 | A1 | 2/2012 | Choi et al. |
| 2012/0074585 | A1 | 3/2012 | Koo et al. |
| 2012/0217642 | A1 | 8/2012 | Sun et al. |
| 2012/0228011 | A1 | 9/2012 | Chang et al. |
| 2012/0231621 | A1 | 9/2012 | Chang et al. |
| 2012/0252189 | A1 | 10/2012 | Sadaka et al. |
| 2012/0292602 | A1 | 11/2012 | Guo et al. |
| 2013/0029848 | A1 | 1/2013 | Gonzalez et al. |
| 2013/0093104 | A1 | 4/2013 | Wu et al. |
| 2013/0099235 | A1 | 4/2013 | Han |
| 2013/0147036 | A1 | 6/2013 | Choi et al. |
| 2013/0153888 | A1 | 6/2013 | Inoue et al. |
| 2013/0187265 | A1 | 7/2013 | Shih et al. |
| 2013/0244417 | A1 | 9/2013 | Markunas et al. |
| 2014/0001604 | A1 * | 1/2014 | Sadaka .......... H01L 23/473 257/621 |
| 2014/0065771 | A1 | 3/2014 | Gruber et al. |
| 2014/0113828 | A1 | 4/2014 | Gilbert et al. |

(56) References Cited

U.S. PATENT DOCUMENTS

| | | | |
|---|---|---|---|
| 2014/0246763 | A1 | 9/2014 | Bunyk |
| 2014/0264890 | A1 | 9/2014 | Breuer et al. |
| 2015/0041977 | A1 | 2/2015 | Daubenspeck et al. |
| 2015/0054151 | A1 | 2/2015 | Choi et al. |
| 2015/0054167 | A1 | 2/2015 | Pendse |
| 2015/0054175 | A1 | 2/2015 | Meinhold et al. |
| 2015/0187840 | A1 | 7/2015 | Ladizinsky et al. |
| 2015/0348874 | A1* | 12/2015 | Tsai ............... H01L 23/481 257/774 |
| 2016/0364653 | A1 | 12/2016 | Chow et al. |

FOREIGN PATENT DOCUMENTS

| | | | |
|---|---|---|---|
| WO | WO 2016/073049 | A1 | 5/2016 |
| WO | WO 2016/118209 | A2 | 7/2016 |
| WO | WO 2016/118210 | A2 | 7/2016 |
| WO | WO 2017/015432 | A1 | 1/2017 |

OTHER PUBLICATIONS

U.S. Appl. No. 15/342,589, dated Nov. 3, 2016, Oliver, et al.
U.S. Appl. No. 15/342,444, dated Nov. 3, 2016, Oliver, et al.
U.S. Appl. No. 15/342,517, dated Nov. 3, 2016, Oliver, et al.
U.S. Appl. No. 15/303,800, dated Oct. 13, 2016, Das, et al.
U.S. Appl. No. 14/694,540, dated Apr. 23, 2015, Das, et al.
PCT Search Report of the ISA for PCT Appl. No. PCT/US2015/059181 dated Sep. 7, 2016; 5 pages.
PCT Written Opinion of the ISA for PCT Appl. No. PCT/US2015/059181 dated Sep. 7, 2016; 12 pages.
PCT Search Report of the ISA for PCT Appl. No. PCT/US2015/059200 dated Jul. 21, 2016; 3 pages.
PCT Written Opinion of the ISA for PCT Appl. No. PCT/US2015/059200 dated Jul. 21, 2016; 13 pages.
PCT Search Report of the ISA for PCT Appl. No. PCT/US2015/044608 dated Dec. 31, 2015; 5 pages.
PCT Written Opinion of the ISA for PCT Appl. No. PCT/US2015/044608 dated Dec. 31, 2015; 7 pages.
PCT Search Report of the ISA for PCT Appl. No. PCT/US2015/044679 dated Apr. 13, 2016; 3 pages.
PCT Written Opinion of the ISA for PCT Appl. No. PCT/US2015/044679 dated Apr. 13, 2016; 7 pages.
PCT Search Report of the ISA for PCT Appl. No. PCT/US2015/044651 dated Nov. 4, 2015; 3 pages.
PCT Written Opinion of the ISA for PCT Appl. No. PCT/US2015/044651 dated Nov. 4, 2015; 12 pages.
U.S. Appl. No. 15/312,063, dated Nov. 17, 2016, Das, et al.
Ohya, et al.; "Room Temperature Deposition of Sputtered TiN Films for Superconducting Coplanar Waveguide Resonators;" IOP Publishing—Superconductor Science and Technology; vol. 27; Mar. 26, 2014; 10 pages.
Tarniowy, et al.; "The Effect of Thermal Treatment on the Structure, Optical and Electrical Properties of Amorphous Titanium Nitride Thin Films;" Thin Solid Films 311; 1997; 8 pages.
PCT Search Report of the ISA for PCT/US2016/052824 dated Feb. 3, 2017; 6 pages.
PCT Written Opinion of the ISA for PCT/US2016/052824 dated Feb. 3, 2017; 6 pages.
PCT Search Report of the ISA for PCT/US2016/043266 dated Dec. 5, 2016; 5 pages.
PCT Written Opinion of the ISA for PCT/US2016/043266 dated Dec. 5, 2016; 9 pages.
Office Action dated Mar. 3, 2017 for U.S. Appl. No. 14/694,540; dated 16 pages.
PCT International Search Report of the ISA for Appl. No. PCT/US2016/060263 dated Jan. 10, 2017; 3 pages.
PCT Written Opinion of the ISA for Appl. No. PCT/US2016/060263 dated Jan. 10, 2017; 6 pages.
International Preliminary Report dated Feb. 23, 2017 for PCT Application No. PCT/US2015/044608; 9 pages.
International Preliminary Report dated Feb. 23, 2017 for PCT Application No. PCT/US2015/044679; 9 pages.
International Preliminary Report dated Feb. 23, 2017 for PCT Application No. PCT/US2015/044651; 10 pages.
Office Action dated Mar. 24, 2017 for U.S. Appl. No. 15/303,800, 39 pages.
PCT Search Report of the ISA for PCT/US2016/060296 dated Mar. 10, 2017; 5 pages.
PCT Written Opinion of the ISA for PCT/US2016/060296 dated Mar. 10, 2017; 5 pages.
PCT Search Report of the ISA for PCT/US2016/060309 dated Mar. 24, 2017; 6 pages.
PCT Written Opinion of the ISA for PCT/US2016/060309 dated Mar. 24, 2017; 10 pages.
Restriction Requirement dated Apr. 28, 2017 for U.S. Appl. No. 15/342,444; 9 pages.
Response to Restriction Requirement and Preliminary Amendment dated Apr. 28, 2017 for U.S. Appl. No. 15/342,444, filed May 19, 2017; 6 pages.
Restriction Requirement dated May 16, 2017 for U.S. Appl. No. 15/327,249; 6 pages.
PCT International Preliminary Report of Patentability dated May 18, 2017 for PCT Appl. No. PCT/US2015/059181; 11 pages.
PCT International Preliminary Report of Patentability dated May 18, 2017 for PCT Appl. No. PCT/US2015/059200; 11 pages.
Office Action dated Aug. 11, 2017 for U.S. Appl. No. 15/342,444; 22 pages.
Burns, et al.; "3D Circuit Integration Technology for Multiproject Fabrication;" MIT Lincoln Laboratory Presentation; Apr. 7, 2000; 15 pages.
Courtland; "Google Aims for Quantum Computing Supremacy;" Spectrum.IEEE.Org; North America; Jun. 2017; 2 pages.
International Search Report of the ISA for PCT Appl. No. PCT/US2016/060343 dated Jul. 18, 2017; 3 pages.
International Written Opinion of the ISA for PCT Appl. No. PCT/US2016/060343 dated Jul. 18, 2017; 12 pages.
Notice of Allowance for U.S. Appl. No. 15/327,235 dated Jun. 30, 2017; 17 pages.
Notice of Allowance for U.S. Appl. No. 14/694,540 dated Jul. 31, 2017; 9 pages.
Notice of Allowance for U.S. Appl. No. 15/312,063 dated Aug. 2, 2017; 17 pages.
Response to Office Action dated Mar. 3, 2017 for U.S. Appl. No. 14/694,540, filed Jun. 1, 2017; 24 pages.
Response to Office Action dated Mar. 24, 2017 for U.S. Appl. No. 15/303,800, filed Jun. 26, 2017; 22 pages.
Response to Restriction Requirement dated May 16, 2017 for U.S. Appl. No. 15/327,249, filed Jun. 27, 2017; 1 page.
U.S. Appl. No. 15/684,269, dated Aug. 23, 2017, Das, et al.
U.S. Appl. No. 15/684,337, dated Aug. 23, 2017, Das, et al.
U.S. Appl. No. 15/684,393, dated Aug. 23, 2017, Das, et al.
Notice of Allowance dated Oct. 12, 2017 for U.S. Appl. No. 15/303,800; 16 pages.
Response to Aug. 11, 2017 Office Action for U.S. Appl. No. 15/342,444, filed Sep. 15, 2017; 20 pages.
U.S. Appl. No. 15/745,914, dated Jan. 18, 2018, Oliver, et al.
Office Action dated Jan. 11, 2018 for U.S. Appl. No. 15/327,239; 33 pages.
PCT International Preliminary Report on Patentability dated Feb. 1, 2018 for PCT Appl. No. PCT/US2016/043266; 11 pages.
Response to Final Office Action dated Dec. 6, 2017 for U.S. Appl. No. 15/342,444; Response filed Mar. 2, 2018; 16 pages.
Restriction Requirement dated Jan. 3, 2018 for U.S. Appl. No. 15/342,478; 6 pages.
Response to Restriction Requirement dated Jan. 3, 2018 for U.S. Appl. No. 15/342,478, filed Mar. 2, 2018; 6 pages.
Advisory Action dated Mar. 20, 2018 for U.S. Appl. No. 15/342,444; 3 pages.
U.S. Non-Final Office Action dated Mar. 21, 2018 for U.S. Appl. No. 15/342,589; 25 pages.
U.S. Non-Final Office Action dated Apr. 23, 2018 for U.S. Appl. No. 15/342,478; 11 Pages.

(56) References Cited

OTHER PUBLICATIONS

U.S. Non-Final Office Action dated Apr. 19, 2018 for U.S. Appl. No. 15/342,517; 8 Pages.
Response to U.S. Non-Final Office Action dated Jan. 11, 2018 for U.S. Appl. No. 15/327,239; Response filed Apr. 9, 2018; 25 Pages.
Response to U.S. Non-Final Office Action dated Oct. 20, 2017 for U.S. Appl. No. 15/327,249; Response filed Apr. 19, 2018; 19 Pages.
U.S. Final Office Action dated May 9, 2018 for U.S. Appl. No. 15/327,239; 25 Pages.
Response to U.S. Final Office Action dated Dec. 6, 2017 for U.S. Appl. No. 15/342,444; Response filed May 4, 2018; 18 Pages.
U.S. Non-Final Office Action dated May 11, 2018 for U.S. Appl. No. 15/684,393; 15 Pages.
PCT International Preliminary Report dated May 17, 2018 for International Application No. PCT/US2016/060296; 7 Pages.
PCT International Preliminary Report dated May 17, 2018 for International Application No. PCT/US2016/060343; 9 Pages.
PCT International Preliminary Report dated May 17, 2018 for International Application No. PCT/US2016/060263; 8 Pages.
PCT International Preliminary Report dated May 17, 2018 for International Application No. PCT/US2016/060309; 8 Pages.
Office Action dated Oct. 20, 2017 for U.S. Appl. No. 15/327,249; 30 pages.
Final Office Action dated Dec. 6, 2017 for U.S. Appl. No. 15/342,444; 18 pages.
Restriction Requirement dated Oct. 23, 2017 for U.S. Appl. No. 15/342,517; 6 pages.
Notice of Allowance dated Jul. 9, 2018 for U.S. Appl. No. 15/327,249; 15 Pages.
Notice of Allowance dated Jul. 18, 2018 for U.S. Appl. No. 15/342,444; 11 Pages.
Response to Office Action dated Apr. 19, 2018 for U.S. Appl. No. 15/342,517, filed Jul. 17, 2018; 14 Pages.
Final Office Action dated Oct. 23, 2018 for U.S. Appl. No. 15/342,478; 21 pages.
Non-Final Office Action dated Nov. 8, 2018 for U.S. Appl. No. 15/327,239; 26 pages.
Notice of Allowance dated Oct. 3, 2018 for U.S. Appl. No. 15/342,517; 13 pages.
Notice of Allowance dated Nov. 8, 2018 for U.S. Appl. No. 15/684,393; 8 pages.
Restriction Requirement dated Oct. 11, 2018 for U.S. Appl. No. 15/684,337; 8 pages.
Response to Restriction Requirement dated Oct. 11, 2018 for U.S. Appl. No. 15/684,337, filed Nov. 9, 2018; 10 pages.

* cited by examiner

| Number of semiconductor structures in multi-layer semiconductor structure: | Maximum number of bonding cycles an individual semiconductor structure experiences: (Embodiment 1) | Maximum number of bonding cycles an individual semiconductor structure experiences: (Embodiment 2) | Maximum number of bonding cycles an individual semiconductor structure experiences: (Embodiment 3) | Maximum number of bonding cycles an individual semiconductor structure experiences: (Embodiment 4) |
|---|---|---|---|---|
| 4 | 2 | | | |
| 5 | 3 | | | |
| 6 | 3 | | 2 | |
| 7 | 3 | | | 2 |
| 8 | 3 | | | 2 |
| 9 | | 2 | | |
| 12 | 4 | | 3 | |
| 16 | 4 | | | 3 |
| 18 | 5 | | 4 | |
| 21 | | 3 | | |
| 24 | 5 | | 4 | 3 |
| 27 | | 3 | | |
| 32 | 5 | | | |

FIG. 20

MULTI-LAYER SEMICONDUCTOR STRUCTURE AND METHODS FOR FABRICATING MULTI-LAYER SEMICONDUCTOR STRUCTURES

CROSS REFERENCE TO RELATED APPLICATION

This application is a Continuation-in-Part (CIP) application of and claims the benefit of and priority to International Application No. PCT/US2015/044608, filed on Aug. 11, 2015, which application claims the benefit of U.S. Provisional Application No. 62/035,713 filed on Aug. 11, 2014 under 35 U.S.C. § 119(e), which applications are hereby incorporated herein by reference in their entirety.

GOVERNMENT RIGHTS

This invention was made with Government support under Contract No. FA8721-05-C-0002 awarded by the U.S. Air Force. The Government has certain rights in the invention.

FIELD

This disclosure relates generally to multi-layer semiconductor structures, and more particularly, to multi-layer semiconductor structures and methods for fabricating multi-layer semiconductor structures from a plurality of semiconductor structures.

BACKGROUND

As is known in the art, there is trend toward miniaturization of electronic products such as mobile phones, tablets, digital cameras, and the like. Consequently, there has been a trend in semiconductor device manufacturing towards smaller and more densely packed semiconductor structures. This has resulted in a demand for semiconductor packages which are relatively low loss, lightweight structures and which support increased electronic capabilities (e.g., increased density, mobility and extended operational life) in miniaturized electronic products demanded by both military and commercial customers alike.

The foregoing trend and demand, drives a need for multi-layer semiconductor structures, semiconductor structures (or devices) including at least two semiconductor structures. The foregoing trend and demand also drives a need for improved methods for fabricating multi-layer semiconductor structures.

SUMMARY

Described herein are concepts, systems, circuits and techniques related to multi-layer semiconductor structures and methods for fabricating multi-layer semiconductor structures from a plurality of semiconductor structures.

In one aspect of the concepts described herein, a multi-layer semiconductor device (or structure) includes at least two semiconductor structures with each of the at least two semiconductor structures having first and second opposing surfaces and including a first section having first and second opposing surfaces and a plurality of electrical connections extending between select portions of the first and second surfaces. The first surface of the first section corresponds to the first surface of the at least two semiconductor structures. Additionally, each of the at least two semiconductor structures includes a second section having first and second opposing surfaces. The first surface of the second section is disposed over and coupled to the second surface of the first section.

The second section includes a device layer having first and second opposing surfaces and a plurality of electrical connections extending between the first and second surfaces. The second surface of the device layer corresponds to the second surface of the second section. The second section also includes an insulating layer having first and second opposing surfaces. The first surface of the insulating layer corresponds to the first surface of the second section. Each of the at least two semiconductor structures additionally include one or more conductive structures extending between select ones of the plurality of electrical connections in the first section, select ones of the plurality of electrical connections in the device layer of the second section, and select portions on or beneath the second surface of each of the at least two semiconductor structures.

Each of the at least two semiconductor structures further include one or more interconnect pads having first and second opposing surfaces and one or more sides. The first surface of each one of the interconnect pads is disposed over or beneath select portions of at least the second surface of each of the at least two semiconductor structures and select ones of the one or more interconnect pads are electrically coupled to the one or more conductive structures.

The multi-layer semiconductor device also includes a via joining layer disposed between and coupled to second surfaces of each of the at least two semiconductor structures. The via joining layer has first and second opposing surfaces and at least one conductive structure extending between select portions of the first and second surfaces. The at least one conductive structure is electrically coupled to second surfaces of select ones of the one or more interconnect pads on the at least two semiconductor structures to form one or more electrical connections between the at least two semiconductor structures.

The multi-layer semiconductor device may include one or more of the following features individually or in combination with other features. At least one of the one or more electrical connections formed between the at least two semiconductor structures may be an electrical connection between select ones of the plurality of electrical connections in the first section of a first one of the at least two semiconductor structures and select ones of the plurality of electrical connections in the first section of a second one of the at least two semiconductor structures. A predetermined distance of between about one micrometer (μm) and about four μm may exist between the first and second surfaces of the via joining layer. The predetermined distance may correspond to a height of the via joining layer and a height of the at least one conductive structure. A predetermined distance of between about six micrometers (μm) and about ten μm may exist between the first and second surfaces of the second section in a first one of the at least two semiconductor structures. The predetermined distance may correspond to a height of the second section.

The multi-layer semiconductor device may also include one or more of the following features individually or in combination with other features. The at least one conductive structure in the via joining layer may include a plurality of conducting metals, the plurality of metals including at least one of Nickel (Ni), Copper (Cu), Aluminum (Al), Zinc (Zn) and Tin (Sn). The via joining layer may include an oxide material. The second section of a first one of the at least two semiconductor structures may include a first conductive structure of the one or more conductive structures. The first conductive structure may have first and second opposing surfaces extending between the first and second surfaces of the second section of the first one of the at least two semiconductor structures. The first surface of the first conductive structure may have first dimensions and the second surface of the first conductive structure may have second, different dimensions. The first surface of the first conductive structure may have a diameter between about two µm and about three µm. The second surface of the first conductive structure may have a diameter between about two µm and about three µm.

The multi-layer semiconductor device may additionally include one or more of the following features individually or in combination with other features. At least one of the one or more conductive structures extending between select ones of the plurality of electrical connections in the first section and select ones of the plurality of electrical connections in the device layer of the second section may be provided as a through insulator via (TIV) conductive structure. The insulating layer of the second section may be provided from an oxide material including at least one of silicon dioxide ($SiO_2$) and chemically treated silicon oxide (SiO), wherein the SiO is chemically treated through a chemical vapor deposition process. At least one of the one or more conductive structures extending between select ones of the plurality of electrical connections in the first section and select ones of the plurality of electrical connections in the device layer of the second section may be provided as a through oxide via (TOV) conductive structure.

The multi-layer semiconductor device may further include one or more of the following features individually or in combination with other features. The device layer of the second section may further include one or more circuit components disposed between the first and second surfaces of the device layer. The one or more circuit components may be electrically coupled to select ones of the plurality of electrical connections. The device layer of the second section may include an oxide material which is deposited over the second surface of the insulating layer. At least the second section may be fabricated using Silicon-On-Insulator (SOI) fabrication techniques. The first section may be fabricated using either SOI or bulk complementary metal-oxide semiconductor (CMOS) fabrication techniques. The first section and the second section may be substantially the same. A first one of the at least two semiconductor structures may be provided having a first form factor and a second one of the at least two semiconductor structures may be provided having a second different, form factor. The multi-layer semiconductor device may be integrated into a communications device.

The multi-layer semiconductor device may also include one or more of the following features individually or in combination with other features. At least one of the at least two semiconductor structures may further include a third section having first and second opposing surfaces. The first surface of the third section may be disposed over and coupled to the first surface of the second section. The third section may include a device layer having first and second opposing surfaces and a plurality of electrical connections extending between the first and second surfaces. The second surface of the device layer may correspond to the second surface of the third section. The third section may also include an insulating layer having first and second opposing surfaces. The first surface of the insulating layer may correspond to the first surface of the third section. At least one of the one or more conductive structures in the at least one of the at least two semiconductor structures may extend between select ones of the plurality of electrical connections in the device layer of the second section, select ones of the plurality of electrical connections in the device layer of the third section, and select portions on or beneath the second surface of the at least one of the at least two semiconductor structures.

In one aspect of the concepts described herein, a method for fabricating a multi-layer semiconductor structure from a plurality of semiconductor structures includes performing a first bonding cycle comprising identifying a number of the semiconductor structures to bond in the first bonding cycle. Each of the semiconductor structures has first and second opposing surfaces and includes at least one active layer disposed between the first and second surfaces. The first bonding cycle also includes forming bonding pairs from selected ones of the identified number of semiconductor structures to bond in the first bonding cycle, and bonding active layers of selected bonding pairs at a substantially same time to provide bonded semiconductor structures. The first bonding cycle further includes performing a first post bond process to remove one or more handles from each of the bonded semiconductor structures to expose one or more active layers in the bonded semiconductor structures.

The method also includes performing a next bonding cycle comprising identifying a number of semiconductor structures to bond in the next bonding cycle. The next bonding cycle also comprises bonding active layers of selected pairs of the identified number of semiconductor structures at a substantially same time to provide bonded semiconductor structure pairs. The next bonding cycle further comprises performing a next post bond process to remove one or more handles from each of the bonded semiconductor structure pairs to expose one or more active layers in the bonded semiconductor structure pairs.

The method may include one or more of the following features either individually or in combination with other features. The method may further comprise: subsequent to performing the next post bond process, determining if there are more semiconductor structure pairs to bond in fabricating the multi-layer semiconductor structure. Additionally, the method may comprise: in response to there being more semiconductor structure pairs to bond, performing the next bonding cycle. Identifying the number of semiconductor structures to bond in the next bonding cycle may comprise: identifying the number of semiconductor structures from the bonded semiconductor structures and from other semiconductor structures of the plurality of semiconductor structures. Identifying the number of semiconductor structures to bond in the first bonding cycle may comprise: selecting the number of semiconductor structures to bond in the first bonding cycle to reduce or minimize a number of bonding cycles which each of the semiconductor structures is subject to during fabrication of the multi-layer semiconductor structure.

Forming bonding pairs from selected ones of the identified number of semiconductor structures may comprise: selecting semiconductor structures of the identified number of semiconductor structures to form bonding pairs such that at least one semiconductor structure in each bonding pair has two bondable sides or surfaces. Bonding active layers of selected ones of the bonding pairs may comprise: depositing a bondable oxide material or layer on bonding surfaces of the selected ones of the bonding pairs; and bonding the bonding surfaces of the selected ones of the bonding pairs at a substantially same time to provide bonded semiconductor structures. Depositing the bondable oxide material or layer on the bonding surfaces may comprise: planarizing the bonding surfaces of the selected ones of the bonding pairs using chemical-mechanical planarization (CMP); and depositing the bondable oxide material or layer on the planarized bonding surfaces.

The method may further comprise: forming one or more electrical connections between active layers in the bonded semiconductor structures using via last and/or via first techniques. Performing the first post bond process may comprise: performing a combination of grinding and wet chemical etching on one or more handles from each of the bonded semiconductor structures to expose one or more active layers in the bonded semiconductor structures. The method may further comprise: performing chemical mechanical polishing (CMP) and annealing on exposed surfaces of the active layers to prepare the exposed active layer surfaces for subsequent bonding. Performing the next bonding cycle may further comprise: forming one or more through silicon vias (TSVs) in selected handles of the bonded semiconductor structure pairs.

In another aspect of the concepts described herein, a method for fabricating a multi-layer semiconductor structure from a plurality of semiconductor structures performing a first bonding cycle comprising identifying a number of semiconductor structures to bond in the first bonding cycle. Each of the semiconductor structures has first and second opposing surfaces and includes at least one active layer disposed between the first and second surfaces. The first bonding cycle also comprises arranging the identified number of semiconductor structures to bond in the first bonding cycle into groups of semiconductor structures. Each semiconductor structure group includes one double-sided bondable semiconductor structure and two single-sided bondable semiconductor structures. The first bonding cycle additionally comprises for each of the semiconductor structure groups, bonding the single-sided bondable semiconductor structures to each side of the double-sided bondable semiconductor structure to provide a bonded semiconductor structure. The first bonding cycle further comprises performing a first post bond process to remove one or more handles from each of the bonded semiconductor structures to expose one or more active layers in the bonded semiconductor structures.

The method also includes performing a next bonding cycle comprising identifying a number of semiconductor structures to bond in the next bonding cycle. The next bonding cycles also comprises bonding active layers of selected pairs of the identified number of semiconductor structures at a substantially same time to provide bonded semiconductor structure pairs. The next bonding cycle further comprises performing a next post bond process to remove one or more handles from each of the bonded semiconductor structure pairs to expose one or more active layers in the bonded semiconductor structure pairs.

The method may include one or more of the following features either individually or in combination with other features. The method may further comprise: subsequent to performing the next post bond process, determining if there are more semiconductor structure pairs to bond in fabricating the multi-layer semiconductor structure. Additionally, the method may comprise: in response to there being more semiconductor structure pairs to bond, performing the next bonding cycle. Identifying the number of semiconductor structures to bond in the next bonding cycle may comprise: identifying the number of semiconductor structures from the bonded semiconductor structures and from other semiconductor structures of the plurality of semiconductor structures.

Identifying the number of semiconductor structures to bond in the first bonding cycle may comprise: selecting the number of semiconductor structures to bond in the first bonding cycle to reduce or minimize a number of bonding cycles which each of the semiconductor structures is subject to during fabrication of the multi-layer semiconductor structure. Performing the next bonding cycle may further comprise: forming one or more electrical connections between the active layers in the bonded semiconductor structure pairs using via last and/or via first techniques. The method may further comprise forming one or more through silicon vias (TSVs) in selected handles of the bonded semiconductor structure pairs such that the TSVs are electrically coupled to one or more of the electrical connections formed in the active layers.

Performing the next bonding cycle may further comprise: arranging the identified number of semiconductor structures to bond in the next bonding cycle into pairs of semiconductor structures or groups of semiconductor structures. Each semiconductor structure pair may include at least one double-sided bondable semiconductor structure. Additionally, each semiconductor structure group may include one double-sided bondable semiconductor structure and two single-sided bondable semiconductor structures. The method may further comprise: for each of the semiconductor structure groups, bonding the single-sided bondable semiconductor structures to each side of the double-sided bondable semiconductor structure to provide a bonded semiconductor structure group. The method may further comprise: in the next post bond process, further removing one or more handles from each of the bonded semiconductor structure groups to expose one or more active layers in the bonded semiconductor structure groups.

In a further aspect of the concepts described herein, a multi-layer semiconductor device (e.g., a so-called "equivalent multi-layer semiconductor device) includes at least two multi-layer semiconductor structures. Each of the multi-layer semiconductor structures includes at least two semiconductor structures (e.g., vertically stacked semiconductor structures), and each of the semiconductor structures has first and second opposing surfaces. Each of the semiconductor structures also includes a first section having first and second opposing surfaces and a plurality of electrical connections extending between select portions of the first and second surfaces. The first surface of the first section corresponds to the first surface of the semiconductor structures. Each of the semiconductor structures additionally includes a second section having first and second opposing surfaces. The first surface of the second section is disposed over and coupled to the second surface of the first section.

The second section includes a device layer having first and second opposing surfaces and a plurality of electrical connections extending between the first and second surfaces. The second surface of the device layer corresponds to the second surface of the second section. The second section also includes an insulating layer having first and second opposing surfaces. The first surface of the insulating layer corresponds to the first surface of the second section.

Each of the semiconductor structures further includes one or more conductive structures extending between select ones of the plurality of electrical connections in the first section, select ones of the plurality of electrical connections in the device layer of the second section, and select portions on or beneath the second surface of each of the semiconductor structures. Each of the semiconductor structures also includes one or more interconnect pads having first and second opposing surfaces and one or more sides. The first surface of each one of the interconnect pads is disposed over or beneath select portions of at least the second surface of each of the semiconductor structures and select ones of the one or more interconnect pads are electrically coupled to the one or more conductive structures.

The multi-layer semiconductor structures further include a via joining layer disposed between and coupled to second surfaces of each of the semiconductor structures of the multi-layer semiconductor structures. The via joining layer has first and second opposing surfaces and at least one conductive structure extending between select portions of the first and second surfaces. At least one conductive structure is electrically coupled to second surfaces of select ones of the one or more interconnect pads on the semiconductor structures of the multi-layer semiconductor structures to form one or more electrical connections between the semiconductor structures of the multi-layer semiconductor structures.

Each of the multi-layer semiconductor structures includes a substantially same number of semiconductor structures and a substantially same number of interconnects (e.g., vertical interconnects). Additionally, each of the semiconductor structures is substantially the same in each of the multi-layer semiconductor structures and each of the interconnects is arranged substantially the same in each of the multi-layer semiconductor structures. Further, each of the at least one conductive structure and/or the via joining layer in each of the multi-layer semiconductor structures has substantially different dimensions.

The multi-layer semiconductor device may include one or more of the following features either individually or in combination with other features. The at least one conductive structure in each of the multi-layer semiconductor structures may have substantially different resistances for each of the multi-layer semiconductor structures to substantially distinguish the multi-layer semiconductor structures from each other. The at least one conductive structure and/or the via joining layer in each of the multi-layer semiconductor structures may have substantially different compositions (or types, e.g., via first, via last, TSV, bump) for each of the multi-layer semiconductor structures to substantially distinguish the multi-layer semiconductor structures from each other. The at least one conductive structure in the via joining layer may include a plurality of conducting metals, the plurality of metals including at least one of Nickel (Ni), Copper (Cu), Aluminum (Al), Zinc (Zn) and Tin (Sn). The via joining layer may include an oxide material and/or a dielectric material.

The second section of a first one of the at least two semiconductor structures may include a first conductive structure of the one or more conductive structures. The first conductive structure may have first and second opposing surfaces extending between the first and second surfaces of the second section of the first one of the at least two semiconductor structures. The first surface of the first conductive structure may have first dimensions and the second surface of the first conductive structure may have second, different dimensions. At least one of the one or more conductive structures extending between select ones of the plurality of electrical connections in the first section and select ones of the plurality of electrical connections in the device layer of the second section may be provided as at least one of a through insulator via (TIV), a micro-bump, a solder bump, a solder coated micro-pillar, a micro pillar, a through silicon via (TSV) conductive structure, or a combination thereof. The insulating layer of the second section may be provided from an oxide material including at least one of silicon dioxide ($SiO_2$) and chemically treated silicon oxide (SiO).

BRIEF DESCRIPTION OF THE DRAWINGS

Features and advantages of the concepts, systems, circuits and techniques disclosed herein will be apparent from the following description of the embodiments taken in conjunction with the accompanying drawings in which:

FIG. 20 is a chart illustrating a number of bonding cycles that an individual semiconductor structure experiences in fabricating a multi-layer semiconductor structure according to various embodiments of the disclosure.

DETAILED DESCRIPTION

Figure 1:
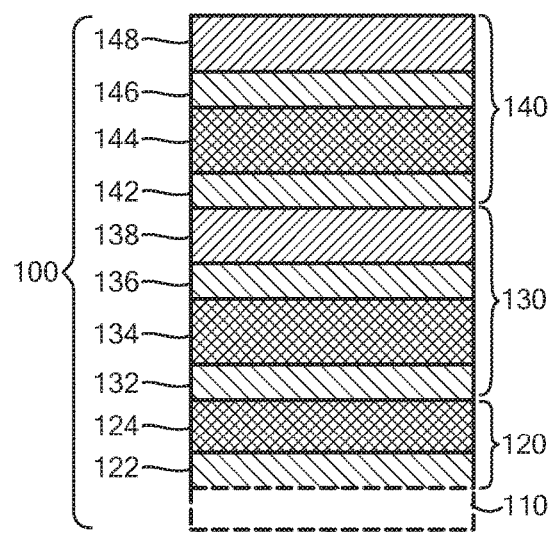
FIGS. 1-1A are block diagrams of example semiconductor structures.

The features and other details of the concepts, systems, and techniques sought to be protected herein will now be more particularly described. It will be understood that any specific embodiments described herein are shown by way of illustration and not as limitations of the disclosure and the concepts described herein. Features of the subject matter described herein can be employed in various embodiments without departing from the scope of the concepts sought to be protected. Embodiments of the present disclosure and associated advantages may be best understood by referring to the drawings, where like numerals are used for like and corresponding parts throughout the various views.

Definitions

For convenience, certain introductory concepts and terms used in the specification are collected here.

As used here, the term "chemically activated surface" is used to describe a surface which is minimally etched and/or damaged. The hydrophilicity or hydrophobicity of the surface may be changed with appropriate plasma and/or chemical treatment by changing or modifying surface chemistry.

As used herein, the term "circuitized substrate" is used to describe a semiconductor structure including at least one dielectric layer, the at least one dielectric layer having at least one surface on which at least one circuit is disposed. Examples of dielectric materials suitable for the at least one dielectric layer include low temperature co-fired ceramic (LTCC), ceramic (alumina), fiberglass-reinforced or non-reinforced epoxy resins (sometimes referred to simply as FR4 material, meaning its Flame Retardant rating), polytetrafluoroethylene (Teflon), polyimides, polyamides, cyanate resins, photoimagable materials, and other like materials, or combinations thereof. Examples of electrically conductive materials suitable for the at least one circuit include copper and copper alloy. If the dielectric layer is provided from a photoimagable material, it is photoimaged or photopatterned, and developed to reveal the desired circuit pattern, including the desired opening(s) as defined herein, if required. The dielectric layer may be curtain coated or screen applied, or it may be supplied as a dry film or in other sheet form.

As used herein, the term "conductive fusible metal" is used to describe a metal including one or more of tin-lead, bismuth-tin, bismuth-tin-iron, tin, indium, tin-indium, indium-gold, tin-indium-gold, tin-silver, tin-gold, indium, tin-silver-zinc, tin-silver-zinc-copper, tin-bismuth-silver, tin-copper, tin-copper-silver, tin-indium-silver, tin-antimony, tin-zinc, tin-zinc-indium, copper-based solders, and alloys thereof. The metals may change forms (e.g., from a solid to a liquid) during a bonding or during post bonding annealing or reflow process.

As used herein, the term "conductive structure" is used to describe an interconnect structure for electrically coupling one or more interconnect pads, electrical connections, components, devices, modules, and semiconductor structures and devices. The conductive structure may include at least one of a micro via having a diameter which is between about one micrometer (μm) and about one-hundred fifty μm's and a sub-micron via having a diameter of less than about one μm.

As used herein, the term "device layer" is used to describe a single or multilayer structure including a number of active or passive semiconductor components, the structure capable of performing at least part of the functional operations (i.e., semiconductor system performance) of a semiconductor structure. Device layers are typically fabricated separately on Silicon on insulator (SOI) substrates or bulk Silicon (Si) substrates. Additionally, each device layer may include at least one interconnect and one or more of active Si, Gallium nitride (GaN) and III-V field-effect transistors (FETs).

Example device layers may include complementary metal-oxide semiconductor (CMOS) integrated circuits having a pair of transistors, one using electrons and the other electron holes. Silicon (Si) and/or Germanium (Ge) semiconductor materials may be used to fabricate device layers having silicon transistors in high performance applications, for example. Alternative semiconductor materials such as Gallium Nitride (GaN) and Silicon Carbide (SiC) may also be used as they tend to cope much better at higher temperatures (e.g., Si for electronics and compound semiconductors for photonics). Silicon dioxide ($SiO_2$) and hafnium dioxide ($HfO_2$) may be used as insulator materials or structures within transistors in device layers. Additionally, III-V compound semiconductors, particularly those containing Indium such as Indium Arsenide and Indium Antimonide combined with germanium-rich transistors (e.g., nfinFETs with fins that are 5 nm wide or less), may be used in device layers.

Example device layers may also include quantum-well devices which are fabricated with high-mobility materials such as fully depleted silicon-on-insulator (FD-SOI) materials (e.g., in quantum-well devices having a thickness between about twenty two nanometers (nm) and about twenty eight nm). Such quantum-well devices may be suitable for low-power applications including, for example, the Internet of Things (IoT). Example device layers may further include Nanowire FETs in some embodiments. In the backend, low-k treatments of nanowire FETs may be critical. Self-alignment of nanowire FETs may also be very important.

It is possible to operate some of the circuit elements or devices (e.g., transistors) in device layers at low temperatures (e.g., a temperature which is greater than room temperature up to about 4 K) to provide for reduced operating voltages, higher speed operation and low power dissipation. Additionally, it is possible to utilize transistor technology with "low" and/or "ultra-low" power requirements and increased switching speeds in comparison to room temperature transistor devices in device layers. It is also possible to consider room temperature and/or high temperature devices as low temperature devices if these devices are able to operate at low temperature ranges. 2D materials (e.g., Graphene) and/or 2D material based devices (e.g., Vanadium dioxide based hybrid field effect transistors) can be used as a functional section or device layer, or be provided as part of a functional section or device layer. Various bandgap materials including silicon (Si), germanium (Ge), indium antimonide (InSb), indium arsenide (InAs), indium arsenide (InP), gallium phosphide (GaP), gallium arsenide (GaAs), gallium sulfide (GaS), cadmium sulfide (CdS), cadmium selenide (CdSe), cadmium telluride (CdTe), and zinc oxide (ZnO) may further be used to fabricate device layers.

As used herein, the term "electronic device" is used to describe an integrated circuit (IC) device (e.g., a semiconductor chip).

As used herein, the term "interposer" is used to describe an interconnect structure capable of electrically coupling two or more semiconductor structures together.

As used herein, the term "module" is used to describe an electrical component having a substrate (e.g., a silicon substrate or printed circuit board (PCB)) on which at least one semiconductor device is disposed. The module may include a plurality of conductive leads adapted for coupling the module to electrical circuitry and/or electrical components located externally of the module. One known example of such a module is a Multi-Chip Module (MCM), such modules coming in a variety of shapes and forms. These can range from pre-packaged chips on a PCB (to mimic the package footprint of an existing chip package) to fully custom chip packages integrating many chips on a High Density Interconnection (HDI) substrate.

As used herein, the term "processor" is used to describe an electronic circuit that performs a function, an operation, or a sequence of operations. The function, operation, or sequence of operations can be hard coded into the electronic circuit or soft coded by way of instructions held in a memory device. A "processor" can perform the function, operation, or sequence of operations using digital values or using analog signals.

In some embodiments, the "processor" can be embodied, for example, in a specially programmed microprocessor, a digital signal processor (DSP), or an application specific integrated circuit (ASIC), which can be an analog ASIC or a digital ASIC. Additionally, in some embodiments the "processor" can be embodied in configurable hardware such as field programmable gate arrays (FPGAs) or programmable logic arrays (PLAs). In some embodiments, the "processor" can also be embodied in a microprocessor with associated program memory. Furthermore, in some embodiments the "processor" can be embodied in a discrete electronic circuit, which can be an analog circuit or digital circuit.

As used herein, the term "self-bondable oxide" is used to describe multilayer oxide (e.g., single or multi component, doped or undoped, high density-low density, etc.), the multilayer oxide having at least one chemically activated, ultra-smooth bonding surface (e.g., within a predetermined number of angstroms (Å)) capable of bonding with another self-bondable oxide without any external force. The process for bonding a first self-bondable oxide with a second self-bondable oxide, etc. requires minimum force to activate bonding at a symmetry point on a bonding surface of the first and second self-bondable oxides (e.g. wafers), and little to no additional force to self-propagate bonding to entire surfaces of the first and second self-bondable oxides. Self-bondable oxides preferably use an oxidizing-reducing agent to chemically activate a bonding surface. RCA and/or high frequency (HF) and/or mega sonic cleaning and/or Plasma (e.g. oxygen) and/or Ammonium Hydroxide may be used for pre-bond surface treatments for the self-bondable oxide. Additionally, annealing the self-bondable oxide at a temperature between about one-hundred fifty degrees Celsius (C) and about five-hundred degrees C. in presence of Hydrogen (H) or Nitrogen (N) may increase bond strength of the self-bondable oxide.

As used herein, the term "substrate" is used to describe any structure upon which an integrated circuit or semiconductor device can be disposed or upon which semiconductor materials can be deposited and/or into which semiconductor materials can be implanted and diffused to form a semiconductor structure or device, for example. In some embodiments, the substrate may be provided as a P-type substrate (i.e., a substrate) having a particular range of concentrations of P-type atoms (i.e., ions). In other embodiments an N-type substrate may be used (i.e., a substrate having a particular range of concentration of N-type atoms).

The substrate may, for example, be provided from a semiconductor material, an insulator material or even a conductor material. For example, the substrate may be provided from silicon, alumina, glass or any other semiconductor material. Further, the substrate can include a number of metal-oxide-silicon (MOS) devices, complementary-MOS (CMOS) devices, or a number of active or passive integrated circuit semiconductor devices.

As used herein, the term "three-dimensional (3-D) integrated circuit (IC)" is used to describe a semiconductor structure including at least two device layers (e.g., which are vertically stacked) and interconnects (e.g., vertical interconnects) to make one or more electrical connections between the device layers.

As used herein, the term "equivalent three-dimensional (3-D) integrated circuit (IC)" is used to describe when multiple three-dimensional (3-D) integrated circuits including a substantially same number of device layers (e.g., which are vertically stacked) and a substantially same number of interconnects (e.g., vertical interconnects) are used to make one or more electrical connections between the device layers but at least one interconnect and or vertical interconnect and/or layer of interconnects have substantially different dimensions and/or substantially different resistances and/or substantially different compositions from each other. Each of the device layers (or semiconductor structures) is substantially the same in each of the ICs (e.g., multi-layer semiconductor structures) and each of the interconnects is arranged substantially the same in each of the ICs. In one example, an interconnect may include at least one of a micro-bump, solder bump, solder coated micro-pillar, micro pillar, via first, via last, and a through silicon via (TSV) or a combination thereof. In another example, an interconnect may include one or more of the following materials: tin-lead, bismuth-tin, bismuth-tin-iron, tin, indium, tin-indium, indium-gold, tin-indium-gold, tin-silver, tin-gold, indium, tin-silver-zinc, tin-silver-zinc-copper, tin-bismuth-silver, tin-copper, tin-copper-silver, tin-indium-silver, tin-antimony, tin-zinc, tin-zinc-indium, copper-based solders, and alloys thereof. Such materials may melt during a bonding or a reflow process, for example.

As used herein, the term "through oxide via (TOV)" is used to describe a via (e.g., micro via) in a semiconductor structure used to connect adjacent device layers. The TOV passes through one or more oxide, dielectric, and/or metal layers and terminates at a predetermined Silicon (Si) layer or surface.

As used herein, the term "via first" may be used to describe a micro via and/or a submicro via used to make at least one electrical connection between a first device layer and second device layer in a semiconductor structure including at least two device layers. Additionally, as described here, the term "via" first may also be used to describe a micro via and/or a submicro via passing through a dielectric material or layer (in some embodiments, only the dielectric material or layer) to make at least one electrical connection between a first device layer and a second device layer in a semiconductor structure including at least two device layers. For a via first process, the first device layer and the second device layer are completed separately. As one example, a partial via material is added on first and/or second opposing surfaces (i.e., top and/or bottom surfaces) of the first second device layers and subsequent bonding and/or post bonding process create a via first between the first and second device layers.

The via first may be filled with at least one metal or alloy having a high Coefficient of Thermal Expansion (CTE) to produce a rigid, robust, and conductive via first joint between the at least two device layers during the composite bonding process. High temperatures and/or high pressures may be applied and used to bond the two device layers and provide a three-dimensional (3D) interconnection (i.e., interconnect) among the device layers. The high CTE metal or alloy are expanded at relatively high temperatures and interdiffuse with each other to produce the 3D interconnect. Alternatively, the via first may be filled with a low temperature fusible metal which melts and interdiffuse during bonding or post bonding processes.

As used herein, the term "via last" is used to describe a micro via and/or a submicro via used to make at least one electrical connection between a first device layer and a second device layer in a semiconductor structure including at least two device layers. Fabrication of the first device layer is completed first, and the second device layer is deposited over the first device layer. The second device layer is completed with via last process. A pad layer which includes one or more interconnect pads may be added after via last process. In one embodiment, via last is filled. Additionally, in one embodiment, the via last can be unfilled or partially filled. Via last may pass through the device layers (e.g., second device layers) and, in some embodiments, one or more isolation layers or materials. A titanium (Ti) material having a thickness of about ten nanometers (nm) and, a metal organic chemical vapor deposition (MOCVD) Titanium Nitride (TiN) liner having a thickness of about five nm, and tungsten plugs may be used for via lasts. A MOCVD or chemical vapor deposition (CVD) $TiN_X$, with X less than or equal to 1, is preferred for better conformal coating.

As used herein, the term "through silicon via" (TSV) is used to describe a vertical interconnect which passes substantially through one or more of a silicon wafer, a silicon die, a silicon interposer, silicon active circuits, silicon passive circuits, or other silicon circuits, components or layers. TSVs can be fabricated by different methods and approaches. In Silicon (Si) via-first approaches, for example, TSVs are fabricated prior to fabrication of active devices (i.e. bipolar or MOSFET devices) to which the TSVs may be coupled. The approach includes patterning the TSVs, lining the TSVs with a high temperature dielectric (thermal oxide or chemical vapor deposition), filling the TSVs with doped polysilicon and using chemical mechanical polishing (CMP) techniques to remove excess polysilicon from one or more surfaces of the TSVs. Si via-first approaches allow for the use of high temperature processes to insulate and fill the TSVs.

In Si via-middle approaches, TSVs are fabricated after forming the active devices to which the TSVs may be coupled, but before back end of line (BEOL) stack fabrication. The approach includes patterning the TSVs after a contact process, lining the TSVs with a low temperature dielectric deposition, and then filling the TSVs with single/multiple barrier metals. Typically the TSVs are filled with Copper (Cu) and/or W. For TSVs filled with Cu, a Cu seed layer is disposed on top of a barrier layer and a subsequent Cu electroplating fills the TSVs. The TSVs are then planarized using CMP techniques. For W, chemical vapor depositing (CVD) processes are used to fill the TSVs, and CMP techniques are used to remove excess polysilicon from one or more surfaces of the TSV. W is preferred for filling high aspect ratio TSVs (e.g., TSVs with aspect ratio of height-to-width >10:1). In general, Cu is used to fill low aspect ratio TSVs (e.g., TSVs with aspect ratio <10:1). Si via-middle process are useful for fabricating TSVs with a small via pitch, TSVs having minimal blockage of wiring channels, and TSVs having a low via resistance, for example.

In front side Si via-last approaches, TSVs are fabricated at the end of the BEOL processing of the wafer. Si via-last approaches are similar to Si via middle approaches, but Si via-last approaches use low temperature dielectric depositions (<400 C) compared to higher temperature dielectric compositions (<600 C) in Si via middle approaches. Front side Si via-last approaches may be suitable for their coarse TSV feature size, which simplifies the process of integrating TSVs into semiconductor structures. The front side Si via-last approaches may also useful for wafer-to-wafer bonding. In such approaches, TSVs can be formed at the end of the wafer-to-wafer bonding process, connecting multiple layers in the multi-layer (e.g., three-dimensional (3D)) stack of wafers or semiconductor structures.

Front side Si via-last approaches may use TSV etch as well as the entire BEOL dielectric stack. Backside Si via-last approaches also use wafer to wafer (or semiconductor structure to semiconductor structure) stacking. The wafers can be bonded together using oxide bonding or polymer adhesive bonding, either front-to-front or front-to-back. The wafers can be thinned by etching and or polishing. Additionally, a TSV may be formed in the wafers by etching a via down to bond pads on a top wafer and a bottom wafer. The process includes patterning the TSVs after the contact process, lining the TSVs with a low temperature dielectric deposition, and then filling the TSVs with a single/multiple barrier metal (e.g., Cu and/or W). The TSVs are then planarized through a subsequent CMP process.

A number of inorganic and organic dielectric materials having a thickness in a range of about one hundred nanometers (nm) to about one thousand nm can be used to insulate the TSVs. TSV dielectrics may be required to have good step coverage (at least 50% through the depth of the trench), good thickness uniformity (<3% variation across the wafer), high deposition rate (>100 nm/min), low stress (<200 MPa), low leakage current (<1 nA/cm2), and high breakdown voltage (>5 MV/cm). Plasma-enhanced chemical vapor deposition (PECVD) of SiO2 or SiN, or sub-atmospheric chemical vapor depositions (SACVD) of SiO2, are some examples of insulator deposition. The most commonly used conductors to fill TSVs are doped polysilicon (180 1ohm-cm), tungsten (5.6 1ohm-cm), or copper (1.7 1ohm-cm). W deposited by CVD has a good fill of the TSV and can be integrated with the contacts to which the TSVs are to be coupled. A TiN liner is required to ensure that the WF6 precursor does not attack the Si substrate in the TSV. A disadvantage of W compared to Cu is that it has a high intrinsic stress (1400 MPa for W, 20 MPa for Cu).

Reactive-ion-etching (RIE) may be used to create high aspect ratio TSVs and deep trench structures in the Si (i.e., for capacitors or for isolation) in which the TSVs are provided. In one embodiment, a TSV RIE Bosch process may be used to fabricate the TSVs, with process alternating between deposition and etching steps to fabricate deep vias. SF6 isotropic etching of Si may not be suitable for forming TSVs (which require a highly anisotropic etch). Fluorocarbon chemistry (e.g., C4F8) may be used for anisotropic etching achieved through the deposition of a chemically inert passivation on the sidewall of the TSVs.

Chemical mechanical polishing (CMP) may be used for planarization of metal filled vias (e.g., micro vias), for example. Additionally, a metal contact (i.e. pad) in an upper device layer (e.g., the second device layer) may be an annulus with an about a one point five micrometer (µm) opening that also functions as a self-aligned mask (e.g., hard mask) during the plasma etch of the oxide beneath it to reach a corresponding metal contact in a lower device layer (e.g., the first device layer). In order to fully dispose and electrically the via, the size of the metal contacts, and thus the pitch of the vertical interconnect, is made proportional to about twice the wafer-wafer misalignment of the wafers including the first and second device layers.

As used herein, the term "bulk Complementary metal-oxide semiconductor (CMOS)) fabrication techniques" is used to describe semiconductor fabrication techniques in which CMOS circuit elements or devices are fabricated in a Silicon (Si) substrate.

As used herein, the term "Silicon-On-Insulator (SOI) CMOS fabrication techniques" is used to describe semiconductor fabrication techniques in which CMOS circuit elements or devices are isolated from a Si substrate by one or more dielectric materials. SOI CMOS fabrication techniques may be used to significantly reduce junction capacitances and allow the CMOS circuit elements or devices to operate at a "higher" speed or at a substantially "lower" power level at a same speed as those which are fabricated through bulk CMOS fabrication techniques, for example. SOI CMOS fabrication techniques also reduces or eliminates latch up effects that may be found in bulk CMOS, and improves the short channel effect and soft error immunity.

As used herein, the term "single-sided bondable semiconductor structure" is used to describe a semiconductor structure which includes at least one functional section and at least self-bondable oxide before bonding, and is capable of bonding with other semiconductor structures one side at a time (e.g., using via first or via last approaches). For Silicon-On-Insulator (SOI) technology, a single side bondable wafer can undergo a post bonding process which includes removal of handle (e.g., a Si handle), deposition of at least self-bondable oxide and subsequent processing before second bonding. Thus, if necessary (or desired), a SOI based single-sided bondable wafer can be used as double-sided bondable wafer.

As used herein, the term "double-sided bondable semiconductor structure" is used to describe a semiconductor structure which includes at least one functional section and at least self-bondable oxide before bonding, and. is capable of bonding with other semiconductor structures one side at a time (e.g., using via first and/or via last approaches). After a first bonding process/cycle, the semiconductor structure may undergo post bonding process which may include removal of a handle (e.g., a Si handle), deposition of at least one self-bondable oxide, and subsequent processing before second bonding.

As used herein, the term "single step double-sided bondable semiconductor structure" is used to describe a semiconductor structure which includes at least one functional section, at least one TSV to connect both sides of the semiconductor structure and at least self-bondable oxide on each side of the semiconductor structure. The semiconductor structure is capable of bonding with other semiconductor structures using both bondable sides in a single bonding cycle using via first and or via last approaches.

While multi-layer semiconductor devices (or structures, which can include wafers, dies and/or integrated circuits) including two semiconductor structures are described in several examples below, two semiconductor structures are discussed to promote simplicity, clarity and understanding in the drawings as well as in the written description of the broad concepts, systems, circuits and techniques sought to be protected herein and is not intended to be, and should not be construed, as limiting. The concepts, systems, circuits and techniques disclosed herein may, of course, be implemented using more than two semiconductor structures.

Additionally, while multi-layer semiconductor devices (or structures) including semiconductor structures which are the same as or similar to each other are described in several examples below, such are discussed to promote simplicity, clarity and understanding in the drawings as well as in the written description of the broad concepts, systems, circuits and techniques sought to be protected herein and is not intended to be, and should not be construed, as limiting. The concepts, systems, circuits and techniques disclosed herein may, of course, be implemented using semiconductor structures which are different from each other.

Moreover, it should, of course, be appreciated that elements shown in the figures are not necessarily drawn to scale. For example, the dimensions of some elements may be exaggerated relative to other elements for clarity. Further, where considered appropriate, same or similar reference designators have been repeated among the figures to indicate corresponding or analogous elements.

Referring now to FIG. 1, an example semiconductor structure 100 as may be provided as part of an example multi-layer semiconductor device (or structure) (e.g., semiconductor device 2100, as will be discussed) including at least two semiconductor structures is shown. The semiconductor structure 100 has first and second opposing surfaces and includes a plurality of sections (here, three sections). Each of the three sections includes a plurality of layers (e.g., insulating and device layers, as will be discussed). The semiconductor structure 100 also includes a support or "handle" structure (e.g., a handle substrate) 110 having first and second opposing surfaces. The second surface of the handle structure 110 is disposed over and coupled to the first surface of the semiconductor structure 100. The handle structure 110 is optional in some embodiments and is thus shown in phantom in FIG. 1. Additionally, the handle structure 110 may be provided as part of or separate from the semiconductor structure 100 in some embodiments.

In the example embodiment shown, a first one of the plurality of sections (also sometimes referred to herein as a "first section") 120 has first and second opposing surfaces and includes an insulating layer 122 and a device (or "functional") layer 124. The insulating layer 122, which is provided from one or more electrically-insulating materials (e.g., bondable oxide, re-workable oxide, seamless oxide, etch-stoppable oxide), has first and second opposing surfaces with the first surface corresponding to the first surface of the first section. The device layer 124, which is provided from materials including at least one of Silicon (Si) (e.g., a Silicon material which is sensitive to an electric field, a magnetic field, radio-frequency (RF) energy, microwave energy, and/or light energy), Polysilicon, Graphene, Gallium arsenide (GaAs), Gallium nitride (GaN) and Cobalt Silicide (Co-Silicide), has first and second opposing surfaces with the second surface corresponding to the second surface of the second section. The first surface of the device layer 124 is disposed over the second surface of the insulating later 122.

The device layer 124 includes one or more circuit components, devices and modules (e.g., resistors, capacitors, transistors, inductors, integrated circuits) (not shown), each of which may be passive or active, for example, disposed between the first and second surfaces of the device layer 124, as will be discussed. The circuit components, device, and modules may be electrically coupled to select electrical connections (not shown) and conductive planes (not shown) in the first section (e.g., through one or more conductive structures, as will be discussed).

A second one of the plurality of sections (also sometimes referred to herein as a "second section") 130 has first and second opposing surfaces and includes a first insulating layer 132, a device layer 134, a second insulating layer 136 and an interconnect layer 138 (e.g., for electrically coupling first section 120 and second section 130, including device layer 134 of second section 130, as will be discussed). The second insulating layer 136 and/or the interconnect layer 138 may be provided as part of or separate from the device layer 134 in some embodiments. First insulating layer 132, which may be the same as or similar to insulating layer 122, has first and second opposing surfaces with the first surface corresponding to the first surface of the second section. The first surface of the second section is disposed over and coupled to the second surface of the first section.

Device layer 134, which may be the same as or similar to the device layer 124, has first and second opposing surfaces with the first surface disposed over and coupled to the second surface of the first insulating layer 132. The second insulating layer 136, which has first and second opposing surfaces, is provided from one or more electrically-insulating materials (e.g., etch-stoppable oxide materials such as Silicon Oxide ($SiO_x$)). The first surface of the second insulating layer 136 is disposed (or deposited) over and coupled to the first surface of the device layer 134. Interconnect layer 138 has first and second opposing surfaces with the first surface disposed over the second surface of the second insulating layer 136. Interconnect layer 138 is electrically coupled to select ones of the electrical connections in at least the device layer 134 of the second section 130. In one embodiment, interconnect layer 138 electrically couples first section 120 and second section 130 together. Interconnect layer 138 can also be used to connect device layer 134. Interconnect layer 138 may, for example, connect micron range (1 micron or above) via, sub-micron range (0.99-0.1 micron) and/or nano range (less than 0.1 micron) vias. One possible combination for at least part of interconnect layer 138 is first micro via-single or multiple sub-micro via-second micro via connected through a pad. Part of interconnect layer 138 can be first micro via-first single or multiple sub-micro via-single or multiple nano via-second single or multiple sub-micro via-second micro via. Additionally, in one embodiment, interconnect layer 138 further extends to and is electrically coupled with an interconnect layer 148, as will be discussed.

A third one of the plurality of sections (also sometimes referred to herein as a "third section") 140, which is similar to the second section in the example embodiment shown, has first and second opposing surfaces and includes a first insulating layer 142, a device layer 144, a second insulating layer 146 and an interconnect layer 148. The first surface of the third section 140 is disposed over the second surface of the second section 130.

In one embodiment, at least part of the first insulating layer 142 and/or the second insulating layer 146 has a multilayer structure. Insulating layers 142, 146 can include a first high density oxide portion, a low density oxide portion, and a second high density oxide portion. Insulating layers 142, 146 can additionally or alternatively include a thermal oxide portion, a plasma enhanced CVD oxide portion, and a second thermal oxide portion. Insulating layers 142, 146 can additionally or alternatively include a first high density oxide portion, a chemically activated low density oxide portion, and a second high density oxide portion.

Additionally, in one embodiment, the first insulating layer 142 and/or the second insulating layer 146 can include a standard and/or low pressure silane oxide and/or a high power plasma enhanced chemical vapor deposition (PECVD) oxide. Further, at least part of the insulating layers 142, 146 may include an oxide layer which is capable of self-bonding with another oxide layer with minimum or no force activation (e.g., a self-bondable oxide). Moreover, in one embodiment, a semiconductor structure including "n" number of device layers requires at least "n−1" self-bondable oxide layers and "n−1" oxide/insulating layers.

Insulating layers 142, 146 can have a single oxide layer or multiple oxide layers having same or similar densities. Additionally, annealing insulating layers 142, 146 and subsequently adding a PECVD oxide to insulating layers 142 may neutralize stress and increase bond strength of insulating layers 142, 146. Although in some embodiments it is preferable to use oxide as an etch stop insulating layer for the silicon of active devices in device layers (e.g., 124, 134, 144), in other embodiment other suitable insulating materials capable of stop selective Si etching can be used instead of oxide. Interconnect layers 138, 148 are patterned and etched through the insulating layers (e.g., 142, 146) and deposited oxides to expose metal contacts in semiconductor structure 100 (and 1000, as will be discussed). 3-D vias (e.g., 2110, as will be discussed) are created during bonding of semiconductor structure 100 and one or more other semiconductor structures (e.g., 1100) in one or more regions (e.g., isolation regions) between the device layers of the semiconductor structure 100 and the other semiconductor structure(s).

In some embodiments, at least second section 130 of semiconductor structure 100 is fabricated using Silicon-On-Insulator (SOI) fabrication techniques. Additionally, in some embodiments, at least first section 120 of semiconductor structure 100 is fabricated using SOI or bulk complementary metal-oxide semiconductor (CMOS) fabrication techniques. Further, in some embodiments, the first section 120 and the second section 130 are substantially the same. Additionally, in some embodiments, two or more of the first section 120, the second section 130 and the third section 140 are substantially the same.

Figure 1A:
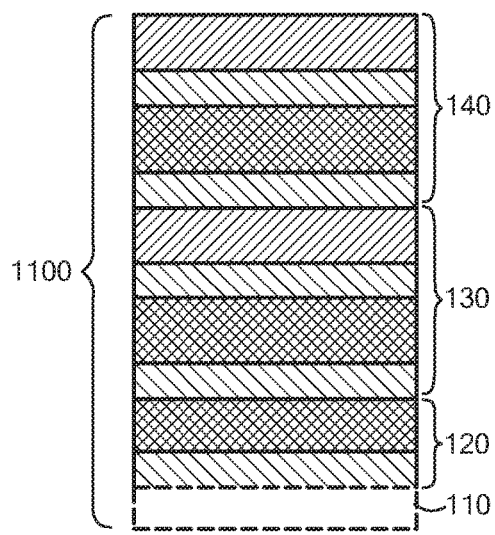

Referring now to FIG. 1A, in which like elements of FIG. 1 are shown having like reference designations, another example semiconductor structure 1100 as may be provided as part of an example semiconductor device including at least two semiconductor structures (e.g., semiconductor device 2100, as will be discussed) is shown. The semiconductor structure 1100 includes a first section 120, a second section 130, a third section 140 and an optional handle structure 110.

Figure 1B:
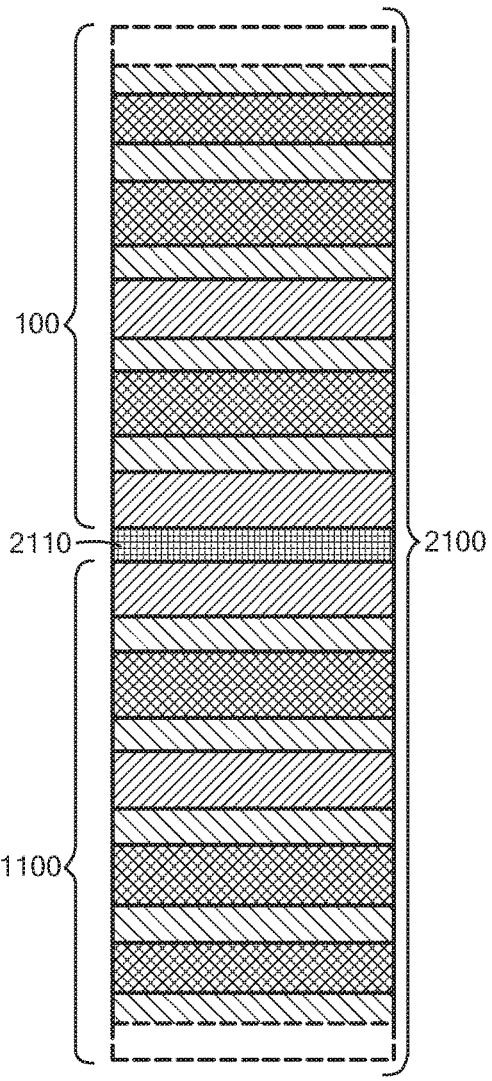
FIG. 1B is a block diagram of an example multi-layer semiconductor device including the semiconductor structures of FIGS. 1-1A, for example.

Referring now to FIG. 1B, an example multi-layer semiconductor device 2100 as may be provided in an example method for fabricating a semiconductor device including at least two semiconductor structures (here, semiconductor structure 100 and semiconductor structure 1100 of FIGS. 1 and 1A, respectively) in accordance with the concepts, systems, circuits and techniques sought to be protected herein is shown.

The semiconductor device 2100 includes semiconductor structure 100, semiconductor structure 1100, and a via joining layer (or semiconductor interconnect structure) 2110 disposed between and coupled to second surfaces of each of the semiconductor structure 100 and semiconductor structure 1100. The via joining layer 2110 electrically couples select portions of semiconductor structure 100 and semiconductor structure 1100 to form one or more electrical connections between semiconductor structure 100 and semiconductor structure 1100, and to form the semiconductor device 2100.

In one embodiment, multiple oxide layers (not shown) are further deposited on one or more surfaces (e.g., first and/or second surfaces) of at least one of semiconductor structure 100 and semiconductor structure 1100. These oxide layers can include at least one of a low temperature oxide (LTO), Phosphosilicate glass (PSG), Borosilicate Glass (BSG). As one example, these oxide layers can be arranged to include LTO-PSG-LTO, PSG-LTO-PSG, LTO-BSG-LTO, BSG- LTO-BSG, LTO-BSG-PSG, each stacked on top of the other. Additionally, in one embodiment, a Chemical-mechanical planarization (CMP) may be applied before and/or after deposition of a self-bondable oxide on one or more surfaces of the one or more oxide layers (e.g., the multiple oxide layer stack). Annealing the self-bondable oxide at a temperature between about one-hundred fifty degrees C. and about five-hundred degrees C. in presence of Hydrogen or nitrogen may increase bond strength (e.g., >1500 mJ/m$^2$), lower void formation (<10%), and improve alignment of the self-bondable oxide.

Additionally, in one embodiment, multiple CMP processes are applied before and/or after deposition of the self-bondable oxide. As one example, a CMP process may be applied after each annealing step. The CMP may, for example, create angstrom level surface roughness (e.g., on surfaces having macro/extrinsic voids caused by particles, scratches and micro/intrinsic voids caused by bond by-products coalescing). In one embodiment, semiconductor structure 100 and semiconductor structure 1100 are Notch aligned with less than about a two-hundred fifty μm iW capture window and patterned wafer to wafer aligned with less than an about one μm (e.g., 0.75 um) window.

Further, in one embodiment, an oxide material or layer (e.g., thermal oxide) may deposited on one or more surfaces (e.g., first and/or second surfaces) of at least one of semiconductor structure 100 and semiconductor structure 1100 before bonding. In one embodiment, the oxide material or layer can be applied to both first and second surfaces of semiconductor structure 100 and semiconductor structure 1100 (e.g., for optimal infrared alignment). Additionally, in one embodiment, at least semiconductor structure 100 has the oxide layer or material on a single surface (e.g., a first surface) and semiconductor structure 1100 has the oxide material or layer on both first and second surfaces.

The oxide deposition described above, and subsequent polishing of the oxide layer or material, may provide for wafer to wafer infrared alignment of less than about one μm (e.g., 0.75 um). Semiconductor structures 100, 1100 may be precision aligned to sub-micron accuracy using infrared cameras, for example, to look directly through a first one of the semiconductor structures. Semiconductor structures 100, 1100 may also be bonded by initiating contact at the center of the semiconductor structure 100, for example.

In some embodiments, at least one of semiconductor structure 100 and semiconductor structure 1100 of semiconductor device 2100 may include or be provided as part of a multi-layer semiconductor structure (also commonly referred to as a three-dimensional (3-D) integrated circuit (IC)), for example, a semiconductor structure in which a number of individual semiconductor structures are both mechanically and electrically coupled. One example multi-layer semiconductor structure is described in U.S. Pat. No. 7,067,909 entitled "Multi-layer integrated semiconductor structure having an electrical shielding portion," which is assigned to the assignee of the present disclosure and incorporated herein by reference in its entirety. Another example multi-layer semiconductor structure is described in co-pending U.S. patent application Ser. No. 14/694,540 entitled "Interconnect Structures For Fine Pitch Assembly Of Semiconductor Structures," which is also assigned to the assignee of the present disclosure and incorporated herein by reference in its entirety.

Further, in some embodiments, the multi-layer semiconductor device 2100 of FIG. 1B discussed above and one or more of the multi-layer semiconductor devices of FIGS. 2-6F discussed below may include or be provided as part of a system such as a telecommunication system (e.g., in a handset or base station) or an information technology system or a circuit such as a filter circuit (e.g., a tunable radio-frequency (RF) filter circuit), for example, with a semiconductor structure (e.g., semiconductor structure 100) including a plurality of sections (or layers). In implementing a filter circuit, for example, a first one of the sections may include a first resonator circuit, a second one of the sections ma include a second resonator circuit, a third one of the sections may include a third resonator circuit and so on. The resonator circuits may, for example, be combinable to provide a filter circuit having a multi-octave response characteristic. The filter circuit of the multi-layer semiconductor device may be integrated into a communications device.

The concepts, systems, circuits and techniques sought to be protected herein provide novel methods and structures for producing multi-layer hybrid three dimensional IC (3DIC) structures (e.g., 2100, as shown in FIG. 1B). Specifically, the methods and structures provide means for converting via last in an interconnect layer (e.g., 148, as shown in FIG. 1) to via first (e.g., 2110, as shown in FIG. 1B) to create an electrical interconnection among at least two semiconductor structures (e.g., 100, 1100, as shown in FIG. 1B). Interconnects are formed in a via joining layer (e.g., 2110, as shown in FIG. 1B) during bonding of self-bondable oxide using at least one of an electrically conductive high CTE metal, an electrically conductive low CTE metal, and a fusible metal or alloys. As a result, one is able to fabricate semiconductor structures and devices with multiple heterogeneous elements at any arbitrary device layer (e.g., 134, as shown in FIG. 1) of the semiconductor structures. Minimum structural configurations are need for the semiconductor structures (e.g., 100, 1100) to create the conversion of via last to via first. In one embodiment, at least one of the semiconductor structures (e.g., 100, 1100) needs to have via last or two device layers. For example, a first one of the semiconductor structures (e.g., 100) needs at least one device layer and a second one of the device layers (e.g., 1100) needs at least two device layers to create via last to via first conversion.

The conversion of via last to via first based hybrid 3DIC structures offers many advantages over the more conventional via first or via last 3DIC structures, for example, including, but not limited to, a reduction in total processing steps for same number of device layers (e.g., 124), maximum possible metal layer counts, placement of heterogeneous elements in each of the device layers, opportunity for multiple active circuits in semiconductor structures and devices, ability to connect multiple multilayer functional sections at a thinnest possible cross section, and ability to connect between any two arbitrary layers with smallest interconnect within the hybrid 3DIC.

Bonding of multiple device layers in a single semiconductor device (e.g., 2100), for example, allows for the mixing of III-V transistors with Silicon CMOS (e.g., Si+GaN for RF circuits, Si+III-V FETs for high performance digital circuits, Si+III-V TFETs for low power digital circuits, InGaAs for Image Sensors or detectors with Si Readout Circuits). Additional advantages of the concepts, systems, circuits and techniques sought to be protected herein include providing for a thinnest possible active area cross section, highest possible 3D density, ability to integrate old, current and new technology nodes together (e.g., 150 nm, 90 nm, 65 nm, 32 nm, 22 nm, 7 nm and nodes can be accommodated in a multi-functional combination), and ability to integrate multiple foundry process together.

Additional aspects of the concepts, systems, circuits and techniques sought to be protected herein, with particular emphasis on semiconductor interconnect structures (e.g., via joining layers) are described in conjunction with the figures below.

Figure 2:
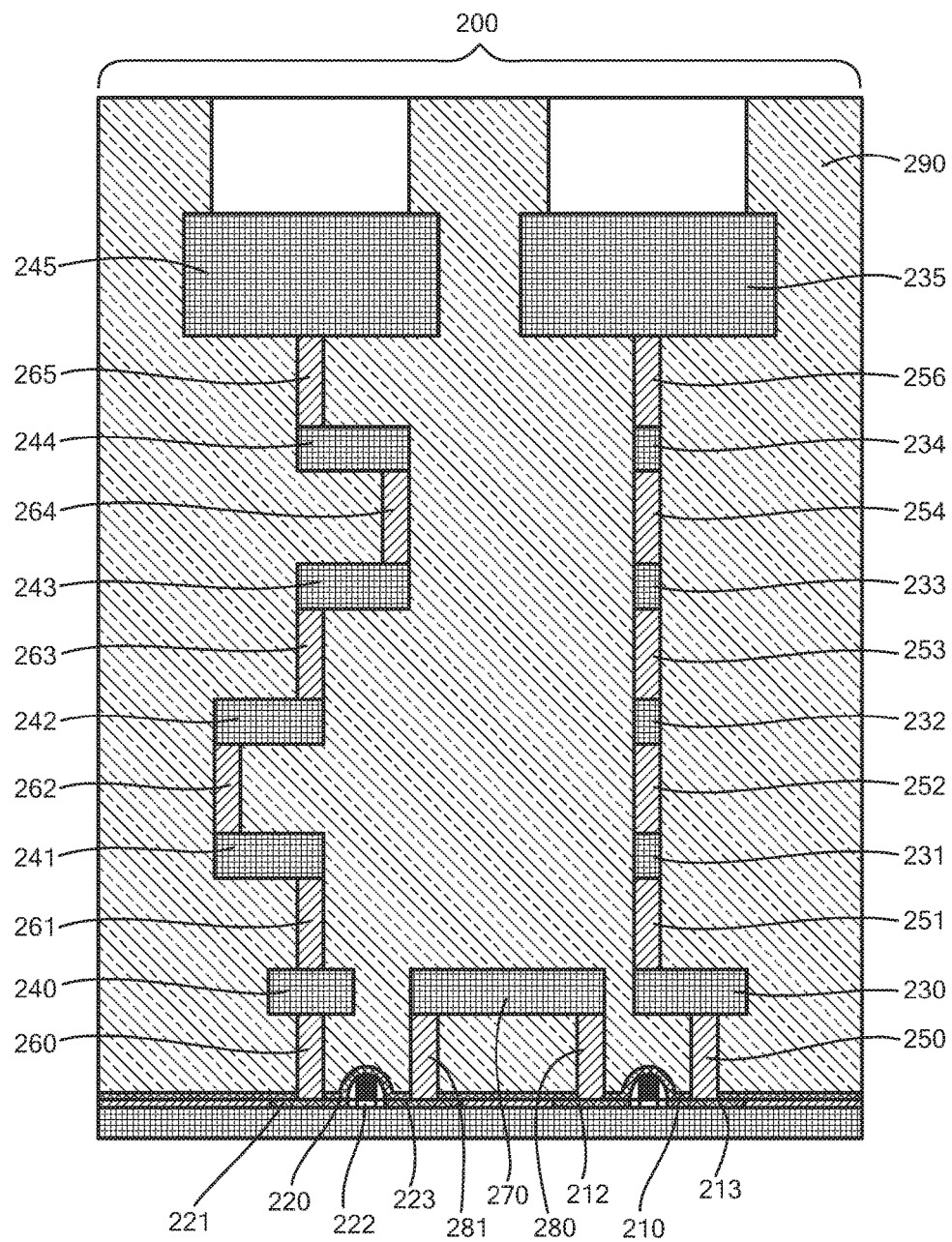
FIG. 2 is a block diagram of an example layer of an example semiconductor structure.

Referring now to FIG. 2 an example layer (e.g., a "device layer") 200 of an example semiconductor structure (e.g., semiconductor structure 100, shown in FIG. 1) includes a plurality of circuit components, a plurality of conductive planes (e.g., conductive planes of the same potential) and a plurality of electrical connections (e.g., vias) for electrically coupling the circuit components to one or more of the plurality of conductive planes (e.g., a ground plane or a voltage plane). In the example embodiment shown, the plurality of circuit components are provided as first and second three terminal devices (e.g., a field-effect transistors (FETs)) 210, 220. Additionally, the plurality of electrical connections are provided from one or more electrical connections or vias (e.g., through hole vias, blind vias, buried vias, open vias, stacked vias, and step (or staggered) vias).

A first one of the three terminal devices (also sometimes referred to as a "first three terminal device") 210 has a first terminal (e.g., a source terminal) 211 electrically coupled to conductive plane 270 via electrical connection 280, a second terminal (e.g., a gate terminal) 212 and a third terminal (e.g., a drain terminal) 213 electrically coupled to first ones of the plurality of conductive planes (230, 231, 232, 233, 234, 235) via first ones of the plurality of electrical connections (250, 251, 252, 253, 254, 255). A second one of the three terminal devices (also sometimes referred to as a "second three terminal device") 220 has a first terminal (e.g., a source terminal) 221 electrically coupled to second ones of the plurality of conductive planes (240, 241, 242, 243, 244, 245) via second ones of the plurality of electrical connections (260, 261, 262, 263, 264, 265), a second terminal (e.g., a gate terminal) 222, and a third terminal (e.g., a drain terminal) 223 electrically coupled to conductive plane 270 via electrical connection 281. The first and third terminals of each of three terminal devices 210, 220 provide current conducting terminals of the three terminal devices. In one embodiment, layers such as layer 200 are produced by fabricating individual semiconductor functional sections of fully depleted SOI (FDSOI) circuits, with a 150-nm to 20-nm FET gate length, 40-nm or less thick SOI active layer, and multiple metal interconnect layers. The FDSOI circuits may, for example, be designed using conventional logic design rules.

Figures 3, 3A, 3B:
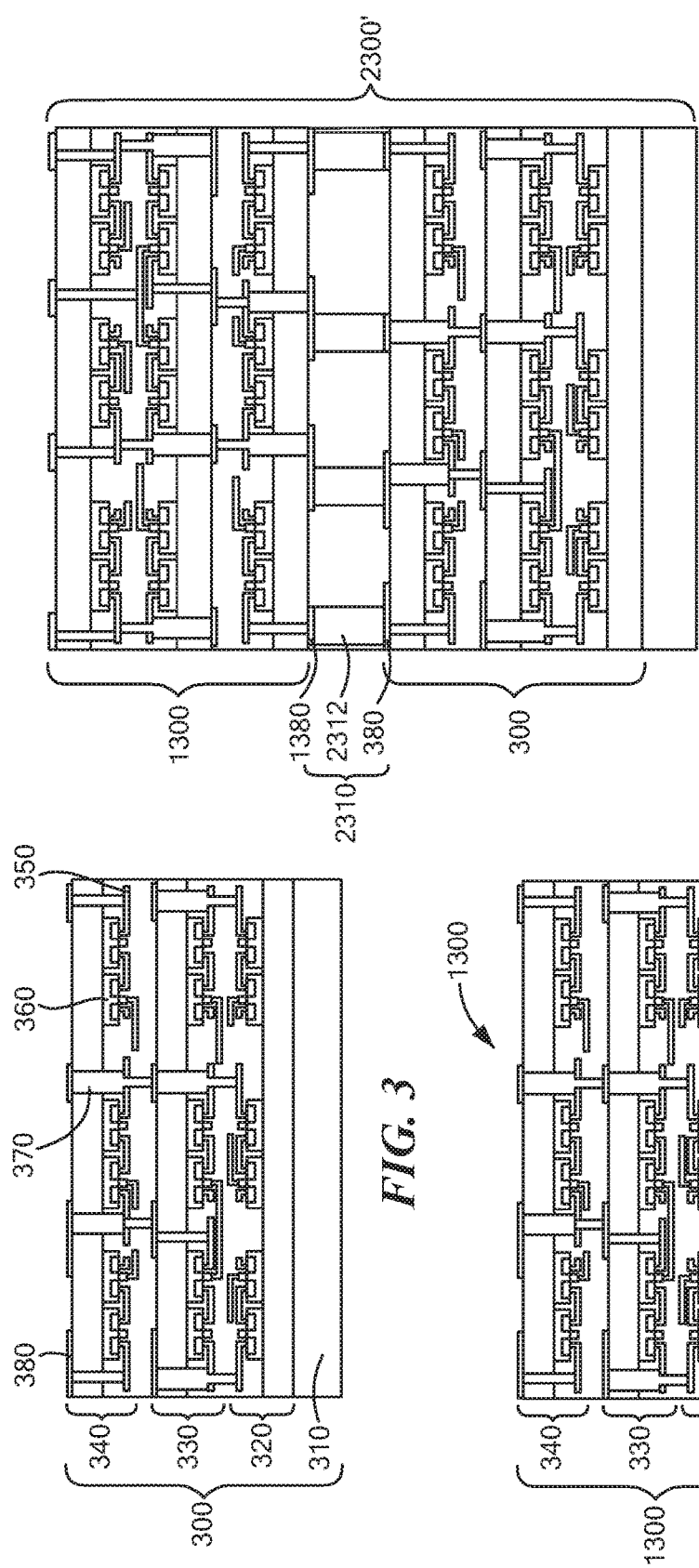
FIGS. 3-3A are block diagrams of example semiconductor structures.
FIG. 3B is a block diagram of an example multi-layer semiconductor device including the semiconductor structures of FIGS. 3-3A, for example.

Referring now to FIG. 3, an example semiconductor structure (e.g., a wafer or die) 300 as may be fabricated through via-last and/or via-first techniques, for example, includes a plurality of sections (e.g., functional sections which include one or more device layers such as device layer 124, FIG. 1), here three sections. A first one of the sections (e.g., a tier-1 functional section) 320, which is also sometimes referred to herein as a "first section" 320, has first and second opposing surfaces and a plurality of electrical connections (e.g., vias) extending between select portions of the first and second surfaces. The electrical connections may, for example, be made by drilling holes through the first section 320 in appropriate locations and plating the inside of the holes with a conducting material (e.g., copper). The first section 320 may be fabricated using either Silicon-On-Insulator (SOI) or bulk complementary metal-oxide semiconductor (CMOS) fabrication techniques, for example.

A second one of the sections (e.g., a tier-2 functional section) 330, which is also sometimes referred to herein as a "second section" 330, has first and second opposing surfaces. The second section 330, which may be fabricated using SOI fabrication techniques, for example, includes a device layer having first and second opposing surfaces and a plurality of electrical connections extending between the first and second surfaces. The second surface of the device layer corresponds to the second surface of the second section 330. The second section 330 also includes an insulating layer which is provided from an electrically-insulating material (e.g., etch-stoppable oxide material such as Silicon Oxide ($SiO_x$)), the insulating layer having first and second surfaces. The first surface of the insulating layer, which corresponds to the first surface of the second section 330, is disposed over and coupled to the second surface of the first section 320.

A third one of the sections (i.e., a tier-3 functional section) 340, which is also sometimes referred to herein as a "third section" 340 and is similar to second section 330 in the example embodiment shown, has first and second opposing surfaces. The first surface of the third section 340 is disposed over and coupled to the second surface of the second section 330. The third section 340 includes a device layer having first and second opposing surfaces and a plurality of electrical connections extending between the first and second surfaces. The second surface of the device layer corresponds to the second surface of the third section 340. The third section 340 also includes an insulating layer having first and second opposing surfaces. The first surface of the insulating layer corresponds to the first surface of the third section 340.

The semiconductor structure 300 also includes one or more conductive structures (e.g., 370) extending between select ones of the plurality of electrical connections in the first section 320, select ones of the plurality of electrical connections in the device layer of the second section 330, and/or select ones of the plurality of electrical connections in the device layer of the third section 340. Example conductive materials for the conductive structures include, but are not limited to: titanium, titanium-nitride, tungsten and/or other suitable electrically conductive materials.

The semiconductor structure 300 additionally includes a plurality of interconnect pads (e.g., 380). The interconnect pads, which each have first and second opposing surfaces and a plurality of sides, are provided in a pattern or shape which promotes scalability of the semiconductor structure 300 (e.g., for coupling semiconductor structure 300 to other semiconductor structures or devices). A first surface of the interconnect pads is disposed over or beneath (e.g., attached or otherwise coupled to) select portions of at least the second surface of semiconductor structure 300 using techniques well known to those of ordinary skill in the art. Select ones of the interconnect pads (e.g., 380) are also electrically coupled to the conductive structures (e.g., 370) in semiconductor structure 300. The electrical coupling may, for example, occur through bond wires or via contacts spaced between the first surface of the interconnect pads and the conductive structures in a region below the interconnect pads. At least one of the one or more conductive structures (e.g., micro vias and/or sub-micron vias) in semiconductor structure 300 extends between select ones of the plurality of electrical connections in the device layer of the second section, select ones of the plurality of electrical connections in the device layer of the third section, and the first surface of select ones of the interconnect pads.

The interconnect pads, which may have a substantially circular, rectangular or square shape, for example, may be formed of a single layer of material, or multiple layers of material. Those of ordinary skill in the art will understand how to select the shape and size of the interconnect pads for a particular application (e.g., based on pitch and assembly risk sites). Example electrically conductive materials for the interconnect pads include, but are not limited to: copper, aluminum, gold/nickel/Cu, gold/platinum/Titanium/Al and/or other suitable electrically conductive materials.

The semiconductor structure 300 further includes an optional support or "handle" structure (e.g., a handle substrate) 310 having first and second opposing surfaces. The handle structure, which may be provided from Silicon (Si), Silicon carbide (SiC) and/or Sapphire as a few examples, may be used for coupling semiconductor structure 300 to machinery for aligning and coupling semiconductor structure 300 to other semiconductor structures (e.g., semiconductor structure 1300, as will be discussed), for example. In the example embodiment shown, the second surface of the handle structure 310 is disposed over and coupled to the first surface of semiconductor structure 300. The handle structure 310 may be provided as part of or separate from semiconductor structure 300.

In some embodiments, at least one of the one or more conductive structures extends between select ones of the plurality of electrical connections in the first section 320 and select ones of the plurality of electrical connections in the device layer of the second section 330 is provided as a through insulator via (TIV) conductive structure.

Additionally, in some embodiments, the insulating layer of at least the second section 330 is provided from an oxide material including at least one of silicon dioxide (SiO$_2$) and chemically treated silicon oxide (SiO). The SiO may be chemically treated through a physical (e.g. plasma) and or chemical (e.g., solution) process (e.g., to convert the SiO from a conventional oxide to a self-bondable oxide). Further, in some embodiments, at least one of the one or more conductive structures extending between select ones of the plurality of electrical connections in the device layer of the second section is provided as a through oxide via (TOV) conductive structure.

Referring now to FIG. 3A, an example semiconductor structure 1300 similar to semiconductor structure 300 of FIG. 3 is shown. Semiconductor structure 1300 includes a first section 320, a second section 330, a third section 340 and, optionally, a handle structure 310.

Referring now to FIG. 3B, an example multi-layer semiconductor device 2300' as may be provided in an example method for fabricating a semiconductor device including at least two semiconductor structures in accordance with the concepts, systems, circuits and techniques sought to be protected herein is shown.

The multi-layer semiconductor device 2300' includes semiconductor structure 300 and semiconductor structure 1300 of FIGS. 3 and 3A, respectively. The multi-layer semiconductor device 2300' also includes a via joining layer 2310 disposed between and coupled to second surfaces of each of the semiconductor structure 300 and the semiconductor structure 1300. The via joining layer 2310 has first and second opposing surfaces and at least one conductive structure (e.g., conductive structure 2312) extending between select portions of the first and second surfaces. The at least one conductive structure, which is provided from one or more electrically conductive materials (e.g., copper, gold or aluminum) which may be the same as or similar to the material from which the interconnect pads of semiconductor structure 300 and semiconductor structure 1300 are provided, is electrically coupled to second surfaces of select ones of the one or more interconnect pads (e.g., interconnect pad 380) on semiconductor structure 300 and semiconductor structure 1300 to form one or more electrical connections between semiconductor structure 300 and semiconductor structure 1300.

It should, of course, be appreciated that the embodiment shown in FIG. 3B is representative of one example configuration of multi-layer semiconductor device 2300' and one example approach for creating multi-layer semiconductor device 2300'. Several other example approaches for producing multi-layer semiconductor device 2300' (and similar, electrically equivalent semiconductor devices) are, for example, described below.

Approach 1: An electrically equivalent multi-layer semiconductor device 2300' includes: via last between first section 320 and second section 330 of semiconductor structure 300, and via last between second section 330 and third section 340 of semiconductor structure 300, via last between first section 320 and second section 330 of semiconductor structure 1300, via last between second section 330 and third section 340 of semiconductor structure 1300, and via first between third section 340 of semiconductor structure 300 and third section 340 of semiconductor structure 1300. Thus, in approach 1, the electrically equivalent semiconductor device 2300' has a via last-via last-via first-via last-via last combination. Specifically, converting via last of third section 340 in semiconductor structure 300 and semiconductor structure 1300 to via first (e.g., through via joining layer 2310) creates an electrical interconnection among semiconductor structure 300 and semiconductor structure 1300 to create electrically equivalent semiconductor device 2300'.

Approach 2: An electrically equivalent multi-layer semiconductor device 2300' includes: via first between first section 320 and second section 330 of semiconductor structure 300, via last between third section 330 and fourth section 340 of semiconductor structure 300, via first between first section 320 and second section 330 of semiconductor structure 1300, via last between third section 330 and fourth section 340 of semiconductor structure 1300, and via first between fourth section 340 of semiconductor structure 300 and fourth section 340 of semiconductor structure 1300. Thus, the electrically equivalent semiconductor device 2300' has via first-via last-via first-via last-via first combination. Specifically, replacing via last with via first between first section 320 and second section 330, and converting via last of fourth section 340 in semiconductor structure 300 and semiconductor structure 1300 to via first (e.g., through via joining layer 2310) creates an electrical interconnection among the semiconductor structure 300 and semiconductor structure 1300 to create electrically equivalent semiconductor device 2300'.

Approach 3: An electrically equivalent multi-layer semiconductor device 2300' includes: via first between second section 320 and third section 330 of semiconductor structure 300, via first between third section 330 and fourth section 340 of semiconductor structure 300, via first between second section 320 and third section 330 of semiconductor structure 1300, via first between third section 330 and fourth section 340 of semiconductor structure 1300, and via first between fourth section 340 of semiconductor structure 300 and fourth section 340 of semiconductor structure 1300. Thus, electrically equivalent semiconductor device 2300' has a via first-via first-via first-via first-via first combination.

Specifically, making via first separately between second section 320 and third section 330 of semiconductor structures 300 and 1300, via first between fourth section 340 of semiconductor structure 300 and fourth section 340 of semiconductor structure 1300, and creating via first between third section 330 and fourth section 340 of semiconductor structures 300, 1300 will reduce significant processing steps to create electrically equivalent semiconductor device 2300'. This approach will create shortest interconnect between device layers and create interconnect between interconnect layers without adding stubs. This approach also used minimum active area of semiconductor structures 300, 1300 and, thus, enables the use of maximum space for active devices in semiconductor structures 300, 1300. Here, via first between third section 330 and fourth section 340 requires larger pitch than via first between second section 320 and third section 330 to reduce (or eliminate) misalignment, for example.

Fourth approach: An electrically equivalent multi-layer semiconductor device 2300' includes: via last between second section 320 and third section 330 of semiconductor structure 300, via last between third section 330 and fourth section 340 of semiconductor structure 300, via last between second section 320 and third section 330 of semiconductor structure 1300, via last between third section 330 and fourth section 340 of semiconductor structure 1300, and via last between fourth section 340 of semiconductor structure 300 and fourth section 340 of semiconductor structure 1300. Thus, electrically equivalent semiconductor device 2300' has a via last-via last-via last-via last-via last combination. This approach is a sequential process and requires maximum processing steps to create electrically equivalent semiconductor device 2300'. This option also uses isolated device space to create interconnects between device layers. Via last is used to minimize misalignment and create finer pitch interconnects among one or more of the layers in semiconductor device 2300'.

Figure 4:
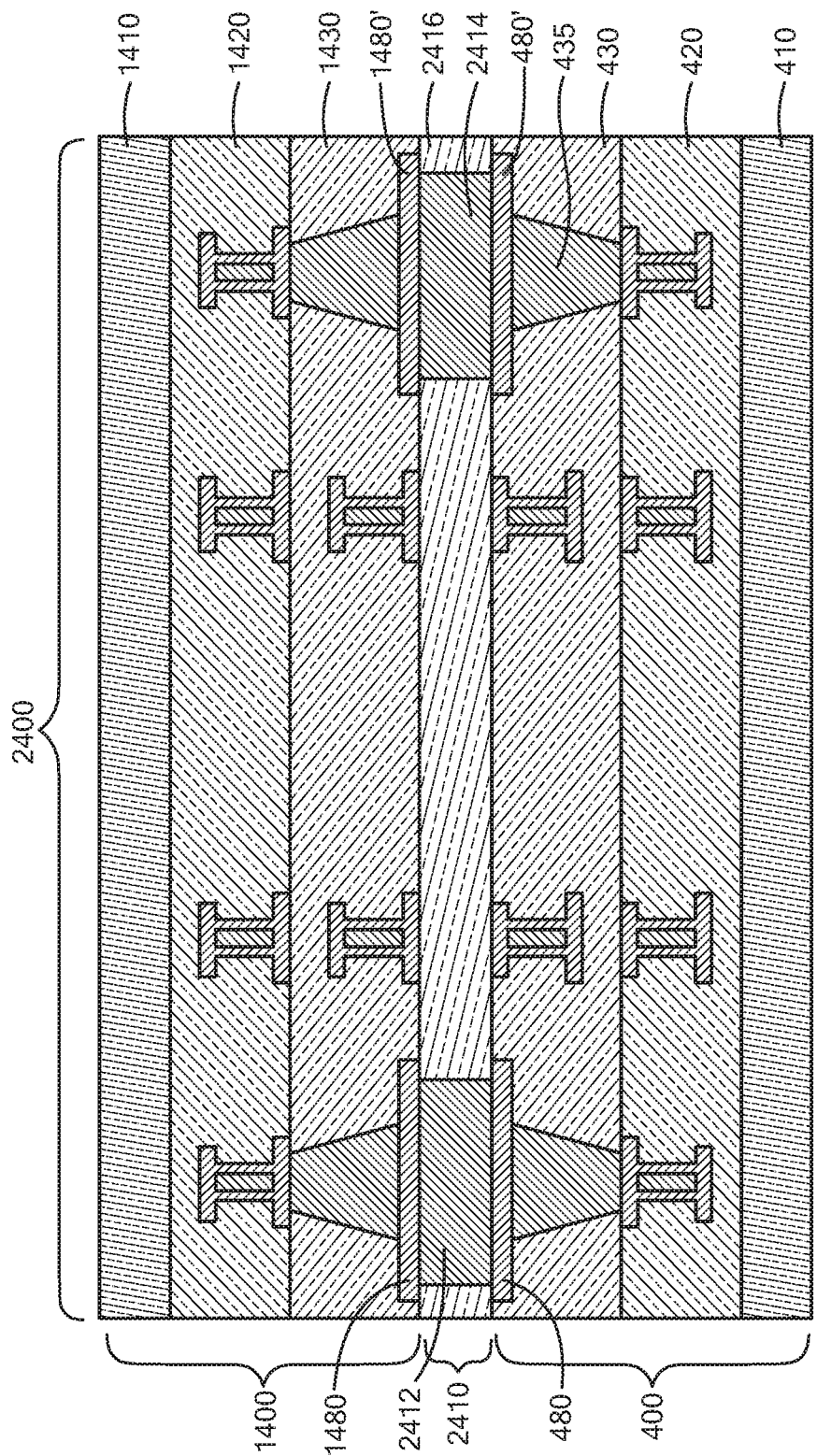
FIG. 4 is a block diagram of another example multi-layer semiconductor device.

Approaches 1 and 2 discussed above may be further optimized to minimize processing steps to achieve finer pitch 3DICs. FIG. 4 is an example of via last-via first-via last approach where via last is converted to via first to produce unique via structure in a 3DIC (or multi-layer semiconductor device), for example.

Referring now to FIG. 4, another example multi-layer semiconductor device 2400 includes a first semiconductor structure 400, a second semiconductor structure 1400 and a via joining layer 2410. Each of the first and second semiconductor structures 400, 1400 has first and second opposing surfaces and includes a first section (e.g., 420, 1420) having first and second opposing surfaces, with the first surface of the first section corresponding to the first surface of the first and second semiconductor structures. Each of the first and second semiconductor structures 400, 1400 also includes a second section (e.g., 430, 1430) having first and second opposing surfaces, with the first surface of the second section disposed over and coupled to the second surface of the first section. In the example embodiment shown, the first surface of each first section corresponds to the first surface of the semiconductor structures and the second surface of each second section corresponds to the second surface of the semiconductor structures.

Each of the first and second semiconductor structures 400, 1400 also includes a handle structure (e.g., 410, 1410) having first and second opposing surfaces, with the first surface of each handle structure disposed over first surfaces of the first and second semiconductor structures. The handle structures are optional in some embodiments.

Via joining layer 2410 is disposed between and coupled to second surfaces of each of the first and second semiconductor structures 400, 1400. The via joining layer 2410 has first and second opposing surfaces and includes a plurality of conductive structures (here, first and second conductive structures 2412, 2414) extending between select portions of the first and second surfaces. The plurality of conductive structures may include a plurality of conducting metals, the plurality of conducting metals including at least one of Nickel (Ni), Copper (Cu), Aluminum (Al), Zinc (Zn) and Tin (Sn). The via joining layer 2410 also includes an oxide material (or layer) 2416 disposed between select portions of the first and second surfaces of the via joining layer 2410.

A first one of the conductive structures (also sometimes referred to as a "first conductive structure") 2412 has a first end electrically coupled to a second surface of interconnect pad 480 on first semiconductor structure 400 and a second, opposing end electrically coupled to a second surface of interconnect pad 1480 on second semiconductor structure 1400. Second surfaces of the interconnect pads (e.g., 480, 1480) may include a combination of Titanium (Ti), Titanium Nitride (TiN), Aluminum (Al) and Copper (Cu) (e.g., with Cu comprising less than one percent of the combination), a combination of Ti and Al, or a combination of Ti, Al and Cu (e.g., with Cu comprising less than one percent of the combination), for example. Additionally, a second one of the conductive structures (also sometimes referred to as a "second conductive structure") 2414 has a first end electrically coupled to a second surface of interconnect pad 480' on first semiconductor structure 400 and a second, opposing end electrically coupled to a second surface of interconnect pad 1480' on second semiconductor structure 1400. In doing so, via joining layer 2410 electrically couples first semiconductor structure 400 to second semiconductor structure 1400 to form a multi-layer semiconductor device (i.e., multi-layer semiconductor device 2400) including at least two semiconductor structures (i.e., first semiconductor structure 400 and second semiconductor structure 1400).

In the example embodiment shown, a first one of the electrical connections (or vias) formed between the first and second semiconductor structures 400, 1400 (e.g., through first conductive structure 2412) is an electrical connection between first select ones of the plurality of electrical connections (e.g., micro vias and/or sub-micron vias and/or nano vias) in the first section 420 of the first semiconductor structure 400 and first select ones of the plurality of electrical connections (e.g., micro vias and/or sub-micron vias) in the first section 1420 of the second semiconductor structure 1400. Additionally, in the example embodiment shown, a second one of the electrical connections formed between the first and second semiconductor structures 400, 1400 (e.g., through second conductive structure 2414) is an electrical connection between second select ones of the plurality of electrical connections (e.g., micro vias and/or sub-micron vias and/or nano vias) in the first section 420 of the first semiconductor structure 400 and second select ones of the plurality of electrical connections (e.g., micro vias and/or sub-micron vias and/or nano vias) in the first section 1420 of the second semiconductor structure 1400.

Conductive structures (e.g., micro vias, sub-micron and nano vias) are patterned and etched through the buried oxide and deposited oxides of multi-layer semiconductor device 2400 to expose metal contacts in the multi-layer semiconductor device 2400. The conductive structures (e.g., 435) may, for example, be defined by a resist opening which is closely matching with a metal opening within and/or at an end of each device section, and etched through existing dielectric regions in the field such that aligning the conductive structures with a deposited dielectric is not required to achieve insulation between the vertical connections. In one embodiment, a multi-step etching process is required to create openings for conductive structures. Such process may use dry and/or wet oxide etching, metal etching and/or oxide etching. Multistep wet etching can, for example, create lateral etching to the oxides which provides for the conductive structures having a particular shape.

A titanium material having a thickness of about 10 nm and a MOCVD TiN material having a thickness of about 5 nm can be used for a liner and tungsten plugs for conductive structures. MOCVD or CVD TiN$_X$ fill with X≤1 is preferred in one embodiment for better conformal coating. Metal fill conductive structures may use chemical mechanical polishing for planarization. Additionally, a metal contact (or interconnect pad) in an upper device section of multi-layer semiconductor device 2400 may be an annulus with a 1.5-μm opening that also functions as a self-aligned hard mask during a plasma etch of an oxide material or layer beneath it to reach a corresponding metal contact in a lower device section of multi-layer semiconductor device 2400. In order to fully align the conductive structure, the size of the metal contact, and thus the pitch of the vertical interconnect, may be proportional to twice the wafer-wafer misalignment of semiconductor structures 400 and 1400, for example.

A multi metal layer pad may, for example, be further deposited on top of metal fill vias (e.g., conductive structures). In one embodiment, the metal pad includes a combination of a first Ti layer having a thickness of about 10 nm, Al or Cu layer having a thickness of about 170 nm, a second Ti layer having a thickness of about 10 nm, and TiN$_X$ (X≤1) (e.g., PVD TiN$_X$ (X≤1)) layer having a thickness of about 25 nm. For example, a 75 nm PVD or IMP PVD TiN may result in higher conductivity and improved critical temperature T$_C$ than MOCVD TiN. MOCVD may also require multiple passes to achieve a desired thickness.

It should, of course, be appreciated that the electrical connections formed between the first and second semiconductor structures 400, 1400 may be electrical connections between any number of the plurality electrical connections in the sections (i.e., the first and second sections) of the first semiconductor structure 400 and any number of the plurality electrical connections in the sections (i.e., the first and second sections) of the second semiconductor structure 1400.

The first section 420 of the first semiconductor structure 400 may correspond to a first section (or first tier) of the multi-layer semiconductor device 2400, the second section 430 of the first semiconductor structure 400 may correspond to a second section (or second tier) of the multi-layer semiconductor device 2400, the second section 1430 of the second semiconductor structure 1400 may correspond to a third section (or third tier) of the multi-layer semiconductor device 2400, and the first section 1420 of the second semiconductor structure 1400 may correspond to a fourth section (or fourth tier) of the multi-layer semiconductor device 2400.

In the example embodiment shown, the second section 430 of the first semiconductor structure 400 includes a first conductive structure 435 having first and second opposing surfaces extending between the first and second surfaces of the second section 430 of the first semiconductor structure 400. In one embodiment, the first and second surfaces of the first conductive structure 435 have same or similar dimensions. In another embodiment, the first surface of the first conductive structure 435 has first dimensions and the second surface of the first conductive structure 435 has second, different dimensions (e.g., as may be suitable for the electrical connection or via to which the first conductive structure 435 is to be electrically coupled to, such as a micro via, sub-micron via and/or nano via). As one example, the first surface of the first conductive structure 435 may have a diameter between about two μm and about six μm. As another example, the second surface of the first conductive structure 435 may have a diameter between about one μm and about 0.1 μm.

In some embodiments, a predetermined distance of between about one micrometer (μm) and about four μm may exist between the first and second surfaces of via joining layer 2410. The predetermined distance may, for example, correspond to a height of the via joining layer and a height of the at least one conductive structure. Additionally, in some embodiments, a predetermined distance of between about six μm and about ten μm may exist between the first and second surfaces of the second section in at least the first semiconductor structure. The predetermined distance may, for example, correspond to a height of the second section.

Further, in some embodiments, via joining layer 2410 may be formed on the second surface of the first semiconductor structure 400. Additionally, in some embodiments, via joining layer 2410 may be formed on the second surface of the second semiconductor structure 1400. Further, in some embodiments, via joining layers (i.e., first and second via joining layers) may be formed on second surfaces of each of the first and second semiconductor structures 400, 1400, as will be described further in conjunction with FIG. 6D.

Figure 4A:
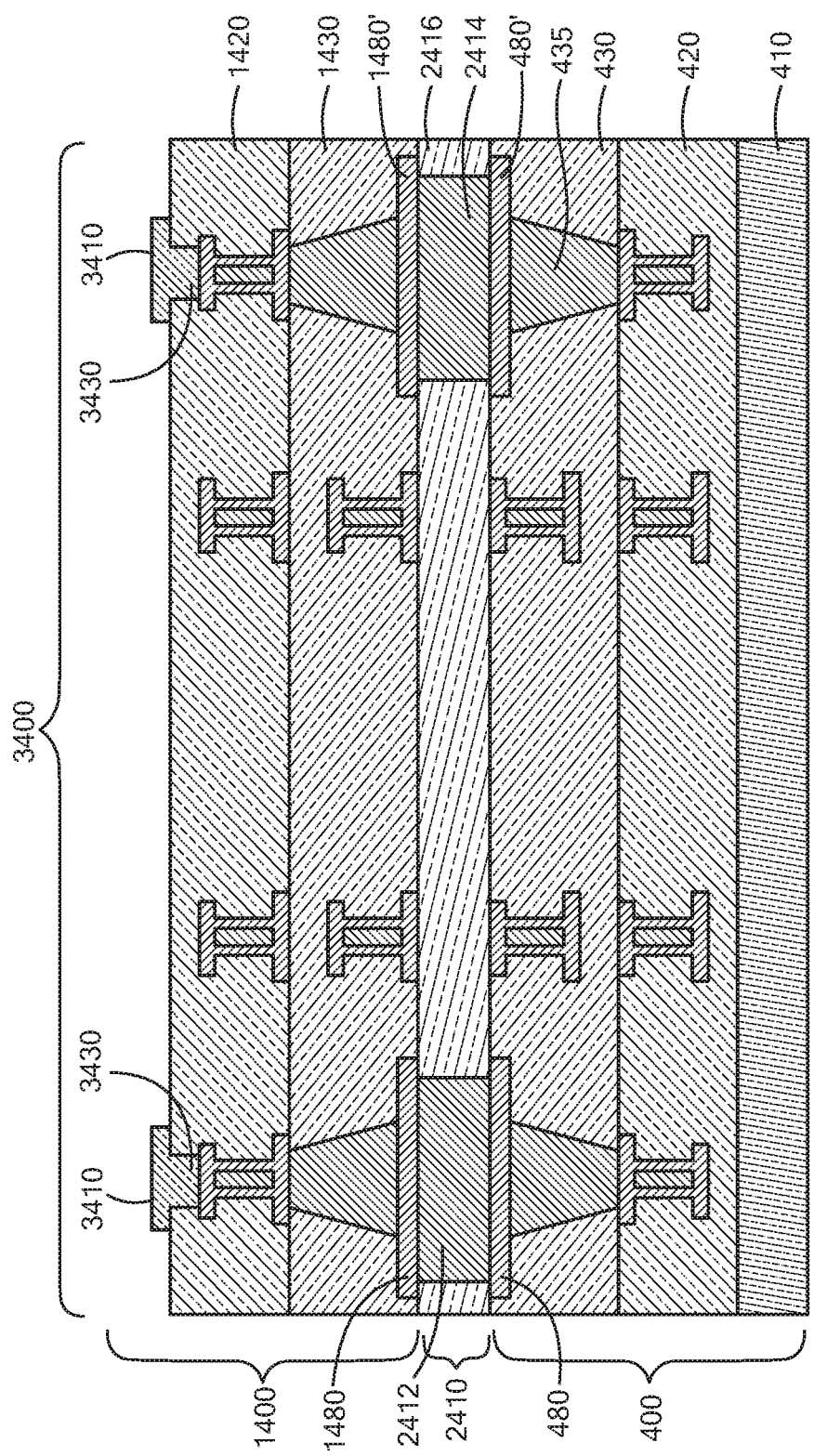
FIG. 4A is a block diagram of another example multi-layer semiconductor device.

Referring now to FIG. 4A, an example multi-layer semiconductor device 3400 similar to multi-layer semiconductor device 2400 of FIG. 4 is shown. The multi-layer semiconductor device 3400, which has first and second opposing surfaces, includes a first semiconductor structure 400, a second conductive structure 1400 and a via joining layer 2410. The first surface of semiconductor structure 400 corresponds to the first surface of multi-layer semiconductor device 3400 and the first surface of semiconductor structure 1400 corresponds to the second surface of multi-layer semiconductor device 3400.

The multi-layer semiconductor device 3400 also includes a plurality of interconnect pads (here, interconnect pads 3410, 3420) and a plurality of conductive structures (here, conductive structures 3430, 3440) for electrically coupling the interconnect pads to the electrical connections formed between the first and second semiconductor structures 400, 1400 (e.g., through first and second conductive structures 2412, 2414). The interconnect pads 3410, 3420 have first and second opposing surfaces with first surfaces of the interconnect pads 3410, 3420, which may include a combination Ti, TiN, Al and Cu (e.g., with Cu comprising less than one percent of the combination), a combination of Ti and Al, or a combination of Ti, Al and Cu (e.g., with Cu comprising less than one percent of the combination), or Al, for example, disposed over or beneath select portions of the second surface of the multi-layer semiconductor device 3400 and electrically coupled to the conductive structures 3430, 3440. In one embodiment, conductive structures 3430, 3440 include a Ti/TiN liner and Tungsten (W) fill. Such may require a single or multistep physical deposition. Additionally, in one embodiment, chemical mechanical polishing (CMP) and/or annealing can be used after each deposition.

Figure 5:
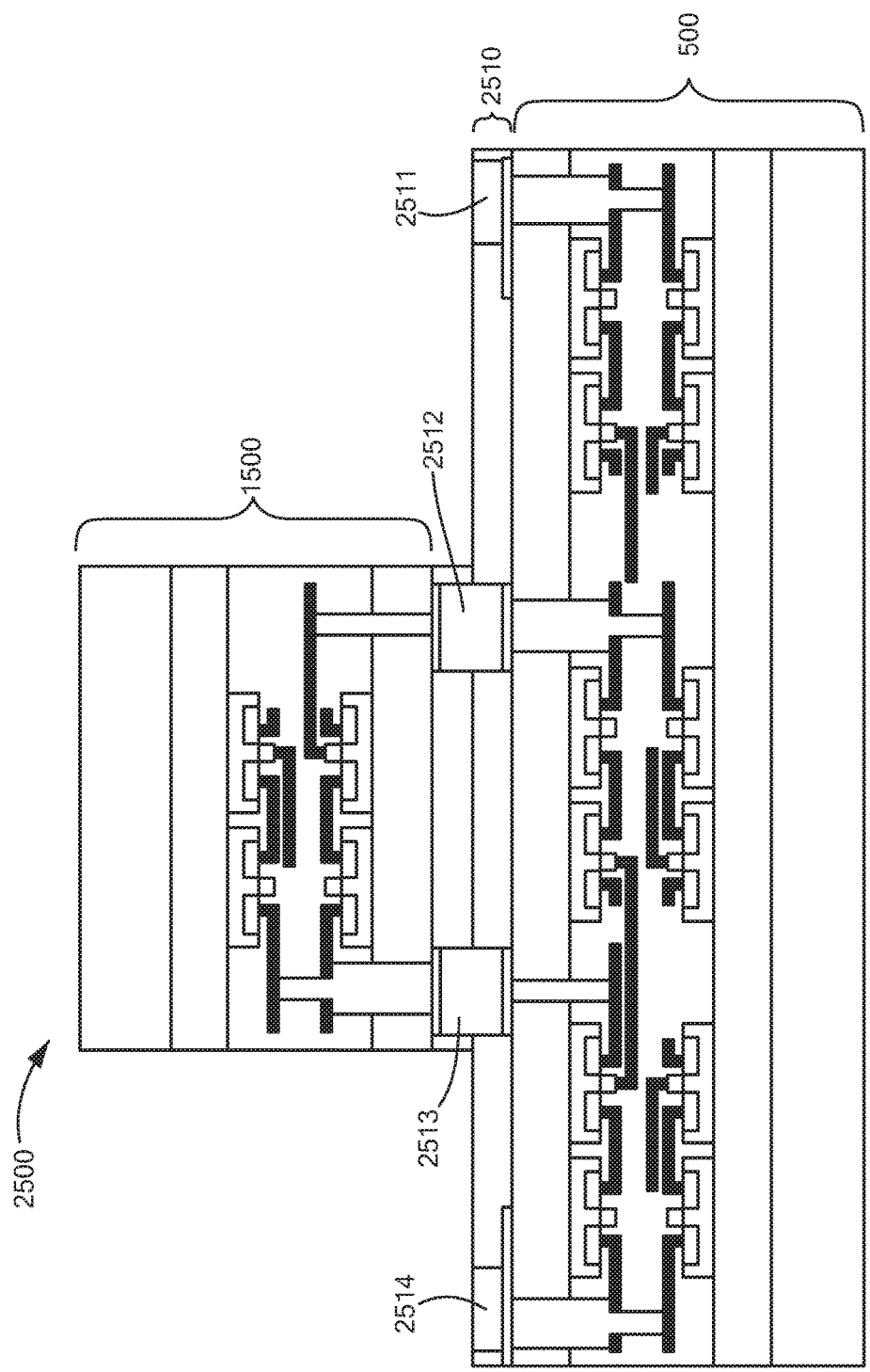
FIG. 5 is a block diagram of another example multi-layer semiconductor device.

Referring now to FIG. 5, another example multi-layer semiconductor device 2500 includes a first semiconductor structure 500, a second semiconductor structure 1500 and a via joining layer 2510. As illustrated, the first semiconductor structure 500 is provided having a first form factor and the second semiconductor structure 1500 is provided having a second, different form factor. Additionally, the via joining layer 2510, which may be provided as first and second via joining layers in some embodiments (e.g., with the via joining layer 2510 having angstrom level or nano level smooth self-bondable oxide at the bonding surface), is provided having a first plurality of conductive structures 2512, 2513 disposed between and electrically coupled the first semiconductor structure 500 and the second semiconductor structure 1500 and a second plurality of conductive structures 2511, 2514. The second plurality of conductor structures 2511, 2514 may be used for coupling the first semiconductor structure 500 to one or more additional semiconductor structures (not shown) and/or for coupling the multi-layer semiconductor device 2500 to one or more additional multi-layer semiconductor devices (not shown).

Figure 6:
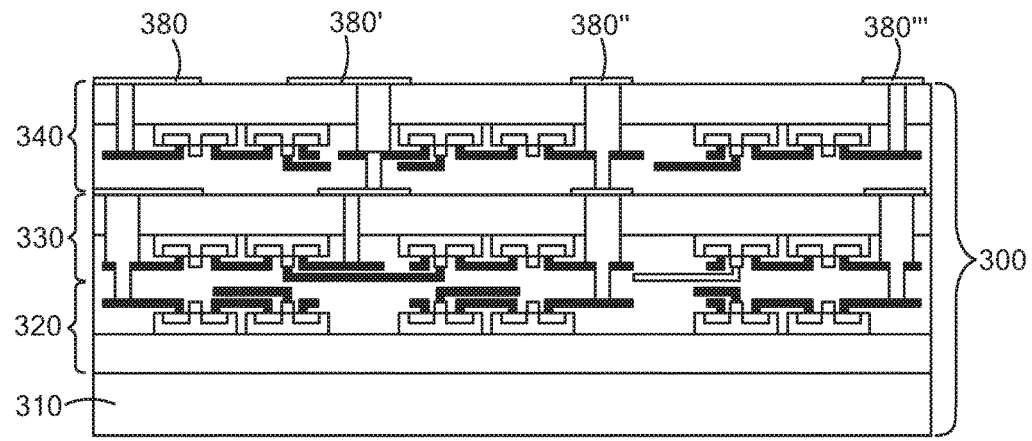
FIGS. 6-6C are block diagrams of example semiconductor structures as may be provided in an example method for fabricating a multi-layer semiconductor device in accordance with an embodiment.
Figure 6A:
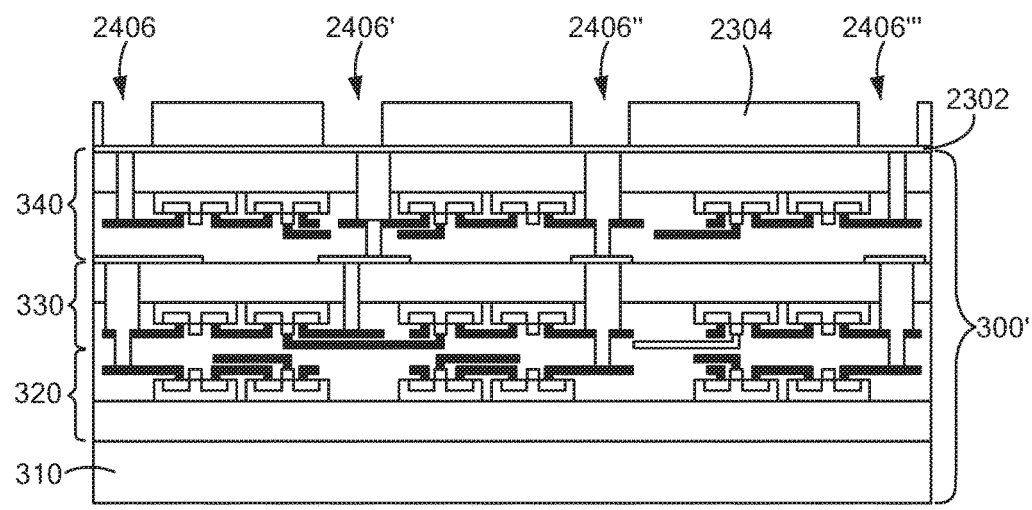
FIG. 6D is a block diagram of example semiconductor structures.
FIG. 6E is a block diagram of an example multi-layer semiconductor device including the semiconductor structures of FIG. 6D, for example.
FIG. 6F is a block diagram of an example multi-layer semiconductor device similar to the multi-layer semiconductor device of FIG. 6E, for example.
Figure 6B:
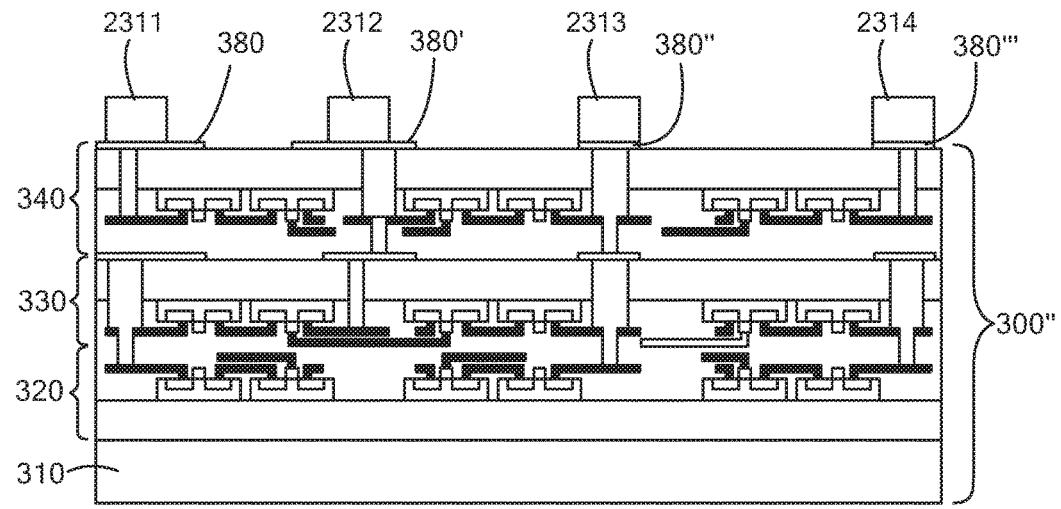
Figure 6C:
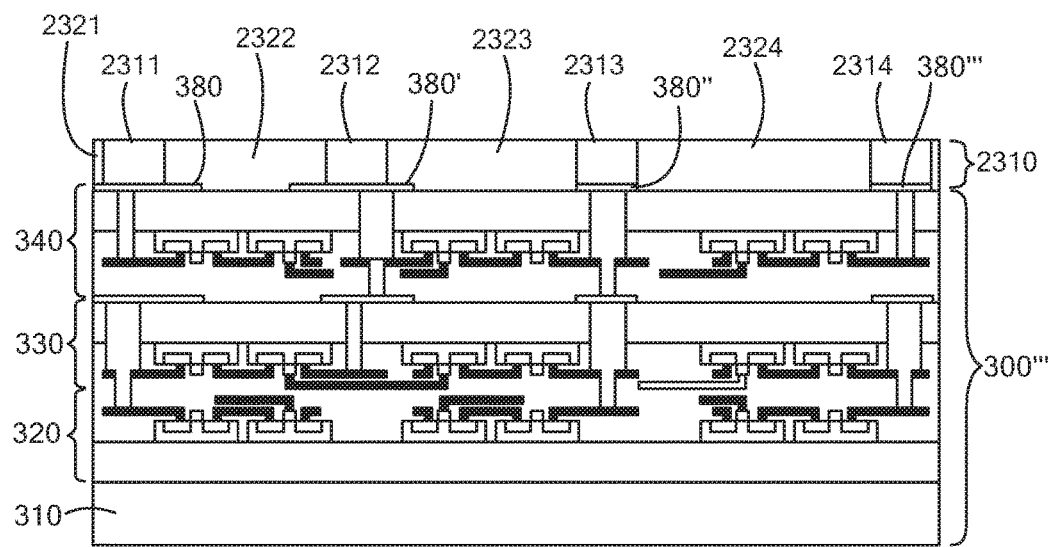

Referring now to FIGS. 6-6C, example semiconductor structures as may be provided in an example method for fabricating a multi-layer semiconductor device in accordance with the concepts, systems, circuits and techniques sought to be protected herein are shown. While FIGS. 6-6C are illustrated to comprise a sequence of processes, the example method is not limited to performing the illustrated processes in the sequence shown.

Referring now to FIG. 6, an example semiconductor structure 300 as may be provided as part of an example multi-layer semiconductor device (e.g., semiconductor device 2300, as will be discussed) including at least two semiconductor structures (e.g., semiconductor structures 300, 1300, as will be discussed) is shown. Semiconductor structure 300 is the same as the semiconductor structure shown in FIG. 3, for example, including at least a first section 320, a second section 330, a third section 340.

Semiconductor structure 300 additionally includes a plurality of conductive structures (e.g., conductive structure 370) extending between select ones of the plurality of electrical connections in the first section 320, select ones of the plurality of electrical connections in the device layer of the second section 330, and/or select ones of the plurality of electrical connections in the device layer of the third section 340.

Semiconductor structure 300 further includes a plurality of interconnect pads 380, 380', 380", 380''' having first and second opposing surfaces and one or more sides. The first surface of each one of the interconnect pads (e.g., 380) is disposed over or beneath select portions of at least the second surface of semiconductor structure 300 (i.e., the second surface of the third section 340) and electrically coupled to select ones of the conductive structures. In the example embodiment shown, semiconductor structure 300 also includes a handle structure 310.

Referring now to FIG. 6A, an example semiconductor structure 300' includes a first section 320, a second section 330 and a third section 340. Semiconductor structure 300' also includes a plurality of conductive structures, a plurality of interconnect pads and a handle structure 310. Semiconductor structure 300' additionally includes a conductive layer 2302 having first and second opposing surfaces. The conductive layer 2302 is provided from an electrically conductive material (e.g., copper, gold or aluminum) which may be the same as or similar to the material from which the interconnect pads are provided. A first surface of the conductive layer 2302 is disposed over (e.g., attached or otherwise coupled to) at least a portion of the second surfaces of the semiconductor structure 300' and the interconnect pads in some embodiments. The conductive layer 2302 may be electrically coupled to at least the second surface of interconnect pads and patterned using photo process and/or deposited over at least a portion of the second surface of the semiconductor structure 300' and the interconnect pads by one or more physical (e.g., sputter) and chemical (e.g., electroless) processes.

In an alternative embodiment, the first surface of the conductive layer 2302, which may be provided as a patterned conductive layer, is disposed over an adhesive layer (e.g., an adhesive promoter layer) for coupling the conductive structure 2302 to the second surfaces of semiconductor structure 300' and the interconnect pads. The adhesive layer (not shown) may, for example, be provided having first and second opposing surfaces and be provided from an electrically conductive adhesive material (e.g., adhesive copper). A first surface of the adhesive layer may be disposed over at least select portions of the second surface of semiconductor structure 300'. Suitable adhesives of the adhesive layer may include die attach adhesive, adhesive tape or the like.

Semiconductor structure 300' further includes a photo resist layer 2304. The photo resist layer 2304, which may be provided from a positive photo resist material (e.g., Polymethyl methacrylate (PMMA)) or another polymer that has a property of becoming more soluble when exposed to ultraviolet light, has first and second opposing surfaces. A first surface of the photo resist layer 2304 is disposed over the second surface of the conductive layer 2302 and second surfaces of the interconnect pads. Additionally, openings having a predetermined shape are formed in select portions of the photo resist layer 2304 extending between the second surface of the photo resist layer 2304 and second surfaces of select ones of the interconnect pads. The openings may, for example, be formed by exposing the photo resist layer 2304 to an exposure energy (e.g., ultraviolet light) having a predetermined intensity distribution and, optionally, developing the photo resist layer 2304. The openings may also be formed by grinding select portions of the photo resist layer 2304.

Additionally, the openings may be formed by depositing a photo resist layer 2304 including a positive photo resist material over the second surface of the conductive layer 2302 (e.g., where the conductive layer 2302 is an unpatterned conductive layer having a thickness of less than about one micron) and second surfaces of the interconnect pads, exposing the photo resist layer 2304, and developing the photo resist layer 2304 such that the openings are formed. Additionally, one or more portions of the photo resist layer 2304 may be stripped and the photo resist layer 2304 may be etched to produce the openings.

Alternatively, the openings may be formed by depositing a photo resist layer 2304 including a negative photo resist material over the second surface of the conductive layer 2302 (e.g., where the conductive layer 2302 is a patterned conductive layer) and second surfaces of the interconnect pads, exposing the photo resist layer 2304, and developing the photo resist layer 2304. Additionally, one or more portions of the photo resist layer 2304 may be stripped and the photo resist layer 2304 may be etched to produce the openings. In one aspect, semiconductor structure 300' is representative a semiconductor structure achieved using such approach.

Referring now to FIG. 6B, an example semiconductor structure 300" includes a first section 320, a second section 330 and a third section 340. Semiconductor structure 300" also includes a plurality of conductive structures, a plurality of interconnect pads 380, 380', 380", 380''' and a handle structure 310. Semiconductor structure 300' additionally includes a plurality of via joining layer conductive structures 2311, 2312, 2313, 2314 (also sometimes referred to as "conductive structures"). Conductive structures 2311, 2312, 2313, 2314 may, for example, be formed by disposing an electrically conductive material (e.g., copper, gold, or aluminum) in the openings in the photo resist layer 2304 over second surfaces of the select ones of the interconnect pads of the semiconductor structure, as shown in FIG. 6A, and developing the conductive material to form the conductive structures 2311, 2312, 2313, 2314. Conductive structures 2311, 2312, 2313, 2314 may also be deposited and formed by one or more physical (e.g., sputter) and chemical (e.g., electroless) processes.

Conductive structures 2311, 2312, 2313, 2314 are provided having a predetermined shape (e.g., a substantially spherical, cylindrical, triangular or trapezoid shape) and are electrically coupled to the exposed (or second) surface of the interconnect pads. Additionally, in the example embodiment shown, at least a portion of conductive structures 2311, 2312, 2313, 2314 extend a predetermined distance above the second surface of the semiconductor structure. Those of ordinary skill in the art will understand how to select the predetermined distance for a particular application (e.g., for finer pitch applications). As one example, the predetermined distance, which is related to the height of conductive structures 2311, 2312, 2313, 2314, may be selected based upon a semiconductor package or assembly into which the semiconductor structure is to be integrated (e.g., flip-chip-on-board (FCOB) packaging, standard and fine pitch ball grid array (BGA) packaging, chip-scale package (CSP), system-in-package (SiP), and package-on-package (PoP) assemblies).

Interconnect pads 380, 380', 380", 380''' and conductive structures 2311, 2312, 2313, 2314 form interconnects for electrically and mechanically coupling semiconductor structure 300" to other semiconductor structures (e.g., to form a multi-layer semiconductor device, as will be discussed).

In the example embodiment shown, the photo resist layer 2304 is removed (e.g., stripped with one or more solvents which may include acetone, methanol and Isopropyl Alcohol (IPA), with acetone strip resisting methanol and IPA cleaning the surface, for example) from the second surface the conductive layer (conductive layer 2302, shown in FIG. 6A) to expose the conductive layer. Further, one or more portions of the conductive layer are removed to expose select portions of the adhesive layer (not shown) or second surface of the semiconductor structure, as illustrated in the example embodiment shown. In doing so, openings are formed between each of the conductive structures 2311, 2312, 2313, 2314.

In some embodiments, instead of forming conductive structures 2311, 2312, 2313, 2314 from the conductive material over second surfaces of interconnect pads 380, 380', 380", 380''', the conductive structures 2311, 2312, 2313, 2314 may be formed in a separate process with the conductive structures 2311, 2312, 2313, 2314 subsequently disposed over and electrically coupled to interconnect pads 380, 380', 380", 380''' through a reflow process, for example.

Referring now to FIG. 6C, an example semiconductor structure 300''' includes a first section 320, a second section 330 and a third section 340. Semiconductor structure 300''' also includes a plurality of conductive structures, a plurality of interconnect pads and a handle structure 310. Semiconductor structure 300''' additionally includes a via joining layer 2310, the via joining layer 2310 including conductive structures 2311, 2312, 2313, 2314 and a plurality of insulating structures 2321, 2322, 2323, 2324, 2325.

In one embodiment, at least one surface (e.g., a first surface) of insulating structures 2321, 2322, 2323, 2324, 2325 includes a self-bondable oxide. Conductive structures 2311, 2312, 2313, 2314 may, for example, be deposited first and insulating structures 2321, 2322, 2323, 2324, 2325 deposited second. Chemical mechanical polishing may be used to remove insulating structures 2321, 2322, 2323, 2324, 2325 from conductive structures 2311, 2312, 2313, 2314 and expose conductive structures 2311, 2312, 2313, 2314 prior to bonding. In one embodiment, at least part of conductive structures 2311, 2312, 2313, 2314 includes a high CTE metal. Additionally, in one embodiment, part of the conductive structures 2311, 2312, 2313, 2314 structures includes a multi-metal layer where at least one of the layers in the multi-metal layer includes a low melting point metal, a fusible metal, and/or a fusible alloy.

Use of a high CTE metal, a fusible metal, and/or a fusible alloy may, for example, help to create an electrical connection between semiconductor structure 300''' and semiconductor structure 1300''' during bonding. The high CTE metal, fusible metal, and/or fusible alloy may be annealed after bonding to create electrical connection between semiconductor structures 300''' and 1300'''. Additionally, in one embodiment, the metals can react with each other metal during bonding or a post bonding process to create high temperature melt conductive fusible alloy and/or solid solution.

Further, an oxide material or layer may be deposited on one or more sides (e.g., first and/or second sides) of at least one of semiconductor structure 300''' and 1300'''. For a semiconductor structure including an oxide material or layer or first and second surfaces, for example, one side can have PECVD oxide and other side can have thermal oxide. Additionally, each oxide surface may go through chemical mechanical polishing (CMP) and subsequent annealing in presence of hydrogen and/or nitrogen one or more times. Moreover, annealing can be done after completing CMP on both sides. In one embodiment, a thermal oxide is used on a first surface of the semiconductor structure (e.g., 300''') and a self-bondable oxide is used on a second surface (e.g., bonding side) of the semiconductor structure (e.g., 300'''). CMP may, for example, be required on the first surface of at least one of the semiconductor structures (e.g., 300''') for infrared camera alignment.

Further, in one embodiment, one or more conductive materials may be deposited within each of the resist and/or dielectric openings of semiconductor structure 300''' (as shown in FIG. 6C, for example) to form conductive structures 2311, 2312, 2313, 2314. Such deposition may, for example, be accomplished using a conventional evaporation process. The process may include plasma oxide etching, ion milling to remove any residual oxide or contaminates, applying an adhesion promoter (e.g., Ti, Cr), applying a barrier layer (e.g., Ni, Pt), and applying a noble metal (e.g., Au, Ag) or high conducting metal (Cu, Al), high CTE metal and or fusible metal. A conductive metal (or metal structure) including at least one fusible metal may also be used to form conductive structures 2311, 2312, 2313, 2314. Depending on the desired sintering (and, possibly, melting) temperature(s) desired to sinter (and, possibly, melt) the metals and thereby form sound conductive paths through the conductive structures 2311, 2312, 2313, 2314, the conductive structures 2311, 2312, 2313, 2314 may further include additional elements. Such elements may include high CTE metal, aluminum, platinum, copper, gold, silver etc.

In accordance with one aspect of the concepts, systems, circuits and techniques sought to be protected herein, the conductive materials, once deposited within a respective opening, are capable of undergoing an expansion and/or sintering phase and/or melting to forming robust electrical paths through the interconnects of the semiconductor structure 300''' (including the plurality of electrical connections in semiconductor structure 300'''). In addition to sintering, the conductive materials may also include elements (e.g., solder metal) which will melt to thereby form still further contiguous paths for circuit flow. Importantly, if these added elements are used, the melting is not to occur until at least sintering has begun and, possibly, after sintering has been achieved. The result of this is the formation of circuit paths formed by sintering and melting, thereby providing for highly conductive interconnects in the semiconductor structure 300''' due to the presence of the conductive materials (and, thus, conductive structures 2311, 2312, 2313, 2314) therein.

Insulating structures 2321, 2322, 2323, 2324, 2325, which each have at least first and second opposing surfaces, may, for example, be formed by disposing an electrically-insulating material (e.g., Silicon oxide ($SiO_x$)) in at least the openings between each of conductive structures 2311, 2312, 2313, 2314. The first surface of each of the insulating structures 2321, 2322, 2323, 2324, 2325 is coupled to the second surface of semiconductor structure 300''' (and, in some embodiments, select portions of the second surfaces of the interconnect pads). Additionally, the second surface of each of the insulating structures 2321, 2322, 2323, 2324, 2325 extends a predetermined distance above the second surface of semiconductor structure 300'''. Insulating structures 2321, 2322, 2323, 2324, 2325 may be provided as or form an insulating layer.

In the example embodiment shown, conductive structures 2311, 2312, 2313, 2314 and insulating structures 2321, 2322, 2323, 2324, 2325 collectively form the via joining layer 2310. First surfaces of conductive structures 2311, 2312, 2313, 2314 and insulating structures 2321, 2322, 2323, 2324, 2325 correspond to a first surface of the via joining layer 2310 and second surfaces of conductive structures 2311, 2312, 2313, 2314 and insulating structures 2321, 2322, 2323, 2324, 2325 correspond to a second, opposing surface of the via joining layer 2310.

Figure 6D:
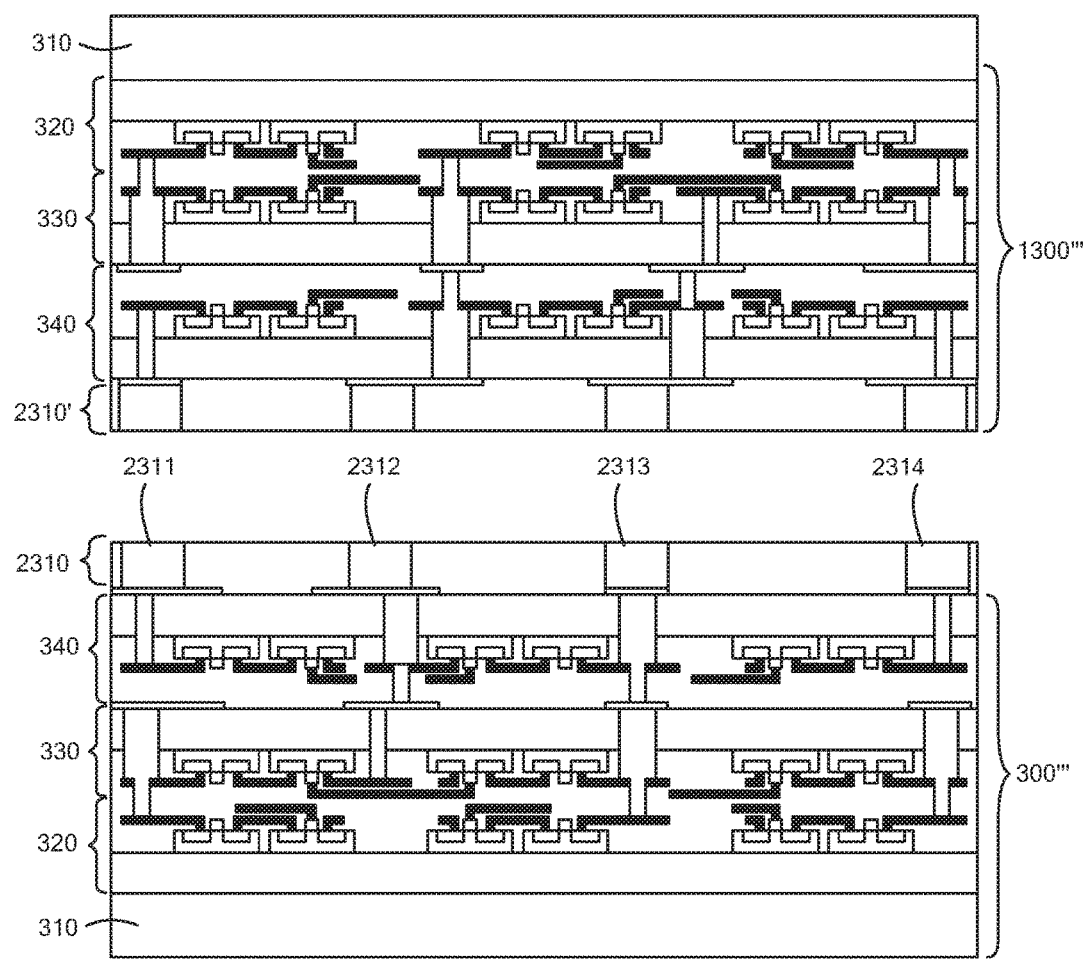

Referring now to FIG. 6D, example semiconductor structures as may be provided as part of an example multi-layer semiconductor device (e.g., semiconductor device 2300, as will be discussed) including at least two semiconductor structures (e.g., semiconductor structures 300''' and 1300''', as will be discussed) are shown. In the example embodiment shown, a first one of the semiconductor structures (i.e., a first semiconductor structure) 300''', which is the same as the semiconductor structure shown in FIG. 6C, for example, includes a first section 320, a second section 330 and a third section 340. Semiconductor structure 300''' also includes a plurality of conductive structures, a plurality of interconnect pads and a handle structure 310. Semiconductor structure 300''' additionally includes a via joining layer 2310 (also sometimes referred to as a "first via joining layer" 2310).

Additionally, a second one of the semiconductor structures (i.e., a second semiconductor structure) 1300''', which is similar to first semiconductor structure 300''' in the example embodiment shown, includes a first section 320, a second section 330 and a third section 340. Semiconductor structure 1300''' also includes a plurality of conductive structures, a plurality of interconnect pads and a handle structure 310. Semiconductor structure 300''' additionally includes a via joining layer 2310' (also sometimes referred to as a "second via joining layer" 2310'). Second surfaces of the first and second via joining layers 2310, 2310' may be smoothed or planarized (e.g., with an angstrom level and or nano level surface roughness) through a chemical mechanical planarization or polishing (CMP) process for example.

Figure 6E:
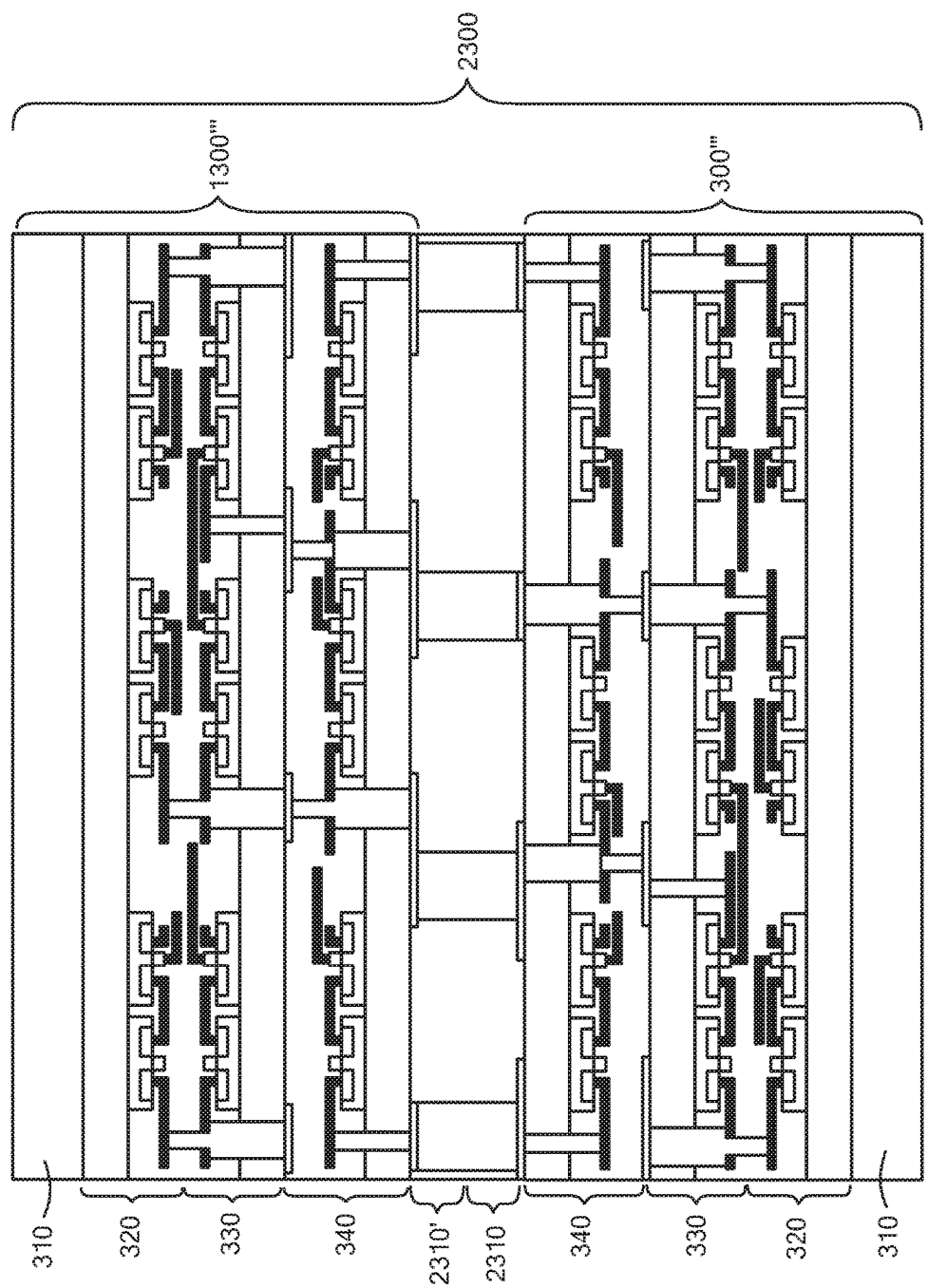

Referring now to FIG. 6E, an example semiconductor device 2300 as may be provided in an example method for fabricating a multi-layer semiconductor device including at least two semiconductor structures (e.g., semiconductor structures 300''' and 1300''') in accordance with the concepts, systems, circuits and techniques sought to be protected herein is shown. Here, an optically transparent silicon 310 having a thickness between about ten micron and about twenty micron (or less) can be prepared by polishing and/or selective etching of the silicon 310.

In the example method, the second surface of the first via joining layer 2310 is aligned with the second surface of the second via joining layer 2310' such that second surfaces of the first and second via joining layers 2310, 2310' are substantially parallel to each other and spaced apart from each other by a predetermined separation distance. Additionally, the second surface of the first via joining layer 2310 is aligned with the second surface of the second via joining layer 2310' such that the conductive structures in the first via joining layer 2310 are aligned with the conductive structures in the second via joining layer 2310'.

Additionally, in the example method, the predetermined separation distance is decreased from a first distance to a second, lower distance such second surfaces of the first and second via joining layers 2310, 2310' are substantially in contact with each other. The second distance may be about zero μm such that the second surfaces of the first and second via joining layers 2310, 2310' are physically in contact with each other prior to being coupled together.

Further, in the example method, the second surface of the first via joining layer 2310 is coupled to the second surface of the second via joining layer 2310' such that the conductive structures in the first and second via joining layers 2310, 2310' are electrically coupled to each other to form one or more electrical connections between the first and second semiconductor structures 300''', 1300''', and to form the multi-layer semiconductor device 2300. The electrical connections may, for example, be formed through a reflow process in which a conductive fusible metal (not shown) disposed between second surfaces of first and second via joining layers 2310, 2310' is subjected to controlled thermal energy, which melts one or more portions of first and second via joining layers 2310, 2310' together. The conductive fusible metal may be part of one or more of first and second via joining layers 2310, 2310'. In one embodiment, the fusible metal melts during a bonding or a post bonding annealing step and reacts with high CTE metal and/or other metals (e.g., Cu, Ag, Au) of via joining layers 2310, 2310' to create a higher melting fusible alloy and/or solid solution. Thus, it is possible to shift a melting point of the fusible metal and create more reliable interconnect through first and second via joining layers 2310, 2310'.

Figure 6F:
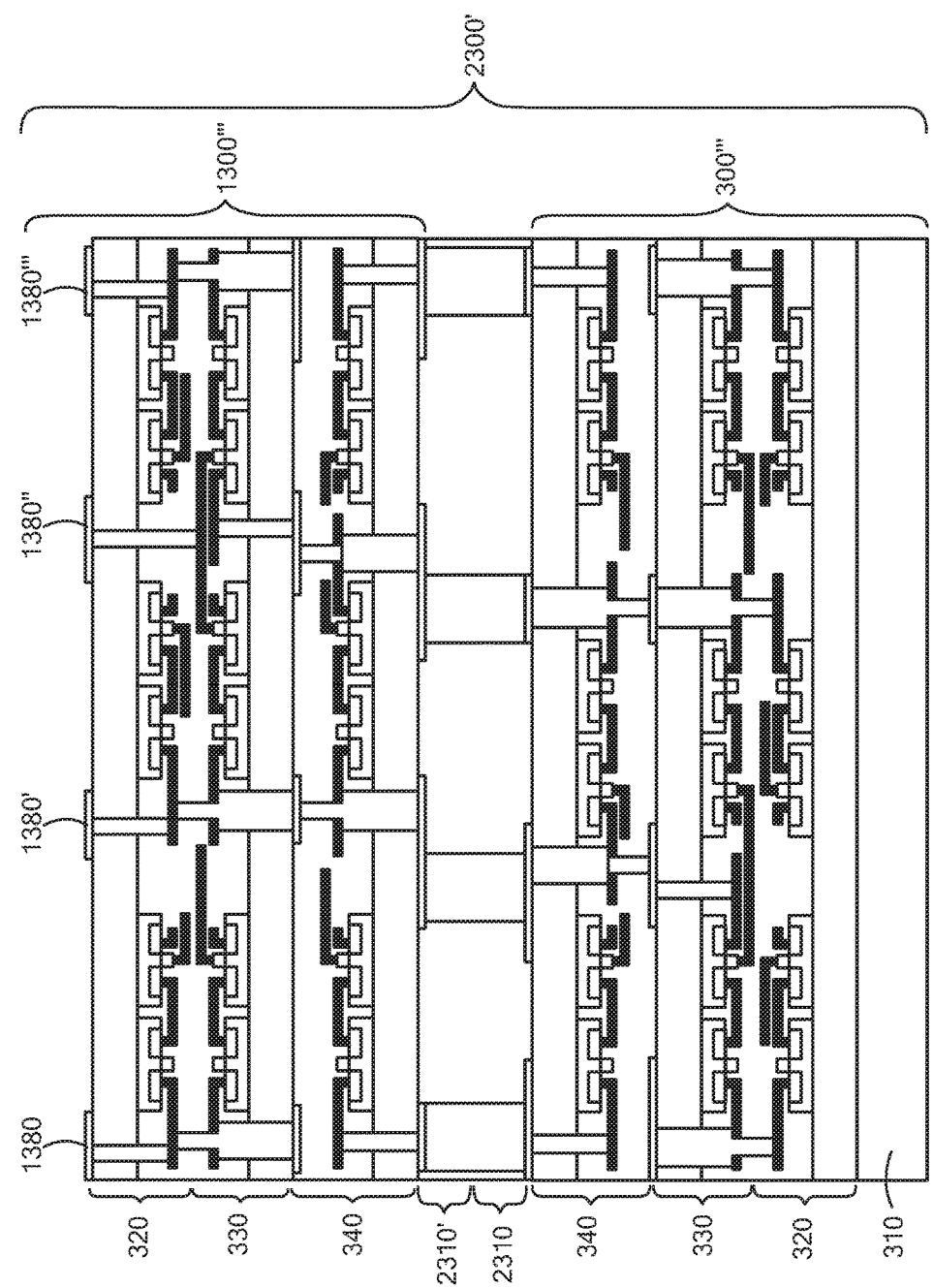

Referring now to FIG. 6F, an example multi-layer semiconductor device 2300' similar to the semiconductor structure of FIG. 6E is shown. Here, however, the handle structure on the second semiconductor structure 1300''' has been removed and the second surface of the multi-layer semiconductor device 2300' includes a plurality of interconnect pads 1380, 1380', 1380'', 1380'''. Interconnect pads 1380, 1380', 1380'', 1380''' have first and second opposing surface with a first surface of the interconnect pads 1380, 1380', 1380'', 1380''' disposed over or beneath the second surface of the multi-layer semiconductor device 2300'. The interconnect pads 1380, 1380', 1380'', 1380''' are electrically coupled to select ones of the electrical connections in the multi-layer semiconductor device 2300'. Additional semiconductor structures (i.e., third, fourth, and fifth semiconductor structures and so on) and/or additional multi-layer semiconductor devices can be added to the second surface of the multi-layer semiconductor device 2300' through further via joining layers, for example.

In some embodiments, one or more of the semiconductor structures of multi-layer semiconductor device 2300' of FIG. 6F and one or more of the semiconductor structures of FIGS. 1-6E discussed above may include or be provided as part of a multi-layer semiconductor structure, for example, such as the types described in any of U.S. Pat. Nos. 7,064,055; 7,067,909; and 7,307,003 all of which are assigned to the assignee of the present application and incorporated herein by reference in their entireties.

While the above figures illustrate various semiconductor structures and multi-layer semiconductor devices including a certain number of dies, interconnects, substrates, IC devices, components and the like, the concepts, systems, circuits and techniques disclosed herein may be applied to semiconductor structures and devices including any number of dies, interconnects, substrates, IC devices, components and the like. Conversion of via last to via first allows for additional metal layers multiple device layers are stacked on top of each other, as shown in FIG. 6, for example. "n" number of semiconductor structures (e.g., 300, 300', shown in FIG. 3B) may be attached with each other by conversion of via last to via first approach, each semiconductor structure (300, 300') having "m" number of device layers (e.g., 320, 330, 340, shown in FIG. 3) attached with each other by oxide bonding (e.g., by via last approach).

Total additional metal layers after bonding will be=n(m−1)+(n−1)=nm−n+n−1=nm−1

Example 1

Two (n=2) semiconductor structure (300, 300'), each having 3 (m=3) device layers.
Total additional metal layers: 2×3−1=5

Example 2

Five (n=5) semiconductor structure (300, 300'), each having 3 (m=3) device layers.
Total additional metal layers: 5×3−1=14

Figure 7:
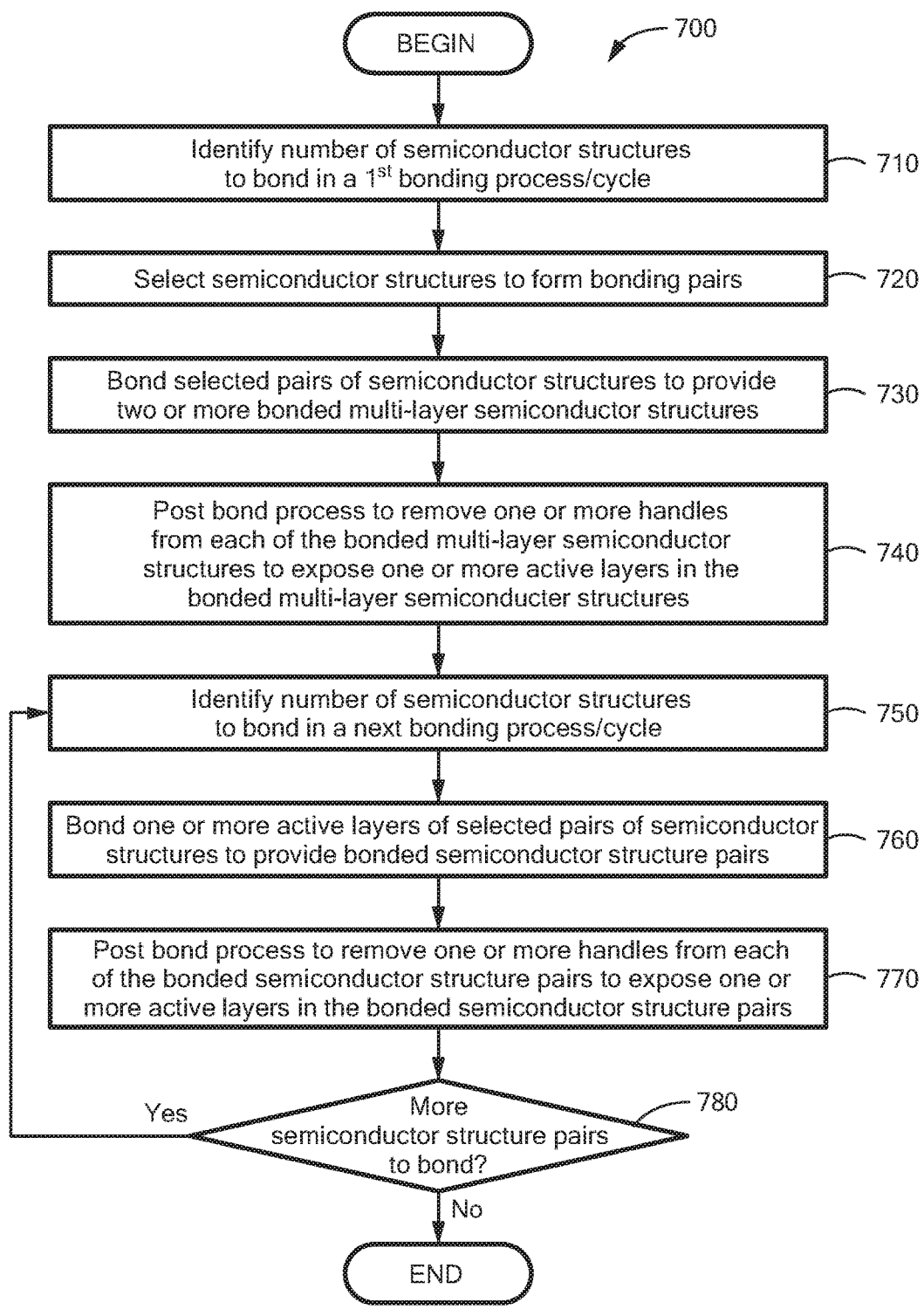
FIG. 7 is a flowchart illustrating an example method for fabricating a multi-layer semiconductor structure in accordance with an embodiment of the disclosure.
Figure 8:
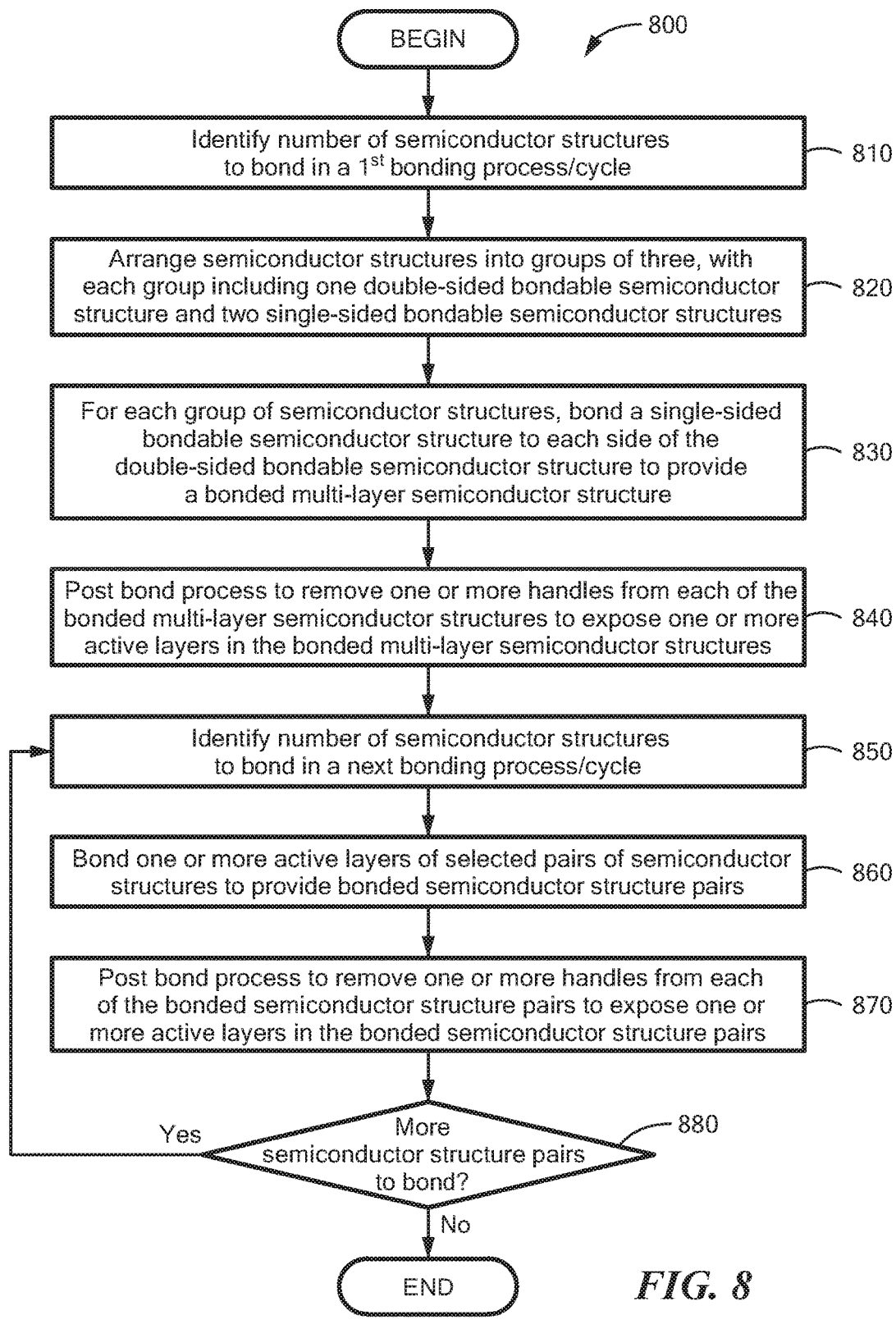
FIG. 8 is a flowchart illustrating another example method for fabricating a multi-layer semiconductor structure in accordance with an embodiment of the disclosure.

Referring to FIGS. 7 and 8, several flowcharts (or flow diagrams) illustrating example methods 700, 800 for fabricating multi-layer semiconductor structures (e.g., 900, shown in FIG. 9) from a plurality of semiconductor structures (e.g., 910 and 920, shown in FIG. 9) are shown. The methods 700, 800 may, for example, be implemented in semiconductor manufacturing equipment (e.g., semiconductor alignment and bonding devices) used for fabricating the multi-layer semiconductor structures, such as those shown in FIGS. 9-19.

Rectangular elements (typified by element 710 in FIG. 7), as may be referred to herein as "processing blocks," may represent computer software instructions or groups of instructions (e.g., as may be executed by a processor of semiconductor manufacturing equipment). Diamond shaped elements (typified by element 780 in FIG. 7), as may be referred to herein as "decision blocks," represent computer software instructions, or groups of instructions, which affect the execution of the computer software instructions represented by the processing blocks. The processing blocks and decision blocks can represent steps performed by functionally equivalent circuits such as a digital signal processor circuit or an application specific integrated circuit (ASIC).

The flow diagrams do not depict the syntax of any particular programming language. Rather, the flow diagrams illustrate the functional information one of ordinary skill in the art requires to fabricate circuits or to generate computer software to perform the processing required of the particular apparatus. It should be noted that many routine program elements, such as initialization of loops and variables and the use of temporary variables are not shown. It will be appreciated by those of ordinary skill in the art that unless otherwise indicated herein, the particular sequence of blocks described is illustrative only and can be varied. Thus, unless otherwise stated, the blocks described below are unordered; meaning that, when possible, the blocks can be performed in any convenient or desirable order including that sequential blocks can be performed simultaneously and vice versa.

As will become apparent from the description herein below, a result of the methods 700, 800 may be a reduction in a number of steps required to fabricate multi-layer semiconductor structures in comparison to conventional techniques. Consequently, there may be a reduction in time required to fabricate the multi-layer semiconductor structures in comparison to conventional techniques. Such may, for example, increase yield of semiconductor manufacturing equipment used to fabricate the multi-layer semiconductor structures.

Which method (e.g., 700 or 800), or combination of methods (e.g., 700 and 800), is/are most suitable for fabricating a multi-layer semiconductor structure according to disclosure may be based upon a number of factors. These factors may include a number of semiconductor structures to be bonded in fabricating the multi-layer semiconductor structures (e.g., three or more semiconductor structures), whether the semiconductor structures are single-sided bondable semiconductor structures or double-sided bondable semiconductor structures (as defined below), and a number of single-sided bondable semiconductor structures versus double-sided bondable semiconductor structures.

These methods may be used to reduce a number of bonding cycles that an individual semiconductor structure (e.g., "sensitive" devices) has to go through in fabricating a multi-layer semiconductor structure, e.g., thereby protecting the individual semiconductor structure. By reducing the number bonding cycles for an individual semiconductor structure (e.g., a "sensitive" device and/or an "expensive" device), it is possible to maximize yield and/or reduce fabrication cost of a multi-layer semiconductor structure fabricated using the semiconductor structure.

Figure 17:
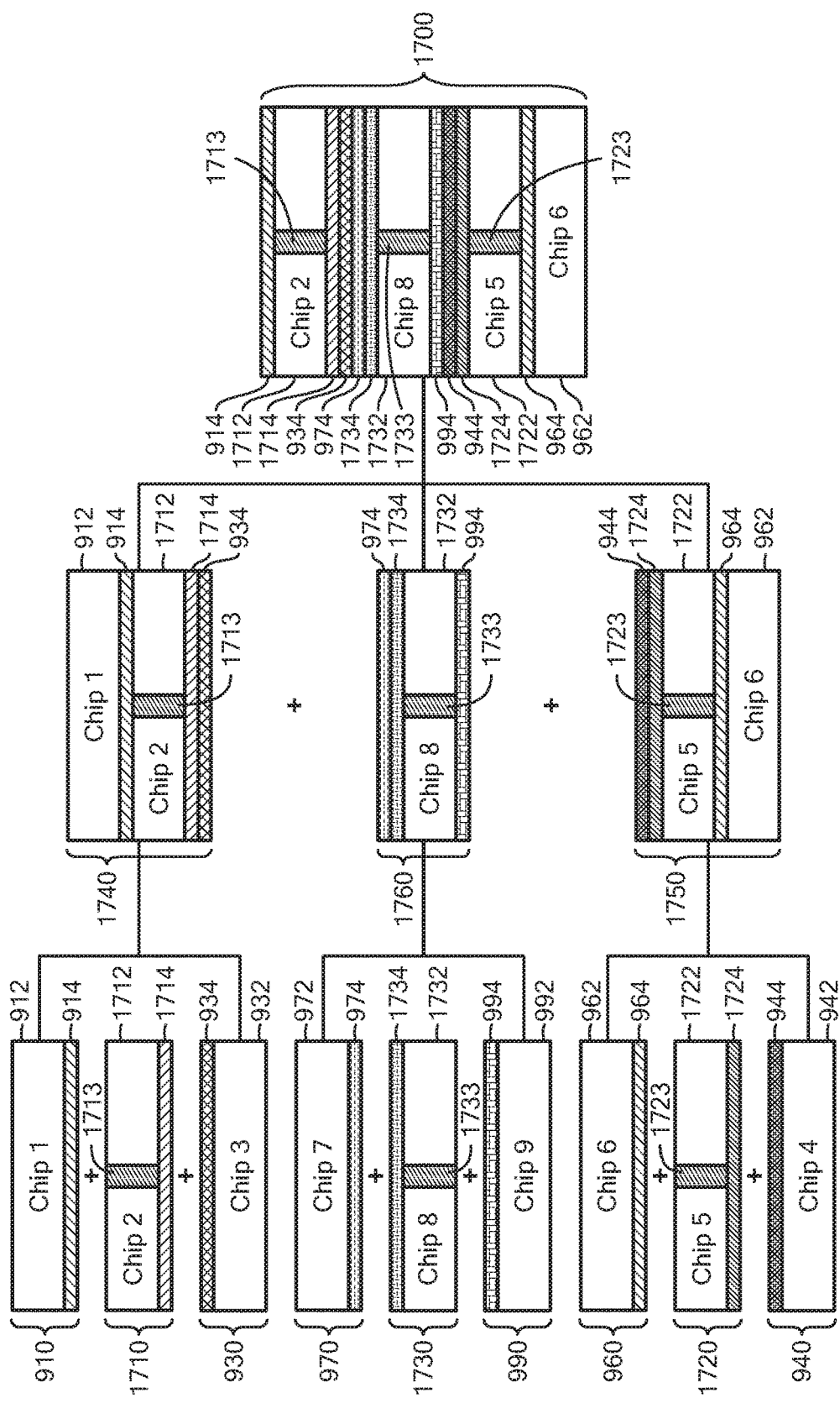
FIGS. 17-19 are block diagrams of example semiconductor structures as may be provided in accordance with various embodiments of the method of FIG. 8, for example.
Figure 18:
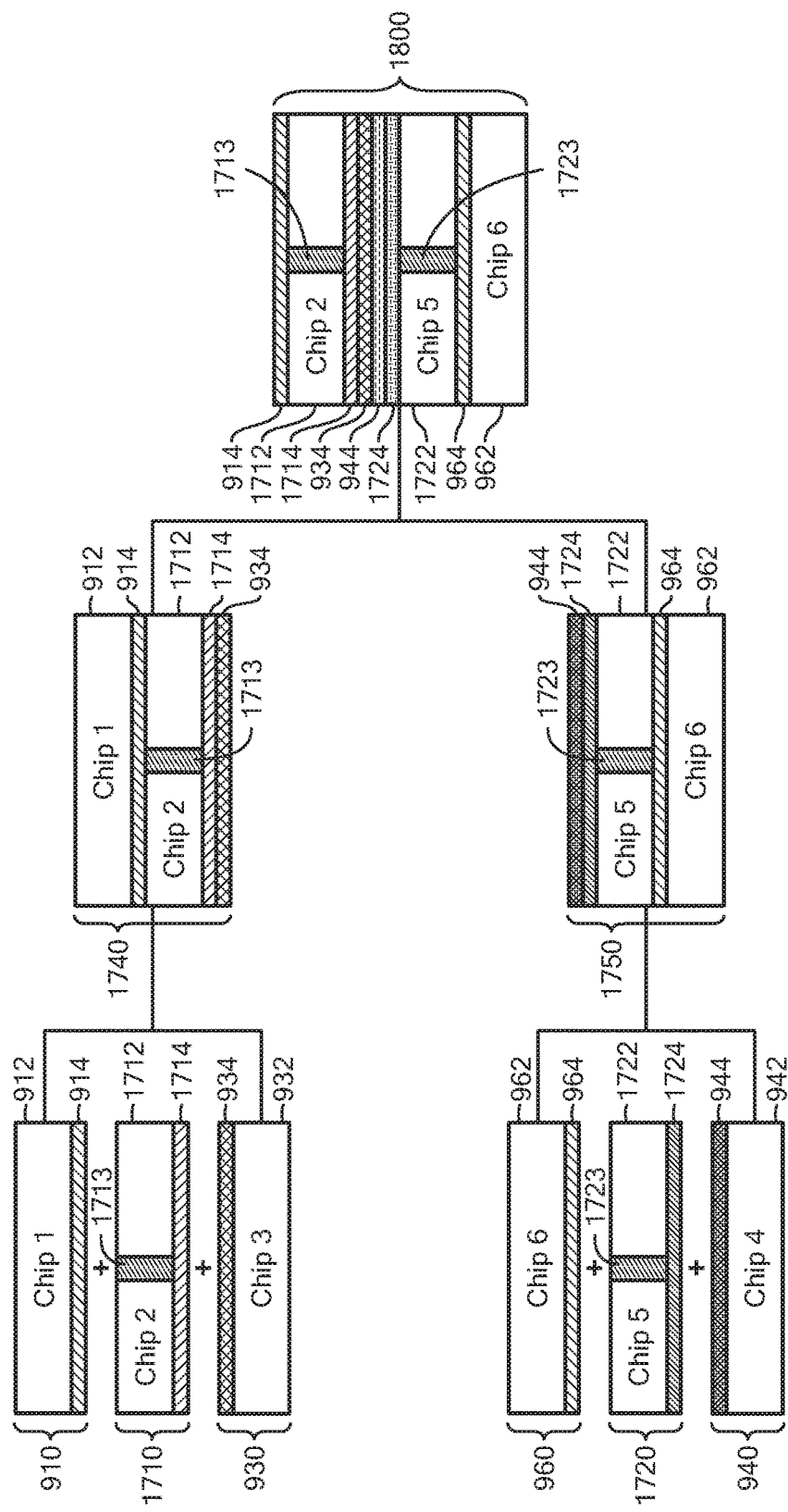
Figure 19:
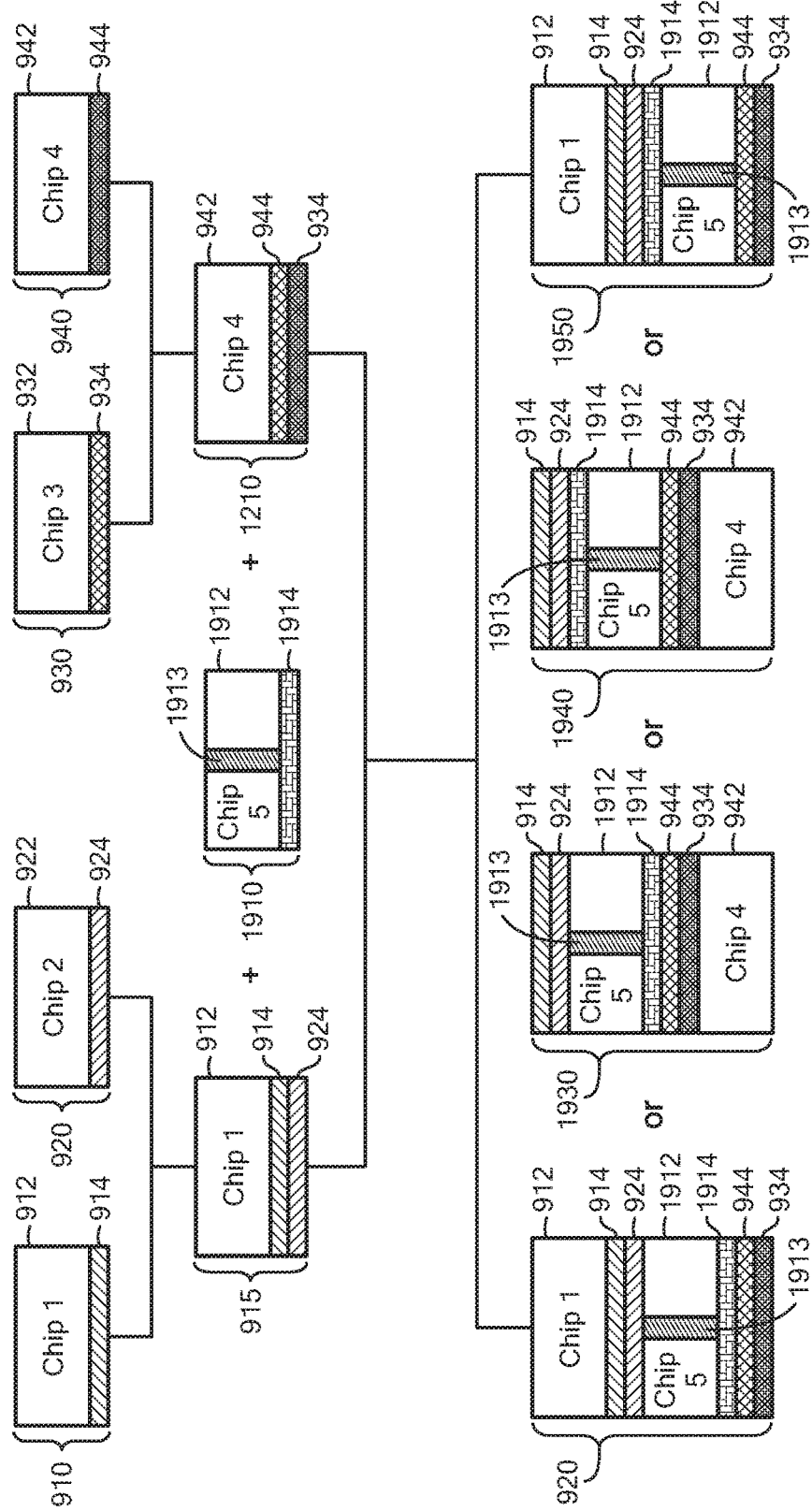

In one embodiment, method 800 is, for example, more suitable than method 700 for fabricating multi-layer semiconductor structures provided from a substantial number of semiconductor structures (e.g., six or more semiconductor structures), as shown in FIGS. 17-19. Such may be due to the semiconductor structures being arranged into groups of three semiconductor structures during at the least the first bonding cycle in method 800, with each group of three semiconductor structures bonded together at substantially a same time in the first bonding cycle (e.g., of a plurality of bonding cycles). In contrast, in method 700, the semiconductor structures are arranged into pairs of semiconductor structures (i.e., bonding pairs, as described further below) in each bonding cycle, with each semiconductor structure pair bonded together at substantially a same time in the bonding cycle. For fabricating multi-layer semiconductor structures including just a few semiconductor structures, method 700 may, for example, be equally suitable as method 800.

In embodiments, method 800 requires at least one single step double-sided bondable semiconductor structure, with each side of the semiconductor structure bonded to another semiconductor structure (either a single-sided bondable semiconductor structure or a double-sided bondable semiconductor structure) substantially simultaneously in a single bonding step.

As illustrated in FIG. 7, an example method 700 (sometimes referred to herein as "Embodiment 1") for fabricating a multi-layer semiconductor structures (e.g., 900, shown in FIG. 9) from a plurality of semiconductor structures (e.g., 910, 920, 930, 940, 950 and 960, shown in FIG. 9) begins at block 710. At block 710, a number (e.g., an even number) of semiconductor structures to bond in a first bonding process/cycle (e.g., of a plurality of bonding processes/cycles) is identified. Such identification may, for example, occur in a processor of the semiconductor manufacturing equipment used for fabricating the multi-layer semiconductor structures, by a user fabricating the multi-layer semiconductor structure. Additionally, such identification may include selecting the number of semiconductor structures to bond in the first bonding cycle based upon a total number of semiconductor structures (e.g., six semiconductor structures) to be bonded in forming the multi-layer semiconductor structures.

The identification may also include selecting the number of semiconductor structures to reduce, or ideally minimize, a number of bonding cycles to which an individual semiconductor structure (e.g., 910) may be subject during fabrication of the multi-layer semiconductor structures (e.g., 900). For example, for a multi-layer semiconductor structures to be fabricated from four semiconductor structures, it may be desirable to select the number of semiconductor structures to bond in the first bonding cycle such that the maximum number of bonding cycles that an individual semiconductor structure experiences is two. Additionally, for a multi-layer semiconductor structures to be fabricated from six semiconductor structures, it may be desirable to select the number of semiconductor structures to bond in the first bonding cycle such that the maximum number of bonding cycles that an individual semiconductor structure experiences is three. Further examples of reducing or minimizing the number of bonding cycles that an individual semiconductor structure experiences are described below in connection with the chart shown in FIG. 20, for example At block 720, the semiconductor structures identified at block 710 are selected to form bonding pairs. The bonding pair selection may comprise selecting semiconductor structures based on one or more characteristics of the semiconductor structures. These characteristics may include surface properties of the semiconductor structures (e.g., whether the semiconductor structures are single-sided bondable semiconductor structures or double-sided bondable semiconductor structures), properties (or components) of the active layers of the semiconductor structures, and functional characteristics of devices on a semiconductor structure. Each semiconductor structure has first and second opposing surfaces, and includes at least one active (or "functional") layer disposed between the first and second surfaces. The at least one active layer may be the same as or similar to the device layers described in connection with figures above (e.g., 124, shown in FIG. 1, or 200 shown in FIG. 2).

The semiconductor structures may also include at least one insulating layer in some embodiments (e.g., in embodiments in which the semiconductor structures are fabricated using Silicon-On-Insulator (SOI) fabrication techniques). The at least one insulating layer may be the same as or similar to the insulating layers described in connection with figures above (e.g., 122, shown in FIG. 1). In one embodiment, the semiconductor structures may be fabricated using SOI or bulk complementary metal-oxide semiconductor (CMOS) fabrication techniques.

At least one semiconductor structure in each bonding pair selected at block 720 has two bondable sides or surfaces (i.e., is a double-sided bondable semiconductor structure). A double-sided bondable semiconductor structure may, for example, have a bondable oxide material or layer (e.g., a thermal or self-bondable oxide) disposed over both bondable surfaces of the semiconductor structure. In one embodiment, one semiconductor structure in each bonding pair is a single-sided bondable semiconductor structure, having a single bondable surface or side. Additionally, in one embodiment, both semiconductor structures in each bonding pair are double-sided bondable semiconductor structures.

At block 730, selected pairs of the semiconductor structures are bonded in a first bonding process/cycle (also referred to herein as "a first bonding cycle") to provide two or more bonded multi-layer semiconductor structures. Each of the bonded multi-layer semiconductor structures has at least one handle and two or more active layers.

The first bonding cycle may include depositing or otherwise providing a bondable oxide material or layer on at least one surface (e.g., a bonding surface) of the semiconductor structures prior to bonding the semiconductor structure pairs. Additionally, the first bonding cycle may include using chemical-mechanical planarization (CMP) to planarize at least one surface (e.g., a bonding surface) of the semiconductor structures (e.g., before and/or after deposition of the oxide material or layer). Further, the first bonding cycle may include precision aligning of the semiconductor structures (e.g., to sub-micro accuracy) using one or more infrared cameras of the semiconductor manufacturing device used to bond the semiconductor structures.

The first bonding cycle may also include bonding the semiconductor structures by initiating contact at a center point on bonding surfaces of the semiconductor structures and subsequently bonding remaining portions of the bonding surfaces. Additionally, the first bonding cycle may further include forming one or more electrical connections between the active layers in the bonded multi-layer semiconductor structures (e.g., using via last and or via first techniques). In one example embodiment, the first bonding cycle is similar to the bonding process described above in connection with FIG. 1 in which semiconductor structures 100 and 1100 are bonded to produce multi-layer semiconductor structure (or device) 2100. In another example embodiment, in the first bonding cycle the semiconductor structures follow a surface preparation and bonding process similar to that which is described above in connection with FIGS. 6-6F.

At block 740, a post bond process is applied to remove one or more handles from each of the bonded multi-layer semiconductor structures to substantially expose selected surfaces of the active layers in the bonded multi-layer semiconductor structures. The post bond process may include a combination of grinding and wet chemical etching of the handles. Additionally, the post bond process may include other techniques well known to those of ordinary skill in the art. For example, the exposed surfaces of the active layers may go through chemical mechanical polishing (CMP) and subsequent annealing in presence of hydrogen and/or nitrogen one or more times such that the surfaces are ready to be bonded again.

At block 750, a number of semiconductor structures (e.g., 915, 930, 940, 955, shown in FIG. 9) to bond in a next, here second, bonding process/cycle (also referred to herein as "a second bonding cycle") are identified. Similar to the identification occurring in block 710, the identification at block 750 may occur in a processor of a semiconductor manufacturing device used for fabricating the multi-layer semiconductor structures. Additionally, similar to the identification occurring in block 710, the identification may include selecting the number of semiconductor structures to minimize a number of bonding cycles which an individual semiconductor structure may be subject to during fabrication of the multi-layer semiconductor structure.

At block 760, selected pairs of the semiconductor structures are bonded in a second bonding cycle to provide bonded multi-layer semiconductor structure. In one embodiment, the second bonding cycle is the same as or similar to the first bonding cycle performed at block 730. In one example embodiment, the second bonding cycle is similar to the bonding process described above in connection with FIG. 1 in which semiconductor structures 100 and 1100 are bonded to produce multi-layer semiconductor structure (or device) 2100. In another example embodiment, in the second bonding cycle the semiconductor structures follow a surface preparation and bonding process similar to that which is described above in connection with FIGS. 6-6F.

At block 770, a second post bond process is applied to remove one or more handles from each of the bonded multi-layer semiconductor structure pairs such that selected surfaces of the active layers in the bonded multi-layer semiconductor structure pairs are substantially exposed. In one embodiment, the second post bond process is the same as or similar to the first post bond process performed at block 740. Additionally, in one embodiment, the second post bond process may additionally include forming one or more through silicon vias (TSVs) in selected remaining handles of the bonded multi-layer semiconductor structure pairs. These TSVs (e.g., 1301, shown in FIG. 13) may, for example, be electrically coupled to one or more electrical connections formed in the active layers of the bonded multi-layer semiconductor structure pairs.

At block 780, it is determined whether there are any more semiconductor structure pairs to bond. If it is determined that there are more semiconductor structure pairs to bond, the method 700 returns to block 750 and blocks 750, 760, 770 and 780 are repeated until there are no more semiconductor structure pairs to bond. Alternatively, if it is determined that there are no more semiconductor structure pairs to bond, the method 700 may end. The method 700 ending may, for example, be indicative of completion of the bonding process and of the multi-layer semiconductor structure (e.g., 900) being formed. The method 700 may be repeated (e.g., in response to a processor in the semiconductor manufacturing equipment receiving or generating a control signal) for bonding one or more additional semiconductor structures to the multi-layer semiconductor structure.

Example multi-layer semiconductor structures fabricated according to method 700 of FIG. 7 are shown in FIGS. 9-16, for example.

Another example method of fabricating a multi-layer semiconductor structure according to the disclosure is shown in FIG. 8.

As illustrated in FIG. 8, another example method 800 (sometimes referred to herein as "Embodiment 2") for fabricating a multi-layer semiconductor structure (e.g., 1700, shown in FIG. 17) from a plurality of semiconductor structures (e.g., 910, 930, 940, 960, 970, 990, 1710, 1720 and 1730, shown in FIG. 17) begins at block 810. At block 810, a number of semiconductor structures to bond in a first bonding process/cycle (e.g., of a plurality of bonding processes/cycles) is identified. Such identification may include selecting the number of semiconductor structures to bond in the first bonding process/cycle (also referred to herein as "a first bonding cycle") based upon a total number of semiconductor structures (e.g., nine semiconductor structures) to be bonded in forming the multi-layer semiconductor structure. Additionally, such identification may include selecting the number of semiconductor structures to minimize a number of bonding cycles which an individual semiconductor structure (e.g., 910) may be subject to during fabrication of the multi-layer semiconductor structure.

At block 820, the semiconductor structures identified at block 810 are arranged into groups of three, with each group including one single step double-sided bondable semiconductor structure (e.g., 1710, shown in FIG. 17) and two single-sided bondable semiconductor structures (e.g., 910 and 930, shown in FIG. 17). The double-sided bondable semiconductor structure is sometimes referred to herein as a "single step double-sided bondable semiconductor structure" since both bondable sides of the semiconductor structure may be bonded to another semiconductor structures, as will be further described below. Block 820 is in contrast to block 720 in method 700 in which the semiconductor structures are grouped into pairs.

Each semiconductor structure in the group of three semiconductor structures at block 820 has first and second opposing surfaces, and includes at least one active (or "functional") layer disposed between the first and second surfaces. The single-sided bondable semiconductor structures may have an oxide material or layer (e.g., a thermal or self-bondable oxide) disposed over an associated bonding side (or surface) of the semiconductor structures (e.g., a first surface of the semiconductor structures). Additionally, the single step double-sided bondable semiconductor structure may have an oxide material or layer disposed over both bonding sides of the semiconductor structure (i.e., the first and second surfaces of the semiconductor structure). The double-sided bondable semiconductor structure may also include a through silicon via (e.g., 1713, shown in FIG. 17) extending between first and second surfaces of the handle of the semiconductor structure (e.g., for establishing electrical connections between active layers, as will be discussed).

At block 830, for each group of semiconductor structures, the two single-sided bondable semiconductor structures are bonded to each bondable side (or surface) of the single step double-sided bondable semiconductor structure in a first bonding cycle to form a bonded multi-layer semiconductor structure. Each bonded multi-layer semiconductor structure has at least two handles and three or more active layers.

The first bonding cycle may include using chemical-mechanical planarization (CMP) to planarize bonding surfaces of the semiconductor structures prior to bonding of the semiconductor structures. Additionally, the first bonding cycle may include precision aligning the semiconductor structures (e.g., to sub-micro accuracy) using one or more infrared cameras of the semiconductor manufacturing device used to bond the semiconductor structures. Further, the first bonding cycle may include bonding the semiconductor structures by initiating contact at a center point on bonding surfaces of the semiconductor structures and subsequently bonding remaining portions of the bonding surfaces.

The first bonding cycle may also include forming one or more electrical connections between the active layers in the bonded multi-layer semiconductor structures (e.g., using via last techniques). In one embodiment, the first bonding cycle is the same as or similar to the bonding cycle performed at block 730 or 760 (as described above in connection with FIG. 7).

At block 840, a post bond process is applied to remove one or more handles from each of the bonded multi-layer semiconductor structures such that selected surfaces of the active layers in the bonded multi-layer semiconductor structures are substantially exposed. Similar to the post bond process at block 740 in method 700, the post bond process at block 840 may include a combination of grinding and wet chemical etching of the handles.

At block 850, a number of semiconductor structures (e.g., 1740, 1750 and 1760, shown in FIG. 17) to bond in a next, here second, bonding process/cycle is identified. Similar to the identification occurring in block 810, the identification may include selecting the number of semiconductor structures to minimize a number of bonding cycles which an individual semiconductor structure may be subject to during fabrication of the multi-layer semiconductor structure.

At block 860, one or more active layers of selected pairs of the bonded multi-layer semiconductor structures are bonded in a second bonding process/cycle (also referred to herein as "a second bonding cycle") to provide bonded multi-layer semiconductor structure pairs. In one embodiment, the second bonding cycle is the same as or similar to the first bonding cycle performed at block 830. In one embodiment, the second bonding cycle is the same as or similar to the bonding cycle performed at block 730 or 760 (as described above in connection with FIG. 7).

At block 870, a second post bond process is applied to remove one or more handles from each of the bonded multi-layer semiconductor structure pairs such that selected surfaces of the active layers in the bonded multi-layer semiconductor structure pairs are substantially exposed. In one embodiment, the second post bond process is the same as or similar to the first post bond process performed at block 840. Additionally, in one embodiment, the second post bond process may additionally include forming one or more through silicon vias in selected remaining handles of the bonded multi-layer semiconductor structure pairs.

At block 880, it is determined whether there are any more semiconductor structure pairs to bond. If it is determined that there are more semiconductor structure pairs to bond, the method 800 returns to block 850 and blocks 850, 860, 870 and 880 are repeated until there are no more semiconductor structure pairs to bond. Alternatively, if it is determined that there are no more semiconductor structure pairs to bond, the method 800 may end. The method 800 ending may, for example, be indicative of completion of the bonding process and of the multi-layer semiconductor structure (e.g., 1700) being formed. The method 800 may be repeated (e.g., in response to a processor in the semiconductor manufacturing equipment receiving or generating a control signal) for bonding one or more additional semiconductor structures to the multi-layer semiconductor structure.

In one example alternative embodiment of method 800 (sometimes referred to herein as "Embodiment 3"), block 860 may be replaced with a block similar to block 820 in which the semiconductor structures identified at block 850 may be arranged into groups of three or more semiconductor structures, with each group including at least one double-sided bondable semiconductor structure and two single-sided bondable semiconductor structures. Additionally, in such alternative embodiment, block 860 may further be replaced with a block similar to block 830 in which for each group of semiconductor structures, a single-sided bondable semiconductor structure is bonded to each side of the double-sided bondable semiconductor structures to provide bonded multi-layer semiconductor structures. Further, block 870 may be replaced with a block in which it is determined whether there are more semiconductor structure groups to bond. It follows that in Embodiment 3, each bonding cycle comprises bonding groups of three or more semiconductor structures at a substantially same time.

In another example alternative embodiment of method 800 (sometimes referred to herein as "Embodiment 4"), block 860 may be replaced with a block which is a combination of block 720 of method 700 and block 820 of method 800. In particular, the block may include selecting semiconductor structures to form bonding pairs and arranging semiconductor structures into groups of three or more semiconductor structures for bonding in a next bonding process. In such alternative embodiment, the semiconductor structure pairs may be bonded in accordance with block 860 and a post bond process may be performed in accordance with block 870.

Additionally, the groups of semiconductor structures may be bonded in accordance with a block similar to block 820 and a post bond process may be performed in accordance with a block similar to block 840. It follows that the semiconductor structure pairs and the groups of semiconductor structures may be bonded in the next bonding process at a substantially same time in some embodiments. Additionally, a post bond process may be applied to the bonded semiconductor structures formed in the next bonding process at a substantially same time in some embodiments. In the above-described alternative embodiment, block 870 may also be replaced with a block in which it is determined whether there are more semiconductor structures (pairs and/or groups) to bond.

Further, in accordance with Embodiment 4, block 820 may be replaced by a block which is a combination of block 720 of method 700 and block 820 of method 800. In particular, the block may include selecting semiconductor structures to form bonding pairs in a first bonding process and arranging semiconductor structures into groups of three or more semiconductor structures for bonding in the first bonding process. In such alternative embodiment, the semiconductor structure pairs may be bonded in accordance with block 720 and a post bond process may be performed in accordance with block 730.

Additionally, the groups of semiconductor structures may be bonded in a bonding process in accordance with a block similar to block 820 and a post bond process may be performed in accordance with a block similar to block 840. It follows that semiconductor structure pairs and groups of semiconductor structures may be bonded in the first bonding process at a substantially same time in some embodiments. Additionally, a post bond process may be applied to the bonded semiconductor structures formed in the first bonding process at a substantially same time in some embodiments. It follows that in Embodiment 4, each bonding cycle comprises bonding semiconductor structure pairs and/or groups of three or more semiconductor structures at a substantially same time.

Example multi-layer semiconductor structures fabricated according to various embodiment of method 800 of FIG. 8 are shown in FIGS. 17-19, for example.

Referring now to FIGS. 9-19, example multi-layer semiconductor structures (e.g., 900, shown in FIG. 9) as may be fabricated according to method 700 and/or method 800 are shown. While the multi-layer semiconductor structures are illustrated as fabricated in a particular sequence of processes, it should be appreciated that the semiconductor structures may be fabricated in sequences other than that which is shown. Additionally, while a post bonding process which includes removal of one or more of the semiconductor structure handles (e.g., 912, shown in FIG. 9) and surface preparation for subsequent bonding and or circuitization of the semiconductor structures (e.g., 900, shown in FIG. 9) are not shown in FIGS. 9-19, in one example embodiment, the semiconductor structures shown in FIGS. 9-19 follow surface preparation for bonding or circuitization and a post bonding process as described in FIGS. 6-6F, for example. Additionally, in another example embodiment, the semiconductor structures shown in FIGS. 9-19 follow surface preparation for via first and or via last bonding. Further, in another example embodiment, the semiconductor structures shown in FIGS. 9-19 follow a post bonding process which includes thinning of a semiconductor structure handle to produce optically an transparent handle (e.g., such that the handle is between about 10-20 microns thick).

Figure 9:
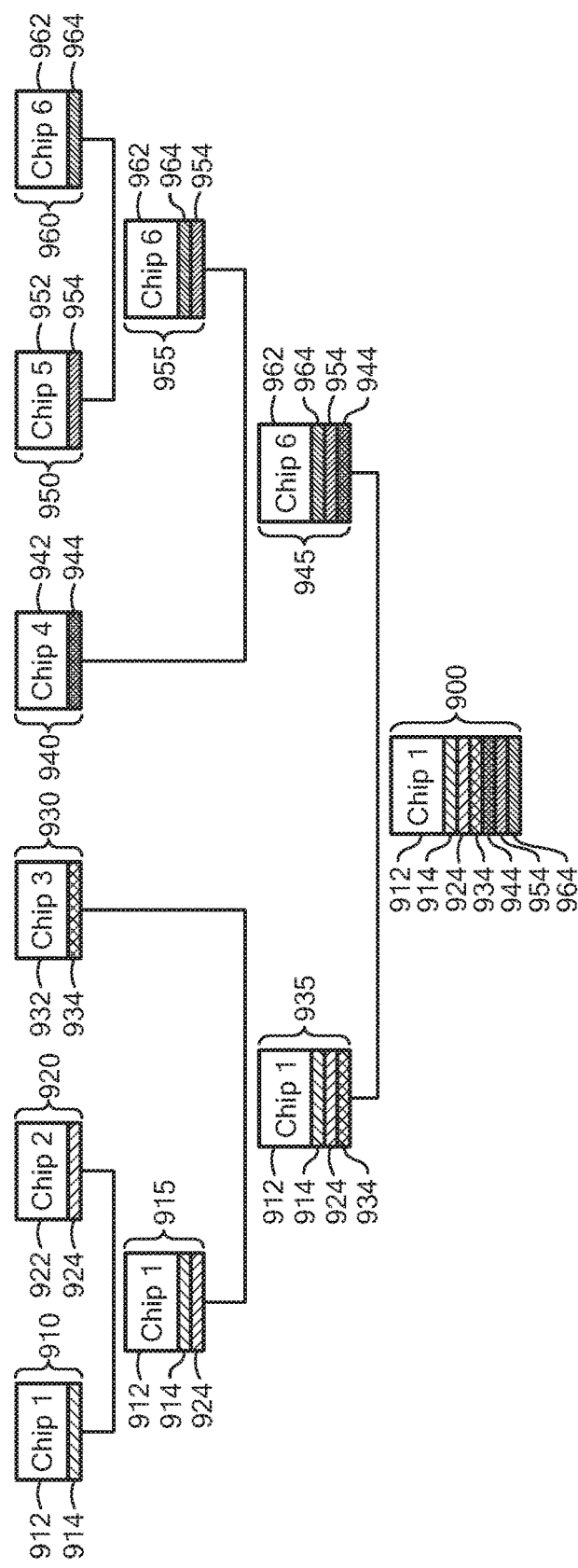
FIGS. 9-16 are block diagrams of example semiconductor structures as may be provided in accordance with the method of FIG. 7, for example.

Referring to FIG. 9, an example multi-layer semiconductor structure 900 (e.g., a three-dimensional (3D) integrated circuit (IC)) as may be fabricated according to method 700 of FIG. 7, for example, is shown. Semiconductor structure 900 is fabricated from a plurality of semiconductor structures (here, six semiconductor structures 910, 920, 930, 940, 950, 960), each of which has first and second opposing surfaces and includes a handle (e.g., 912) (labeled as "chip" in the figure) and at least one active layer (e.g., 914). The handle and the at least one active layer each have first and second opposing surfaces, with the first surface of the handle disposed over the second surface of the at least one active layer.

The handle may be provided from silicon (Si), silicon carbide (SiC) and/or sapphire as a few examples, and may be used for coupling each semiconductor structure to semiconductor manufacturing machinery for aligning and bonding the semiconductor structure to one or more other semiconductor structures.

Additionally, the at least one active layer, similar to device layers described in figures above (e.g., 124, shown in FIG. 1), includes one or more circuit components, devices and modules (e.g., resistors, capacitors, transistors, inductors, integrated circuits) (not shown) disposed between the first and second surfaces of the active layer. The circuit components, device, and modules may be electrically coupled to select electrical connections (not shown) and conductive planes (not shown) in the active layer (e.g., through one or more conductive structures, as discussed in figures above).

In the illustrated embodiment, multi-layer semiconductor structure 900 is fabricated in three bonding processes/cycles. In a first one of the bonding cycles, semiconductor structures 910, 920, 950 and 960 are identified as semiconductor structures to bond in the first bonding cycle (i.e., these semiconductor structures are bonded at the same time during a first bonding cycle). Semiconductor structures 910 and 920 are selected as a first bonding pair to bond in the first bonding cycle, with at least semiconductor structure 920 provided as a double-sided bondable semiconductor structure. Additionally, semiconductor structures 950 and 960 are selected as a second bonding pair to bond in the first bonding cycle, with at least semiconductor structure 960 provided as a double-sided bondable semiconductor structure. The first bonding pair (i.e., semiconductor structures 910 and 920) and the second bonding pair (i.e., semiconductor structures 950 and 960) are bonded (i.e., these semiconductor structures are bonded at substantially the same time during the first bonding cycle) to provide bonded multi-layer semiconductor structures 915 and 955, respectively.

Semiconductor structure 915 has first and second opposing surfaces and includes a handle 912 and active layers 914, 924. Additionally, semiconductor structure 955 has first and second opposing surfaces and includes handle 962 and active layers 954, 964. Handle 922 from semiconductor structure 920 may, for example, have been removed during a first post bond process such that at least one surface of active layer 924 is substantially exposed (e.g., for subsequent bonding). Similarly, handle 952 from semiconductor structure 950 may have been removed during the first post bond process such that at least one surface of active layer 954 is substantially exposed. One or more electrical connections may be formed between the active layers in semiconductor structures 915 and 915 during the first bonding cycle and/or the first post bond process using via last techniques, for example.

In a second one of the bonding cycles, semiconductor structures 915, 930, 940 and 955 are identified as semiconductor structures to bond in the second bonding cycle. Semiconductor structures 915 and 930 are selected as a first bonding pair to bond in the second bonding cycle, with at least semiconductor structure 915 provided as a double-sided bondable semiconductor structure. Additionally, semiconductor structures 940 and 955 are selected as a second bonding pair to bond in the second bonding cycle, with at least semiconductor structure 955 provided as a double-sided bondable semiconductor structure. The first bonding pair (i.e., semiconductor structures 915 and 930) and the second bonding pair (i.e., semiconductor structures 940 and 955) are bonded (i.e., these semiconductor structures are bonded at the same time during the second bonding cycle) to provide bonded multi-layer semiconductor structures 935 and 945, respectively.

Semiconductor structure 935 has first and second opposing surfaces and includes a handle 912 and active layers 914, 924, 934. Additionally, semiconductor structure 945 has first and second opposing surfaces and includes handle 962 and active layers 944, 954, 964. Handle 932 from semiconductor structure 930 may, for example, have been removed during a second post bond process such that at least one surface of active layer 934 is substantially exposed (e.g., for subsequent bonding). Similarly, handle 942 from semiconductor structure 940 may have been removed during the second post bond process such that at least one surface of active layer 944 is substantially exposed. In one embodiment, semiconductor structure 935 is the same as or similar to semiconductor structure 300 of FIG. 3. Additionally, in one embodiment, semiconductor structure 945 is the same as or similar to semiconductor structure 1300 of FIG. 3A.

In a third one of the bonding cycles (and in this illustrated embodiment, a last bonding cycle), semiconductor structures 935 and 945 are identified as semiconductor structures to bond in the third bonding cycle and are selected as a bonding pair. Semiconductor structures 945 and 935 may be bonded together using a via first process and handle 962 may be removed to provide bonded multi-layer semiconductor structure 900.

In one example embodiment, semiconductor structures 945 and 935 are bonded together in a bonding process which is similar to the bonding process described above in connection with FIG. 1 in which semiconductor structures 100 and 1100 are bonded to produce multi-layer semiconductor structure (or device) 2100. In another example embodiment, in the third bonding cycle the semiconductor structures 945 and 935 follow a surface preparation and bonding process similar to that which was described above in connection with FIGS. 6-6F. In another example embodiment, in the third bonding cycle the semiconductor structures 945 and 935 follow a surface preparation and bonding process similar to that which was described in connection with FIGS. 3-3B.

Semiconductor structure 900 has first and second opposing surfaces and includes handle 912 and six active layers (here, active 914, 924, 934, 944, 954 and 964). Handle 962 from semiconductor structure 945 may, for example, have been removed during a third post bond process such that at least one surface of active layer 964 is substantially exposed. Additional semiconductor structures (and active layers) may be bonded to multi-layer semiconductor structure 900. In one embodiment, semiconductor structure 900 is the same as or similar to semiconductor structure 2300 of FIG. 3B.

As illustrated above, the maximum number of bonding cycles that an individual semiconductor structure (e.g., 910) experiences in providing multi-layer semiconductor structure 900 is three bonding cycles. This is in contrast to conventional techniques in which an individual semiconductor structure may experience many more bonding cycles (and in some instances as many as five bonding cycles) in providing multi-layer semiconductor structures similar to semiconductor structure 900.

Figure 10:
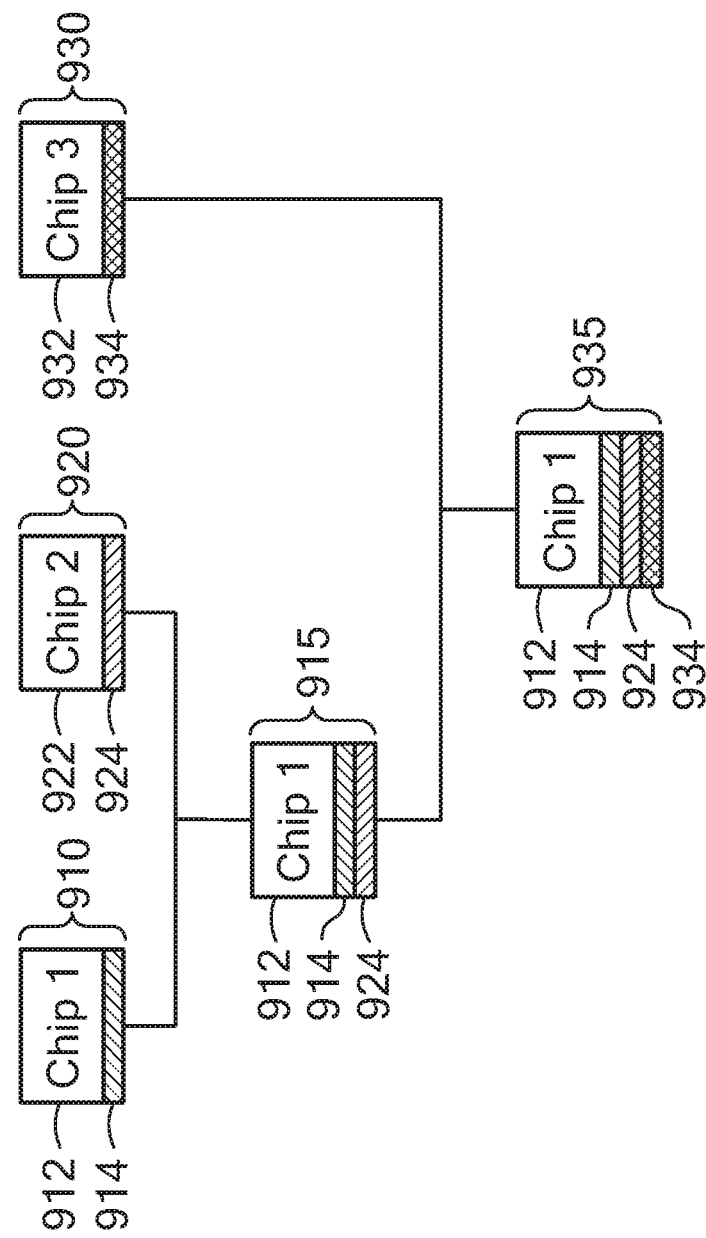

Referring to FIG. 10, in which like elements of FIG. 9 are shown having like reference designations, another example multi-layer semiconductor structure 935 fabricated from a plurality of semiconductor structures (here, three semiconductor structures 910, 920, 930) is shown.

In the illustrated embodiment, multi-layer semiconductor structure 935 is fabricated according to method 700 in two bonding processes/cycles. In a first one of the bonding cycles, semiconductor structures 910 and 920 are identified as semiconductor structures to bond in the first bonding cycle (i.e., these semiconductor structures are bonded at substantially the same time during a first bonding cycle). Additionally, semiconductor structures 910 and 920 are selected as a bonding pair to bond in the first bonding cycle, with at least semiconductor structure 920 provided as a double-sided bondable semiconductor structure. The bonding pair (i.e., semiconductor structures 910 and 920) is bonded (i.e., these semiconductor structures are bonded at substantially the same time during the first bonding cycle) to provide bonded multi-layer semiconductor structures 915. Semiconductor structure 915 has first and second opposing surfaces and includes handle 912 and active layers 914 and 924. Handle 922 from semiconductor structure 920 may, for example, been removed from semiconductor structure 915 (and semiconductor structure 920) during a first post bond process such that at least one surface of active layer 924 is substantially exposed (e.g., for subsequent bonding).

In a second one of the bonding cycles, semiconductor structures 915 and 930 are identified as semiconductor structures to bond in the second bonding cycle. Semiconductor structures 915 and 930 are selected as a bonding pair to bond in the second bonding cycle, with at least semiconductor structure 915 provided as a double-sided bondable semiconductor structure. The bonding pair (i.e., semiconductor structures 915 and 930) is bonded (i.e., these semiconductor structures are bonded at substantially the same time during the second bonding cycle) to provide bonded multi-layer semiconductor structure 935. Semiconductor structure 935 has first and second opposing surfaces and includes handle 912 and active layers 914, 924 and 934. Handle 932 from semiconductor structure 930 may, for example, have been removed from semiconductor structure 935 (and semiconductor structure 930) during a second post bond process such that at least one surface of active layer 934 is substantially exposed (e.g., for subsequent bonding).

Figure 11:
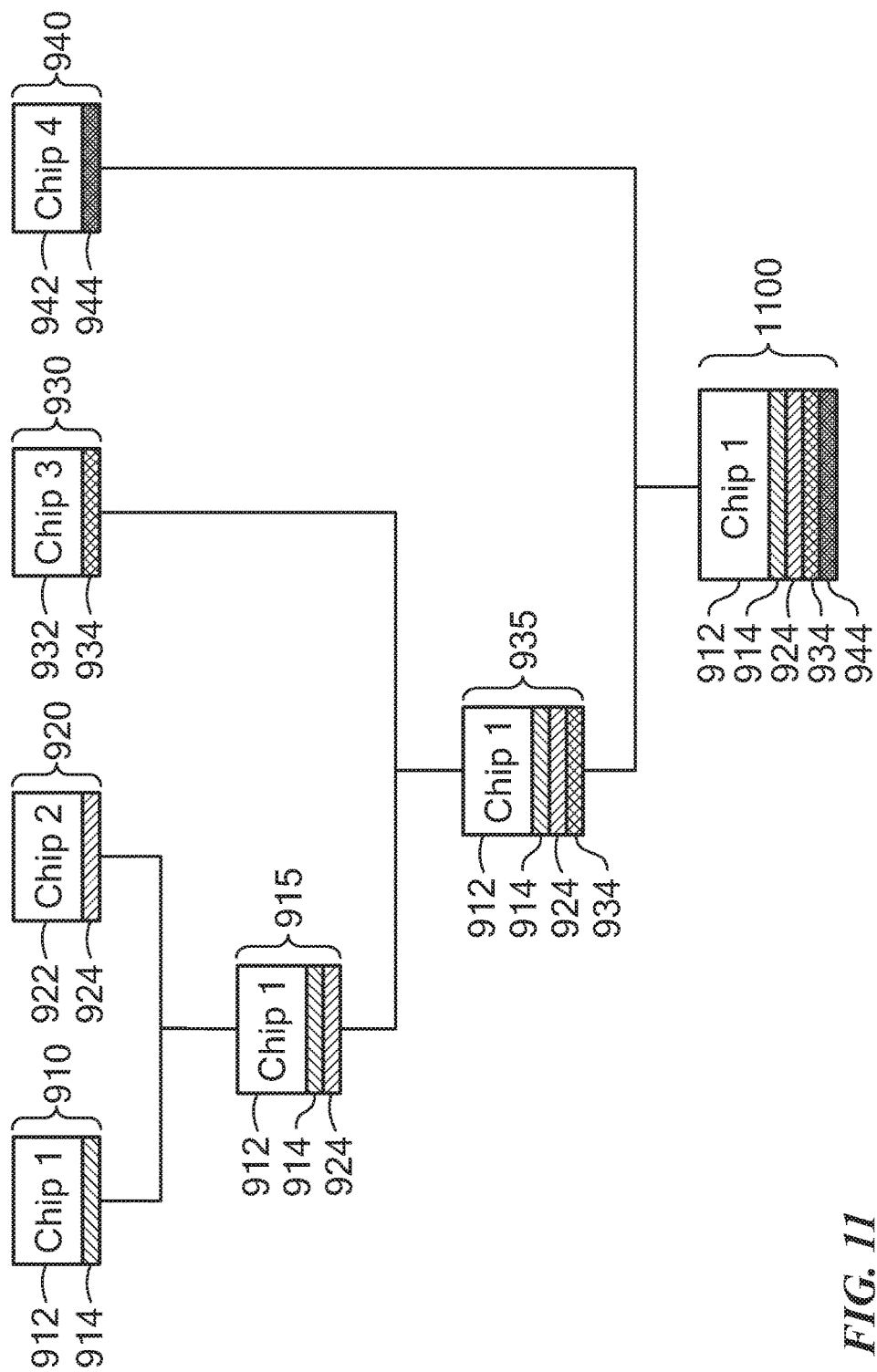

Referring to FIG. 11, another example multi-layer semiconductor structure 1100 fabricated from a plurality of semiconductor structures (here, four semiconductor structures 910, 920, 930, 940) is shown.

In the illustrated embodiment, multi-layer semiconductor structure 1100 is fabricated according to method 700 in three bonding processes/cycles. In a first one of the bonding cycles, similar to the first bonding cycle described above in connection with FIG. 10, semiconductor structures 910 and 920 are identified as semiconductor structures to bond in the first bonding cycle (i.e., these semiconductor structures are bonded at substantially the same time during a first bonding cycle). Additionally, semiconductor structures 910 and 920 are selected as a bonding pair to bond in the first bonding cycle, with at least semiconductor structure 920 provided as a double-sided bondable semiconductor structure. The bonding pair (i.e., semiconductor structures 910 and 920) is bonded to provide bonded multi-layer semiconductor structure 915. Semiconductor structure 915 has first and second opposing surfaces and includes handle 912 and active layers 914 and 924.

In a second one of the bonding cycles, similar to the second bonding cycle described above in connection with FIG. 10, semiconductor structures 915 and 930 are identified as semiconductor structures to bond in the second bonding cycle. Additionally, semiconductor structures 915 and 930 are selected as a bonding pair to bond in the second bonding cycle, with at least semiconductor structure 915 provided as a double-sided bondable semiconductor structure. The bonding pair (i.e., semiconductor structures 915 and 930) is bonded to provide bonded multi-layer semiconductor structure 935. Semiconductor structure 915 has first and second opposing surfaces and includes handle 912 and active layers 914 and 924. Additionally, semiconductor structure 935 has first and second opposing surfaces and includes handle 912 and active layers 914, 924 and 934.

In a third one of the bonding cycles, an additional semiconductor structure (here, semiconductor structure 940) is bonded to semiconductor structure 935 to provide multi-layer semiconductor structure 1100. In particular, in the third bonding cycle, semiconductor structures 935 and 940 are identified as semiconductor structures to bond in the third bonding cycle. Additionally, semiconductor structures 935 and 940 are selected as a bonding pair to bond in the third bonding cycle, with at least semiconductor structure 935 provided as a double-sided bondable semiconductor structure. The bonding pair (i.e., semiconductor structures 935 and 940) is bonded to provide bonded multi-layer semiconductor structure 1100. Semiconductor structure 1100 has first and second opposing surfaces and includes handle 912 and active layers 914, 924, 934 and 944.

Figure 12:
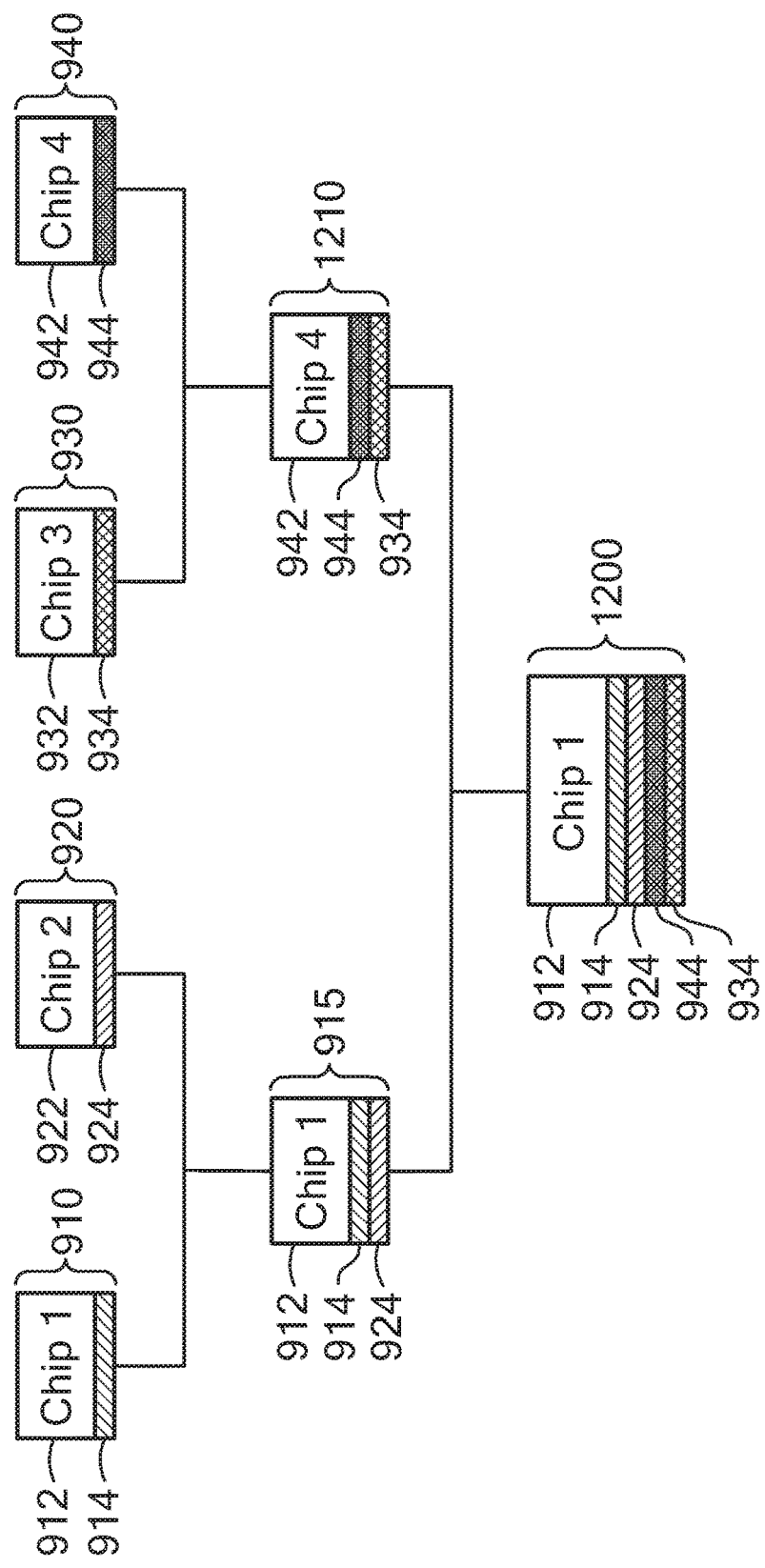

Referring to FIG. 12, another example multi-layer semiconductor structure 1200 fabricated from a plurality of semiconductor structures (here, four semiconductor structures 910, 920, 930, 940) is shown.

In the illustrated embodiment, multi-layer semiconductor structure 1200 is fabricated according to method 700 in two bonding processes/cycles. This is in contrast to multi-layer semiconductor structure 1100 of FIG. 11 which is fabricated from four semiconductor structures, but in three bonding cycles instead of two (e.g., due to arrangement of the active layers in the multi-layer semiconductor structure 1200). In a first one of the bonding cycles, semiconductor structures 910, 920, 930 and 940 are all identified as semiconductor structures to bond in the first bonding cycle (i.e., these semiconductor structures are bonded at substantially the same time during a first bonding cycle). Semiconductor structures 910 and 920 are selected as a first bonding pair to bond in the first bonding cycle, with at least semiconductor structure 920 provided as a double-sided bondable semiconductor structure. Additionally, semiconductor structures 930 and 940 are selected as a second bonding pair to bond in the first bonding cycle, with at least semiconductor structure 940 provided as a double-sided bondable semiconductor structure.

The first bonding pair (i.e., semiconductor structures 910 and 920) and the second bonding pair (i.e., semiconductor structures 930 and 940) are bonded (i.e., these semiconductor structures are bonded at substantially the same time during the first bonding cycle) to provide bonded multi-layer semiconductor structures 915 and 1210, respectively. In one example embodiment, the first bonding pair (i.e., semiconductor structures 910 and 920) and the second bonding pair (i.e., semiconductor structures 930 and 940) are bonded using a via last bonding process to provide bonded multi-layer semiconductor structures 915 and 1210, respectively.

Semiconductor structure 915 has first and second opposing surfaces and includes handle 912 and active layers 914, 924. Additionally, semiconductor structure 1210 has first and second opposing surfaces and includes handle 942 and active layers 934, 944. Handle 922 from semiconductor structure 920 may, for example, been removed from semiconductor structure 935 (and semiconductor structure 920) during a first post bond process such that at least one surface of active layer 924 is substantially exposed (e.g., for subsequent bonding). Similarly, handle 932 from semiconductor structure 930 may have been removed from semiconductor structure 1210 (and semiconductor structure 930) during the first post bond process such that at least one surface of active layer 934 is substantially exposed.

In a second one of the bonding cycles, semiconductor structures 915 and 1210 are identified as semiconductor structures to bond in the second bonding cycle (i.e., these semiconductor structures are bonded at substantially the same time during the second bonding cycle). Additionally, semiconductor structures 915 and 1210 are selected as a bonding pair to bond in the second bonding cycle, with at least semiconductor structure 915 provided as a double-sided bondable semiconductor structure. The bonding pair (i.e., semiconductor structures 915 and 1210) is bonded to provide bonded multi-layer semiconductor structure 1200. Semiconductor structure 1200 has first and second opposing surfaces and includes handle 912 and active layers 914, 924, 934 and 944.

In one example embodiment, semiconductor structures 915 and 1210 are bonded together in a bonding process which is similar to the bonding process described above in connection with FIG. 1 in which semiconductor structures 100 and 1100 are bonded to produce multi-layer semiconductor structure (or device) 2100. In another example embodiment, in the third bonding cycle the semiconductor structures 915 and 1210 follow a surface preparation and bonding process similar to that which was described above in connection with FIGS. 6-6F. In another example embodiment, in the third bonding cycle the semiconductor structures 915 and 1210 follow a surface preparation and bonding process similar to that which was described in connection with FIGS. 3-3B. Further, in one example embodiment, the bonding pair (i.e., semiconductor structures 915 and 1210) is bonded using a via first bonding process and a post bonding process to provide a bonded multi-layer semiconductor structure 1200.

As illustrated above, there are several ways to fabricate a multi-layer semiconductor structure from a same plurality of semiconductor structures (in FIGS. 11 and 12, four semiconductor structures) according to the disclosure. In FIG. 12, the active layers or device layers of structure 1200 are substantially the same as structure 1100 in FIG. 11. Structure 1200 in FIG. 12 is an equivalent structure of structure 1100 in FIG. 11 if active layers 934 and 944 are substantially the same active layers or device layers.

Figure 13:
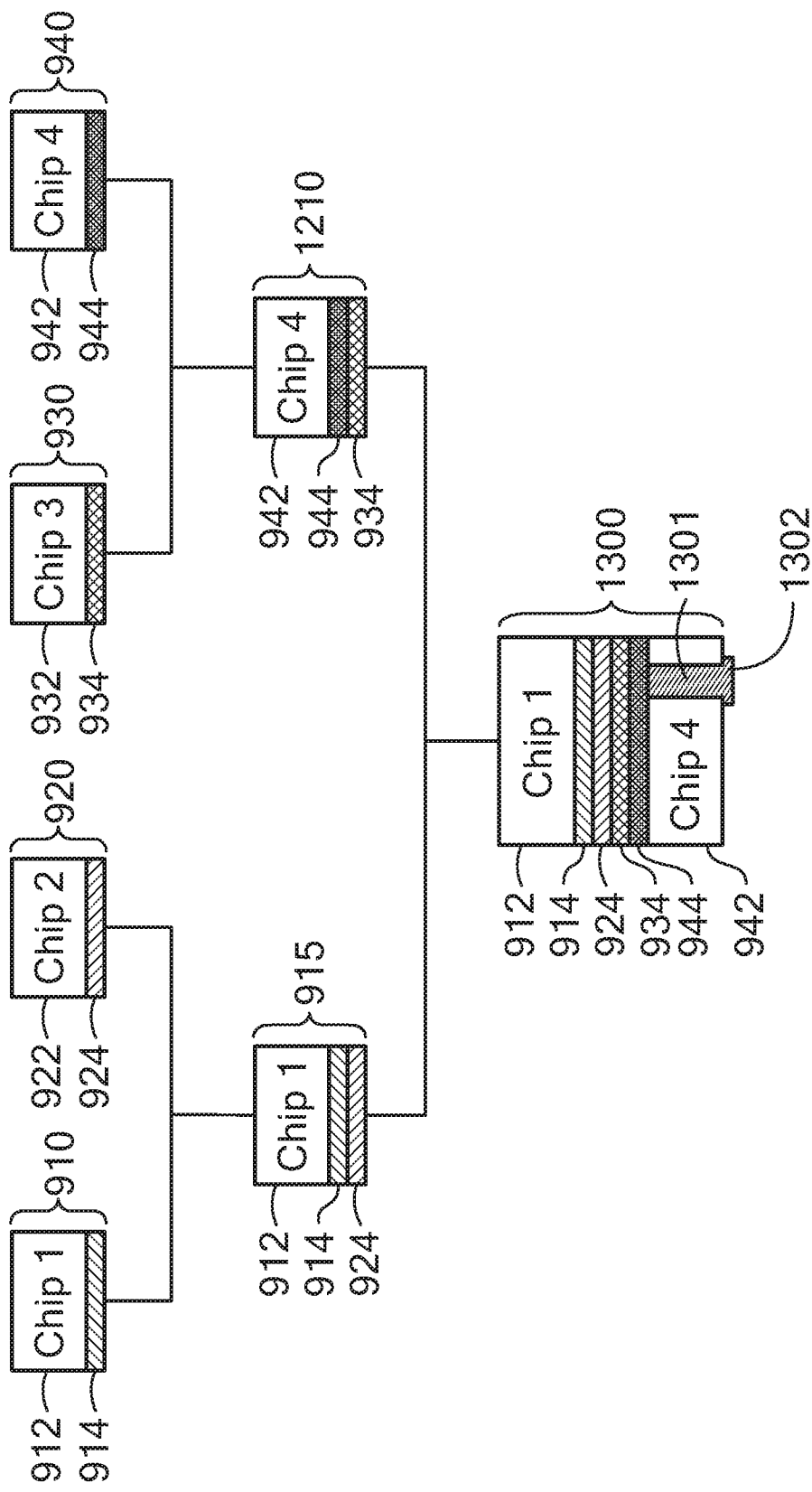

Referring to FIG. 13, in which like elements of FIG. 12 are shown having like reference designations, another example multi-layer semiconductor structure 1300 fabricated from a plurality of semiconductor structures (here, four semiconductor structures 910, 920, 930, 940) is shown.

In the illustrated embodiment, multi-layer semiconductor structure 1300 is fabricated according to method 700 in two bonding processes/cycles. In a first one of the bonding cycles, similar to the first bonding cycle described above in connection with FIG. 11, semiconductor structures 910, 920, 930 and 940 are all identified as semiconductor structures to bond in the first bonding cycle (i.e., these semiconductor structures are bonded at substantially the same time during a first bonding cycle). Semiconductor structures 910 and 920 are selected as a first bonding pair to bond in the first bonding cycle, with at least semiconductor structure 920 provided as a double-sided bondable semiconductor structure. Additionally, semiconductor structures 930 and 940 are selected as a second bonding pair to bond in the first bonding cycle, with at least semiconductor structure 940 provided as a double-sided bondable semiconductor structure. The first bonding pair (i.e., semiconductor structures 910 and 920) and the second bonding pair (i.e., semiconductor structures 930 and 940) are bonded (i.e., these semiconductor structures are bonded at substantially the same time during the first bonding cycle) to provide bonded multi-layer semiconductor structures 915 and 1210, respectively.

In a second one of the bonding cycles, similar to the second bonding cycle described above in connection with FIG. 10, semiconductor structures 915 and 1210 are identified as semiconductor structures to bond in the second bonding cycle. Additionally, semiconductor structures 915 and 1210 are selected as a bonding pair to bond in the second bonding cycle, with both semiconductor structures, a single one of the semiconductor structures or none of the semiconductor structures provided as double-sided bondable semiconductor structures. The bonding pair (i.e., semiconductor structures 915 and 1210) is bonded to provide bonded multi-layer semiconductor structure 1300.

Semiconductor structure 1300 has first and second opposing surfaces and includes handles 912 and 942. Semiconductor structure 1300 also includes active layers 914 and 924, a through silicon via (TSV) 1301, and an interconnect pad 1302. The TSV 1301 may, for example, be formed during a post bond process (here, a second post bond process) using via last techniques. Additionally, the interconnect pad 1302, which has first and second opposing surfaces, may be formed during the post bond process and electrically coupled to the TSV 1301. Both the TSV 1301 and the interconnect pad 1302 may be electrically coupled to one or more electrical connections in the active layers (here, active layers 914, 924, 934, 944) of multi-layer semiconductor structure 1300. It should be appreciated that any number of electrical structures (e.g., vias and other interconnect structures) may be formed in and/or coupled to one or more portions of the semiconductor structure 1300.

In one example embodiment, active layer 942 in semiconductor structure 1300 has a thickness ranging between about 10 and 350 microns. Additionally, in one example embodiment, TSV 1301 has a diameter ranging between about 2 and 100 microns with a pitch ranging from about 4 to about 500 microns. Further, in another example embodiment, TSV 1301 is filled or partially filled or open via. In FIG. 13, the active layers or device layers of structure 1300 are substantially the same as and provided in a substantially same location as the active or device layers in structure 1200 in FIG. 12. In one embodiment, structure 1200 in FIG. 12 is an equivalent structure of structure 1300 in FIG. 13.

Figure 14:
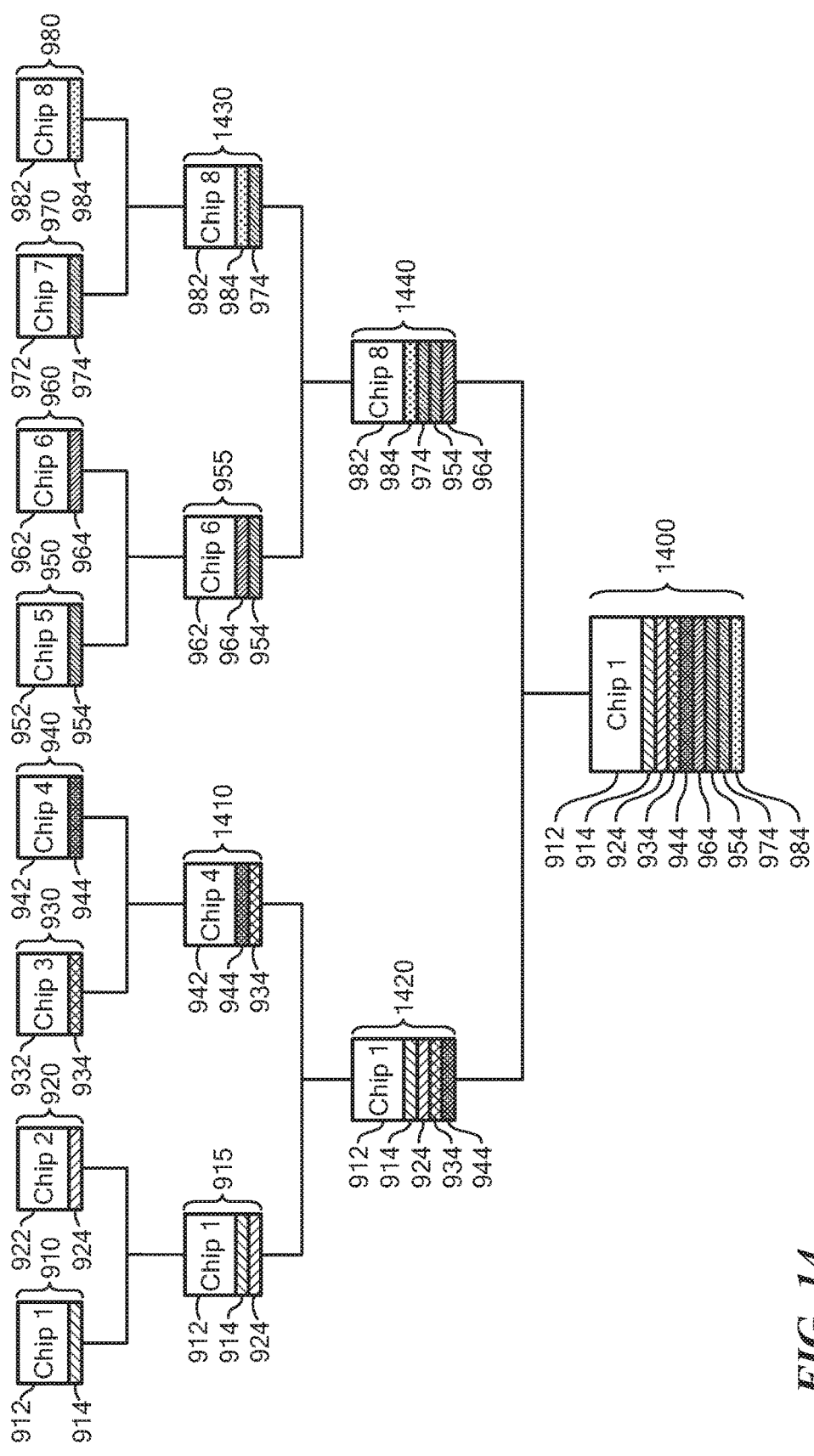

Referring to FIG. 14, in which like elements of FIGS. 9 and 13 are shown having like reference designations, another example multi-layer semiconductor structure 1400 fabricated from a plurality of semiconductor structures (here, eight semiconductor structures 910, 920, 930, 940, 950, 960, 970, 980) is shown.

In the illustrated embodiment, multi-layer semiconductor structure 1400 is fabricated according to method 700 in three bonding processes/cycles. In a first one of the bonding cycles, semiconductor structures 910, 920, 930, 940, 950, 960, 970, 980 are all identified as semiconductor structures to bond in the first bonding cycle (i.e., these semiconductor structures are bonded at substantially the same time during a first bonding cycle).

Semiconductor structures 910 and 920 are selected as a first bonding pair to bond in the first bonding cycle, with at least semiconductor structure 920 provided as a double-sided bondable semiconductor structure. Additionally, semiconductor structures 930 and 940 are selected as a second bonding pair to bond in the first bonding cycle, with at least semiconductor structure 940 provided as a double-sided bondable semiconductor structure. Additionally, semiconductor structures 950 and 960 are selected as a third bonding pair to bond in the first bonding cycle, with at least semiconductor structure 960 provided as a double-sided bondable semiconductor structure. Further, semiconductor structures 970 and 980 are selected as a fourth bonding pair to bond in the first bonding cycle, with at least semiconductor structure 980 provided as a double-sided bondable semiconductor structure.

The first bonding pair (i.e., semiconductor structures 910 and 920), the second bonding pair (i.e., semiconductor structures 930 and 940), the third bonding pair (i.e., semiconductor structures 950 and 960), and the fourth bonding pair (i.e., semiconductor structures 970 and 980) are bonded (i.e., these semiconductor structures are bonded at substantially the same time during the first bonding cycle) to provide bonded multi-layer semiconductor structures 915, 1410, 955, and 1430, respectively. In one example, semiconductor structures 910-920, 930-940, 950-960, 970-980 follow a via last bonding approach in the first bonding cycle to provide bonded multi-layer semiconductor structures 915, 1410, 955, and 1430, respectively.

Semiconductor structure 915 has first and second opposing surfaces and includes handle 912 and active layers 914, 924. Additionally, semiconductor structure 1410 has first and second opposing surfaces and includes handle 942 and active layers 934, 944. Additionally, semiconductor structure 955 has first and second opposing surfaces and includes handle 962 and active layers 954, 964. Further, semiconductor structure 1430 has first and second opposing surfaces and includes handle 982 and active layers 974, 984.

In a second one of the bonding cycles, semiconductor structures 915 and 1410 are identified as semiconductor structures to bond in the second bonding cycle. Semiconductor structures 915 and 1410 are selected as a first bonding pair to bond in the second bonding cycle, with at least semiconductor structure 915 provided as double-sided bondable semiconductor structure. Additionally, semiconductor structures 955 and 1430 are selected as a second bonding pair to bond in the second bonding cycle, with at least semiconductor structure 1430 provided as double-sided bondable semiconductor structure. The first bonding pair (i.e., semiconductor structures 915 and 1410) and the second bonding pair (i.e., semiconductor structures 955 and 1430) are bonded (i.e., these semiconductor structures are bonded at substantially the same time during the second bonding cycle) to provide bonded multi-layer semiconductor structures 1420 and 1440, respectively. In one example, semiconductor structures 915-1410 and 955-1430 follow a via first bonding approach in the second bonding cycle to provide bonded multi-layer semiconductor structures 1420 and 1440, respectively.

In a third one of the bonding cycles, semiconductor structures 1420 and 1440 are identified as semiconductor structures to bond in the third bonding cycle. Semiconductor structures 1420 and 1440 are selected as a bonding pair to bond in the third bonding cycle, with at least semiconductor structure 1420 provided as double-sided bondable semiconductor structure. The bonding pair (i.e., semiconductor structures 1420 and 1440) are bonded (i.e., these semiconductor structures are bonded at substantially the same time during the third bonding cycle) to provide a bonded multi-layer semiconductor structure 1400. Semiconductor structure 1400 has first and second opposing surfaces and includes handle 912 and a plurality of active layers (here, active layers 914, 924, 934, 944, 954, 964, 974, 984).

An ordering of the active layers in semiconductor structure 1400 is, for example, based upon the semiconductor structure selections during each of the bonding cycles. A post bonding process such as a single or multiple oxide deposition, chemical-mechanical planarization (CMP), and/or surface treatment may, for example, occur during one or more of the bonding cycles to make the active layers compatible with each other for bonding. In one example, semiconductor structures 1420 and 1440 follow a via first bonding approach in the third bonding cycle to provide bonded multi-layer semiconductor structure 1400.

Figure 15:
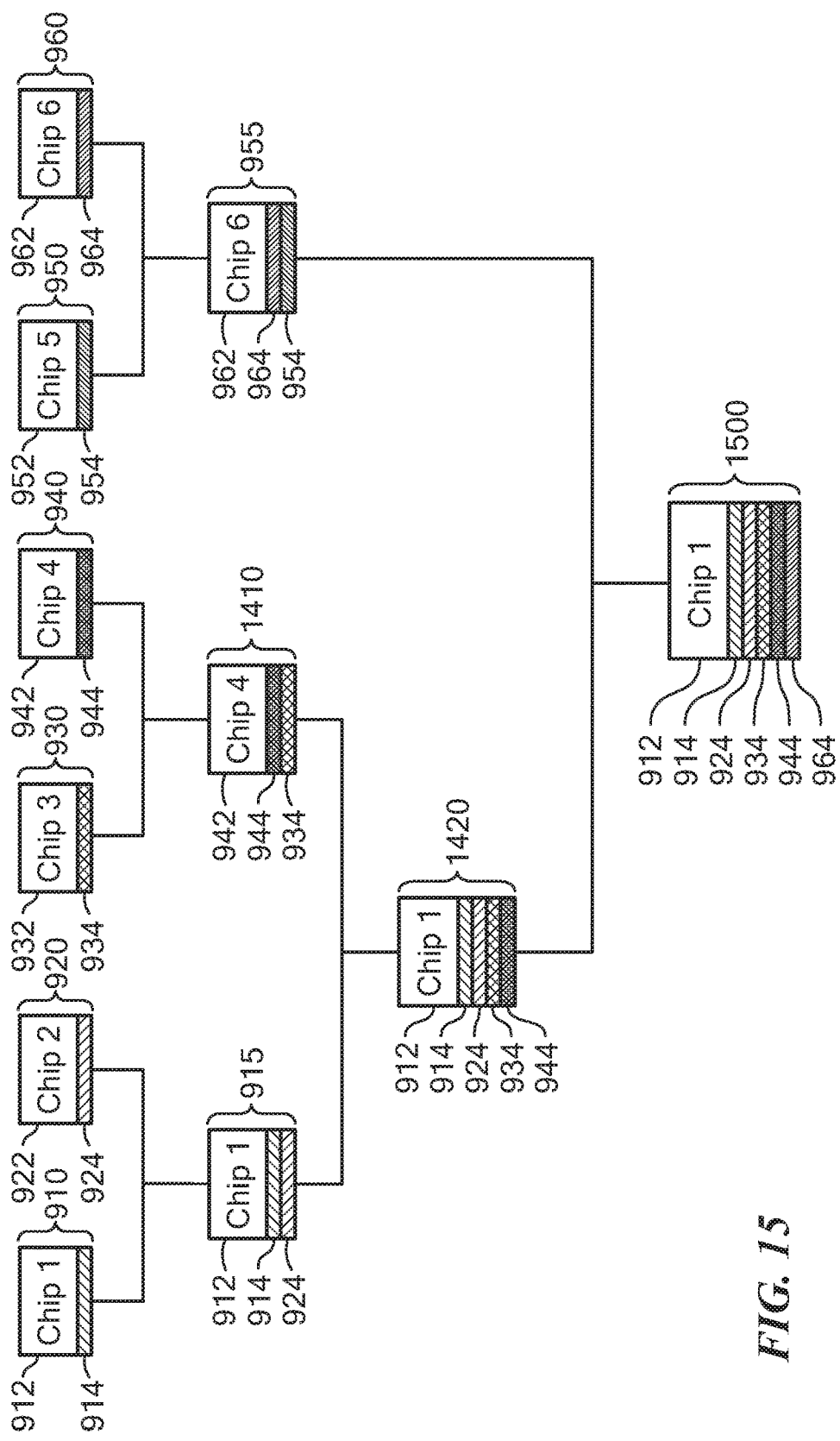

Referring to FIG. 15, in which like elements of FIG. 14 are shown having like reference designations, another example multi-layer semiconductor structure 1500 fabricated from a plurality of semiconductor structures (here, six semiconductor structures 910, 920, 930, 940, 950, 960) is shown.

In the illustrated embodiment, multi-layer semiconductor structure 1500 is fabricated according to method 700 in three bonding processes/cycles. In a first one of the bonding cycles, semiconductor structures 910, 920, 930, 940, 950 and 960 are identified as semiconductor structures to bond in the first bonding cycle. Similar to the first bonding cycle described above in connection with FIG. 14, semiconductor structures 910 and 920 are selected as a first bonding pair to bond in the first bonding cycle, with at least semiconductor structure 920 provided as a double-sided bondable semiconductor structure. Additionally, semiconductor structures 930 and 940 are selected as a second bonding pair to bond in the first bonding cycle, with at least semiconductor structure 940 provided as a double-sided bondable semiconductor structure. Further, semiconductor structures 950 and 960 are selected as a third bonding pair to bond in the first bonding cycle, with at least semiconductor structure 960 provided as a double-sided bondable semiconductor structure.

The first bonding pair (i.e., semiconductor structures 910 and 920), the second bonding pair (i.e., semiconductor structures 930 and 940) and the third bonding pair (i.e., semiconductor structures 950 and 960) are bonded (i.e., these semiconductor structures are bonded at substantially the same time during the first bonding cycle) to provide bonded multi-layer semiconductor structures 915, 1410 and 955, respectively.

Semiconductor structure 915 has first and second opposing surfaces and includes handle 912 and active layers 914, 924. Additionally, semiconductor structure 1410 has first and second opposing surfaces and includes handle 942 and active layers 934, 944. Further, semiconductor structure 955 has first and second opposing surfaces and includes handle 962 and active layers 954, 964.

In a second one of the bonding cycles, semiconductor structures 915 and 1410 are identified as semiconductor structures to bond in the second bonding cycle (i.e., semiconductor structure 955 is not identified as a semiconductor structure to bond in the second bonding cycle in the illustrated embodiment). Semiconductor structures 915 and 1410 are selected as a bonding pair to bond in the second bonding cycle, with at least semiconductor structure 915 provided as double-sided bondable semiconductor structure. The bonding pair (i.e., semiconductor structures 915 and 1410) are bonded (i.e., these semiconductor structures are bonded at substantially the same time during the second bonding cycle) to provide bonded multi-layer semiconductor structure 1420.

In a third one of the bonding cycles, semiconductor structures 1420 and 955 are identified as semiconductor structures to bond in the third bonding cycle. Semiconductor structures 1420 and 955 are selected as a bonding pair to bond in the third bonding cycle, with at least semiconductor structure 1420 provided as double-sided bondable semiconductor structure. The bonding pair (i.e., semiconductor structures 1420 and 955) are bonded (i.e., these semiconductor structures are bonded at substantially the same time during the third bonding cycle) to provide a bonded multi-layer semiconductor structure 1500. Semiconductor structure 1500 has first and second opposing surfaces and includes handle 912 and a plurality of active layers (here, active layers 914, 924, 934, 944, 954, 964). In FIG. 15, the active layers or device layers of structure 1500 are substantially the same as and provided in a substantially same location as the active or device layers in structure 900 in FIG. 9. In one embodiment, structure 900 in FIG. 9 is an equivalent structure of structure 1500 in FIG. 15.

Figure 16:
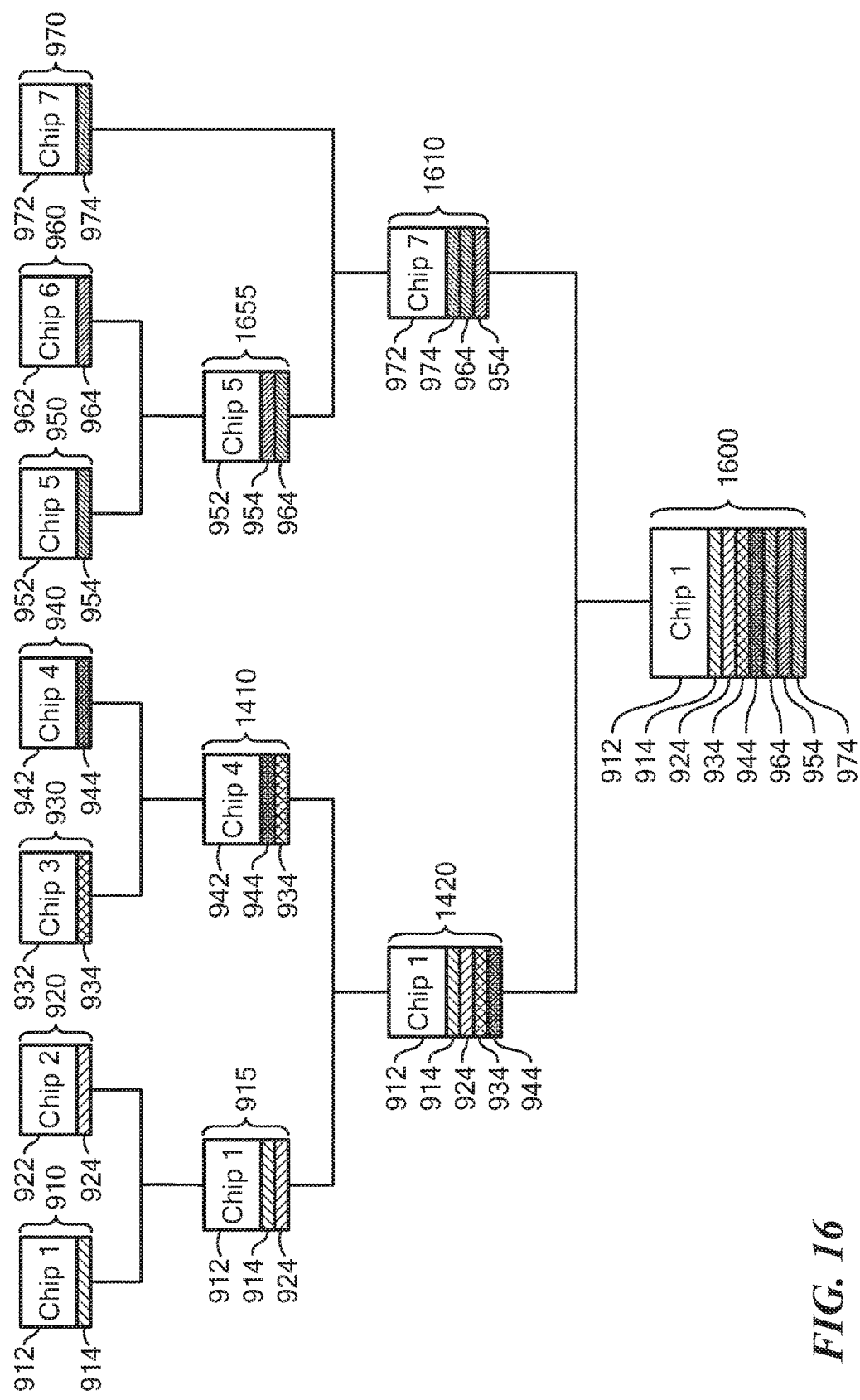

Referring to FIG. 16, another example multi-layer semiconductor structure 1600 fabricated from a plurality of semiconductor structures (here, seven semiconductor structures 910, 920, 930, 940, 950, 960, 970) is shown. Multi-layer semiconductor structure 1600 is fabricated in a similar manner as multi-layer semiconductor structure 1500 of FIG. 15, and is also fabricated in three bonding cycles. Here, however, in the second bonding cycle, semiconductor structures 915, 1410, 1655 and 970 are identified as semiconductor structures to bond in the second bonding cycle (e.g., due to their being additional semiconductor structure 970 in the illustrated embodiment).

Semiconductor structures 915 and 1410 are selected as a first bonding pair to bond in the second bonding cycle, with at least semiconductor structure 915 provided as double-sided bondable semiconductor structure. Additionally, semiconductor structures 1655 and 970 are selected as a second bonding pair to bond in the second bonding cycle, with at least semiconductor structure 970 provided as double-sided bondable semiconductor structure. The first bonding pair (i.e., semiconductor structures 915 and 1410) and the second bonding pair (i.e., semiconductor structures 1655 and 970) are bonded at substantially the same time during the second bonding cycle to provide bonded multi-layer semiconductor structures 1420 and 1610, respectively.

In the third bonding cycle, semiconductor structures 1420 and 1610 are identified as semiconductor structures to bond in the third bonding cycle. Semiconductor structures 1420 and 1610 are selected as a bonding pair to bond in the third bonding cycle, with at least semiconductor structure 1610 provided as double-sided bondable semiconductor structure. The bonding pair (i.e., semiconductor structures 1420 and 1610) is bonded to provide a bonded multi-layer semiconductor structure 1600. Semiconductor structure 1500 has first and second opposing surfaces and includes handle 912 and a plurality of active layers (here, active layers 914, 924, 934, 944, 954, 964, 974).

As illustrated above, the multi-layer semiconductor structures shown in FIGS. 9-16 are fabricated in accordance with method 700 which bonds two semiconductor structures (i.e., pairs of semiconductor structures) at a substantially same time to produce a multi-layer semiconductor structure (e.g., 3DICs). Method 700 and FIGS. 9-16 together allow us to predict a number of bonding cycles for a given multi-layer semiconductor structure (e.g. 3DIC). A multi-layer semiconductor structure fabricated from a number of semiconductor structures (e.g., structures with one or more active layers or integrated circuits) equal to $2^n$ may require a maximum of "n" bonding cycles when method 700 is used to fabricate the multi-layer semiconductor structure.

Similarly, a multi-layer semiconductor structure fabricated from a number of semiconductor structures less than $2^n$ but greater than $2^{n-1}$ may require a maximum of "n" bonding cycles when method 700 is used to fabricate the multi-layer semiconductor structure. In general, method 700 can be used for bonding two or more pairs of semiconductor structures (e.g., wafers and or chips and or substrates and or cores and or PCBs) at a substantially same time. The semiconductor structures fabricated with or using method 700 may be semiconductor structures with or without TSV.

Referring to FIG. 17, an example multi-layer structure 1700 as may be fabricated according to method 800 of FIG. 8, for example, is shown. As discussed above, method 800 may be more suitable than method 700 in instances where there are a multitude of semiconductor structures (e.g., six or more semiconductor structures) to be bonded in fabricating a multi-layer semiconductor structure (e.g., due to the semiconductor structures being arranged into groups of three semiconductor structures during at least the first bonding cycle of method 800, rather than the semiconductor structures pairs of method 700).

Semiconductor structure 1700 is fabricated from a plurality of semiconductor structures (here, nine semiconductor structures 910, 930, 940, 960, 970, 990, 1710, 1720, 1730). Each of the semiconductor structures has first and second opposing surfaces and includes a handle (e.g., 912) and at least one active layer (e.g., 914). Additionally, the handle and the at least one active layer each have first and second opposing surfaces, with the first surface of the handle disposed over the second surface of the at least one active layer. Select ones of the semiconductor structures (e.g., 1710) also have at least one through silicon via (TSV) (e.g., 1713) formed between the first and second surfaces of the handle (e.g., 1712). In one example embodiment, the handles may have a thickness in a range of about 50 to about 500 microns. Additionally, the TSVs may have a diameter in a range of about 10 to about 200 microns with a pitch ranging of about 20 to about 500 microns. In another example embodiment, the TSVs may be filled or partially filled or open via.

In the illustrated embodiment, multi-layer semiconductor structure 1700 is fabricated according to method 800 in two bonding processes/cycles. In a first one of the bonding cycles, the semiconductor structures (here, semiconductor structures 910, 930, 940, 960, 970, 990, 1710, 1720, 1730) are arranged into groups of three, with each group including at least one single step double-sided bondable semiconductor structure (e.g., 1710) and at least two single-sided bondable semiconductor structures (e.g., 910 and 930). Semiconductor structures 910, 1710 and 930 are selected as a first group of three semiconductor structures, with semiconductor structures 910 and 930 provided as single-sided bondable semiconductor structures and semiconductor structure 1710 provided as a single step double-sided bondable semiconductor structure. Additionally, semiconductor structures 940, 1720 and 960 are selected as a second group of three semiconductor structures, with semiconductor structures 940 and 960 provided as single-sided bondable semiconductor structures and semiconductor structure 1720 provided as a single step double-sided bondable semiconductor structure. Further, semiconductor structures 970, 1730 and 990 are selected as a third group of three semiconductor structures, with semiconductor structures 970 and 990 provided as single-sided bondable semiconductor structures and semiconductor structure 1730 provided as a single step double-sided bondable semiconductor structure.

Each of the single step double-sided bondable semiconductor structures (here, semiconductor structures 1710, 1720 and 1730) has at least one TSV (e.g., 1713) formed between the first and second surfaces of their respective handle (e.g., 1712). The at least one TSV extends through first and second surfaces of the at least one active layer of the semiconductor structure (e.g., to enable electrical coupling between the single-sided bondable semiconductor structures in each group of three semiconductor structures once bonded).

In the first bonding cycle, semiconductor structures 910 and 930 of the first group of semiconductor structures are bonded to each side of semiconductor structure 1710 to provide bonded multi-layer semiconductor structure 1740. Additionally, semiconductor structures 940 and 960 of the second group of semiconductor structures are bonded to each side of semiconductor structure 1720 to provide bonded multi-layer semiconductor structure 1750. Further, semiconductor structures 970 and 990 of the third group of semiconductor structures are bonded to each side of semiconductor structure 1730 to provide bonded multi-layer semiconductor structure 1760. The first, second and third group of semiconductor structures are bonded at substantially the same time to form semiconductor structures 1740, 1750 and 1760, respectively.

Semiconductor structure 1740 has first and second opposing surfaces and includes handles 912 and 1712. Semiconductor structure 1740 also includes active layers 914, 1714 and 934, and TSV 1713. TSV 1713 may, for example, electrically couple active layer 914 to at least one of active layer 1714 and 934. Handle 932 of semiconductor structure 930 may, for example, have been removed from semiconductor structure 1740 (and semiconductor structure 930) during a post bond process (here, a first post bond process) to expose active layer 934 (e.g., for further bonding).

Semiconductor structure 1750 has first and second opposing surfaces and includes handles 962 and 1722. Semiconductor structure 1740 also includes active layers 944, 1724 and 964, and TSV 1723. TSV 1723 may, for example, electrically couple active layer 964 to at least one of active layer 1724 and 944. Handle 942 of semiconductor structure 940 may, for example, have been removed from semiconductor structure 1750 (and semiconductor structure 940) during a post bond process to expose active layer 944.

Semiconductor structure 1760 has first and second opposing surfaces and includes handle 1732 and active layers 974, 1734 and 994. Semiconductor structure 1740 also includes TSV 1733. TSV 1733 may electrically couple active layer 994 to at least one of active layer 1734 and 974. Handle 992 of semiconductor structure 990 may, for example, have been removed from semiconductor structure 1760 (and semiconductor structure 990) during a post bond process to expose active layer 944.

In a second one of the bonding cycles, semiconductor structures 1740, 1750 and 1760 are identified as semiconductor structures to bond in the second bonding cycle. Additionally, semiconductor structures 1740, 1750 and 1760 are arranged into a group of three semiconductor structures in accordance with Embodiment 3 described above in connection with FIG. 8, with at least semiconductor structure 1760 provided as a single step double-sided bondable semiconductor structure. Semiconductor structures 1740 and 1750 are bonded to each side of semiconductor structure 1760 at substantially the same time to provide bonded multi-layer semiconductor structure 1700. Semiconductor structure 1700 has first and second opposing surfaces and includes handles 1712, 1732, 1722 and 962. Semiconductor structure 1700 also includes a plurality of active layers (here, active layers 914, 1714, 934, 974, 1734, 994, 944, 1724 and 962) and a plurality of TSVs (here, TSVs 1713, 1723 and 1733). The TSVs 1713, 1723 and 1733 may, for example, electrically couple one or more of the active layers of semiconductor structure 1700. In some embodiments, additional semiconductor structures may be bonded to semiconductor structure 1700.

As illustrated above, the multi-layer semiconductor structure shown in FIG. 17 (i.e., semiconductor structure 1700) is fabricated in accordance with method 800 which comprises bonding a group of three semiconductor structures at a substantially same time for one or more of the bonding cycles (in some instances, all of the bonding cycles) to produce semiconductor structure 1700 (e.g., a 3DIC). Method 800 and FIG. 17 together allow us to predict a number of bonding cycles for a given multi-layer semiconductor structure. A multi-layer semiconductor structures fabricated from a number of semiconductor structures (e.g., structures with one or more active layers or integrated circuits) equal to $3^n$ may require a maximum of "n" bonding cycles when following Embodiment 3 of method 800 to fabricate the multi-layer semiconductor structure.

Similarly, a multi-layer semiconductor structure fabricated from a number of semiconductor structures less than $3^n$ but greater than $3^{n-1}$ may require a maximum of "n" bonding cycles when following method 800 to fabricate the multi-layer semiconductor structure. In general, method 800 can be used for bonding groups of three semiconductor structures (e.g., wafers and or chips and or substrates and or cores and or PCBs) at a substantially same time (e.g., for all bonding cycles).

While semiconductor structures 1740, 1750 and 1760 are arranged into a group of three in the second bonding cycle of the illustrated embodiment, it should be appreciated that in other embodiments, such as that shown in FIGS. 18 and 19, the semiconductor structures may be arranged into bonding pairs and/or groups of three of more semiconductor structures in selected bonding cycles (e.g., second and subsequent bonding cycles) according to various embodiments of method 800 (e.g., Embodiments 2-4). Whether the semiconductor structures are arranged into bonding pairs, groups of three, or groups of more than three semiconductor structures may, for example, be based upon a number of semiconductor structures to be bonded during a single bonding cycle (e.g., a second bonding cycle).

Referring to FIG. 18, in which like elements of FIG. 17 are shown having like reference designations, another example multi-layer semiconductor structure 1800 fabricated from a plurality of semiconductor structures (here, six semiconductor structures 910, 1710, 930, 940, 1720, 960) is shown.

In the illustrated embodiment, multi-layer semiconductor structure 1800 is fabricated according to method 800 in two bonding processes/cycles with at least one of the bonding cycles comprising bonding a group of three semiconductor structures are a substantially same time. In a first one of the bonding cycles, semiconductor structures 910, 1710, 930, 940, 1720, 960 are identified as semiconductor structures to bond in the first bonding cycle (i.e., these semiconductor structures are bonded at substantially the same time during a first bonding cycle). Additionally, semiconductor structures 910, 1710, 930, 940, 1720, 960 are arranged into groups of three semiconductor structures to bond in the first bonding cycle.

Semiconductor structures 910, 1710 and 930 are selected as a first group of three semiconductor structures, with semiconductor structures 910 and 930 provided as single-sided bondable semiconductor structures and semiconductor structure 1710 provided as a single step double-sided bondable semiconductor structure. Further, semiconductor structures 940, 1720 and 960 are selected as a second group of three semiconductor structures, with semiconductor structures 940 and 960 provided as single-sided bondable semiconductor structures and semiconductor structure 1720 provided as a single step double-sided bondable semiconductor structure.

In the first bonding cycle, semiconductor structures 910 and 930 of the first group of semiconductor structures are bonded to each side of semiconductor structure 1710 to provide bonded multi-layer semiconductor structure 1740. Additionally, semiconductor structures 940 and 960 of the second group of semiconductor structures are bonded to each side of semiconductor structure 1720 to provide bonded multi-layer semiconductor structure 1750. The first and second groups of semiconductor structures are bonded at substantially the same time to form semiconductor structures 1740 and 1750, respectively.

In a second one of the bonding cycles, semiconductor structures 1740 and 1750 are identified as semiconductor structures to bond in the second bonding cycle. Additionally, semiconductor structures 1740 and 1750 are selected as a bonding pair to bond in the second bonding cycle (this is in contrast to the second bonding cycle shown in FIG. 17 in which the semiconductor structures are arranged into a group of three semiconductor structures).

In one embodiment, it is preferable to bond at least three semiconductor structures at a substantially same time in a substantially all bonding cycles in accordance with Embodiment 3 described above in connection with FIG. 8. However, as illustrated in FIGS. 17-19, it is possible to replace block 860 of method 800 with one or more blocks in which the semiconductor structures are bonded in pairs and/or groups of three semiconductor structures at a substantially same time (e.g., in accordance with Embodiments 2, 3 or 4), as described above in connection with FIG. 8. In other words, the semiconductor structures may be arranged in pairs or groups of three semiconductor structures and subsequently bonded to fabricate a multi-layer semiconductor structure in accordance with the disclosure.

In the illustrated embodiment, at least one of semiconductor structures 1740 and 1750 provided as a double-sided bondable semiconductor structure. The bonding pair (i.e., semiconductor structures 1740 and 1750) is bonded (i.e., these semiconductor structures are bonded at substantially the same time during the second bonding cycle) to provide bonded multi-layer semiconductor structure 1800. Semiconductor structure 1800 has first and second opposing surfaces and includes handles 1712, 1722 and 962. Semiconductor structure 1800 also includes a plurality of active layers (here, active layers 914, 934, 944, 1724 and 962) and a plurality of TSVs (here, TSVs 1713, 1723 and 1733). The TSVs 1713, 1723 and 1733 may, for example, electrically couple one or more of the active layers of semiconductor structure 1800.

Referring to FIG. 19, in which like elements of FIGS. 12 and 18 are shown having like reference designations, further example multi-layer semiconductor structures (here, semiconductor structures 1920, 1930, 1940, 1950) as may be fabricated from a plurality of semiconductor structures (here, five semiconductor structures 910, 920, 930, 940, 1910) are shown.

In the illustrated embodiment, each of the multi-layer semiconductor structures 1920, 1930, 1940, 1950 may be fabricated according in two bonding processes/cycles. In a first one of the bonding cycles, semiconductor structures 910, 920, 930 and 940 are identified as semiconductor structures to bond in the first bonding cycle. Semiconductor structures 910 and 920 are selected as a first bonding pair to bond in the first bonding cycle in accordance with Embodiment 4 as discussed above in connection with FIG. 8, with at least semiconductor structure 920 provided as a double-sided bondable semiconductor structure (this is in contrast to the first bonding cycle shown in FIG. 18 in which the semiconductor structures are arranged into a group of three semiconductor structures).

Additionally, semiconductor structures 930 and 940 are selected as a second bonding pair to bond in the first bonding cycle, with at least semiconductor structure 940 provided as a double-sided bondable semiconductor structure. The first bonding pair (i.e., semiconductor structures 910 and 920) and the second bonding pair (i.e., semiconductor structures 930 and 940) are bonded (i.e., these semiconductor structures are bonded at substantially the same time during the first bonding cycle) to provide bonded multi-layer semiconductor structures 915 and 1210, respectively.

Semiconductor structure 915 has first and second opposing surfaces and includes handle 912 and active layers 914, 924. Additionally, semiconductor structure 1210 has first and second opposing surfaces and includes handle 942 and active layers 934, 944. Handle 922 from semiconductor structure 920 may, for example, been removed from semiconductor structure 915 (and semiconductor structure 920) during a first post bond process such that at least one surface of active layer 924 is substantially exposed (e.g., for subsequent bonding). Similarly, handle 932 from semiconductor structure 930 may have been removed from semiconductor structure 1210 (and semiconductor structure 930) during the first post bond process such that at least one surface of active layer 934 is substantially exposed.

In a second one of the bonding cycles, semiconductor structures 915, 1910 and 1210 are identified as semiconductor structures to bond in the second bonding cycle. Additionally, semiconductor structures 915, 1910 and 1210 are arranged into a group of three semiconductor structures (in accordance with Embodiment 4), with at least semiconductor structure 1910 provided as a single step double-sided bondable semiconductor structure. Semiconductor structure 1910 has first and second opposing surfaces and includes a handle 1912. Semiconductor structure 1910 also includes at least one active layer (here, active layer 1914) and at least one TSV (here, TSV 1913). The at least one TSV may electrically couple the at least one active layer to one or more other active layers (e.g., once semiconductor structure 1910 is bonded to one or more other semiconductor structures).

Semiconductor structures 915 and 1210 may be bonded to each side of semiconductor structure 1910 at substantially the same time in a number of different arrangements to provide bonded multi-layer semiconductor structure 1920, 1930, 1940 or 1950 (e.g., with each having a different handle and active layer stacking). Multi-layer semiconductor structures 1920, 1930, 1940 and 1950 each have first and second opposing surfaces and include at least two handles (e.g., 912 and 1912). Additionally, multi-layer semiconductor structures 1920, 1930, 1940 and 1950 each have a plurality of active layers (e.g., 912 and 924) and at least one TSV (e.g., 1913). The handles may be removed during a post bonding process (e.g., for subsequent bonding).

As illustrated above, a number of multi-layer semiconductor structures (here, semiconductor structures 1920, 1930, 1940, 1950) may be fabricated from a same plurality of semiconductor structures (here, semiconductor structures 910, 920, 930, 940, 1910) using the techniques described herein.

Additionally, as illustrated in FIGS. 17-19, multi-layer semiconductor structures may be fabricated according to various embodiments of method 800 (and, thus, various methods). In one example embodiment, a method (e.g., Embodiment 2) comprises one bonding cycle in which groups of three semiconductor structures are bonded at a substantially same time, and one or more other bonding cycles in which semiconductor structures are bonded in pairs at a substantially same time. Additionally, in one example embodiment, a method (e.g., Embodiment 3) comprises bonding groups of three semiconductor structures in each bonding cycle of the method.

Further, in one example embodiment, a method (e.g., Embodiment 4) may comprise one bonding cycle in which pairs of semiconductor structures are bonding at a substantially same time, and one or more other bonding cycles in which groups of three semiconductor structures are bonded at a substantially same time. Additionally, in one example embodiment, the method (e.g., Embodiment 4) may comprise one or more bonding cycles in which both semiconductor structure pairs and groups of three semiconductor structures may be bonded at a substantially same time. These methods and FIGS. 17-19 allow us to predict a number of bonding cycles for a given multi-layer semiconductor structure (e.g. a 3DIC).

A multi-layer semiconductor structure fabricated from a number of semiconductor structures (e.g., structures with one or more active layer or integrated circuits) equal to $2^n$ may require a maximum of "n−1" bonding cycles when the above-described methods (i.e., Embodiment 2 of FIG. 18) are used for fabricating a multi-layer semiconductor structure (e.g. a 3DIC). Similarly, a multi-layer semiconductor structure fabricated from a number of semiconductor structures less than $2^n$ but greater than $2^{n-1}$ may require a maximum of "n−1" bonding cycles when these methods are used for fabricating the multi-layer semiconductor structure.

In general, these methods can be used to bond six or more semiconductor structures (e.g., wafers and or chips and or substrates and or cores and or PCBs). At least one of the bonding cycles (in some instances, only one of the bonding cycles) may comprise bonding a group of three semiconductor structures at a substantially same time. Additionally, at least one of the bonding cycles (in some instances, each of the remaining bonding cycles) may comprises bonding pairs of semiconductor structures at a substantially same time.

Referring to FIG. 20, shown is a chart 2000 illustrating a substantially maximum number of bonding cycles that an individual semiconductor structure experiences in fabricating a multi-layer semiconductor structure (e.g., 900, shown in FIG. 9) from a plurality of semiconductor structures using the techniques described herein. As illustrated, the maximum number of bonding cycles that an individual semiconductor structure experiences is based, at least in part, upon (a) a number of semiconductor structures to be bonded in fabricating the multi-layer semiconductor structure and (b) the method (e.g., 700 and 800, shown in FIGS. 7 and 8), or combination of methods, used to fabricate the multi-layer semiconductor structure. Chart 2000 also illustrates a substantially maximum number of bonding cycles that an individual semiconductor structure experiences in fabricating an equivalent multi-layer semiconductor structure from a plurality of semiconductor structures using the techniques described herein.

Embodiment 1 corresponds to a multi-layer semiconductor structure fabricated according to method 700 where individual semiconductor structures are bonded in pairs for substantially all bonding cycles. Additionally, embodiment 2 corresponds to a multi-layer semiconductor structure fabricated according to method 800 where one of the bonding cycles (e.g., a first one of the bonding cycles) comprises bonding groups of three individual semiconductor structures at a substantially same time, and the rest of the bonding cycles comprise bonding individual semiconductor structures in pairs at a substantially same time.

Embodiment 3 corresponds to a multi-layer semiconductor structure fabricated according to a method where individual semiconductor structures are bonded in groups of three semiconductor structures for all bonding cycles. Further, embodiment 4 corresponds to a multi-layer semiconductor structure fabricated according to a method (e.g., a combination of methods 700 and 800) where each of the bonding cycles may comprise bonding semiconductor structure pairs and/or in groups of three semiconductor structures at a substantially same time.

Several examples of multi-layer semiconductor structures fabricated according to various embodiments of the disclosure are provided below.

Example 1 (Fabrication of an Equivalent Twenty Four Stack Multi-Layer Semiconductor Structure)

A twenty four stack semiconductor structure (i.e., a multi-layer semiconductor structure fabricated from twenty four semiconductor structures) may be fabricated in accordance with Embodiment 2 in four bonding (3-6-12-24) cycles. A first bonding cycle comprises bonding eight groups of three semiconductor structures at a substantially same time (i.e., in accordance with method 800) to form eight bonded semiconductor structures. Additionally, the second, third and fourth bonding cycles (i.e., the rest of the bonding cycles) comprise bonding semiconductor structures in pairs at a substantially same (i.e., in accordance with method 700) to complete bonding of the twenty four stack multi-layer semiconductor structure.

Example 2 (Fabrication of an Equivalent Eighteen Stack Semiconductor Structure)

An eighteen stack semiconductor structure (i.e., a multi-layer semiconductor structure fabricated from eighteen semiconductor structures) may be fabricated in accordance with Embodiment 2 in four bonding (3-6-12-18) cycles. A first bonding cycle comprises bonding six groups of three semiconductor structures at a substantially same time (i.e., in accordance with method 800) to form six bonded semiconductor structures. Additionally, the second, third and fourth bonding cycles comprise bonding semiconductor structures in pairs at a substantially same time (i.e., in accordance with method 700) to complete bonding of the eighteen stack multi-layer semiconductor structure.

The eighteen stack semiconductor structure may also be fabricated in accordance with Embodiment 4 in three bonding (3-9-18) cycles. First and second bonding cycles comprise bonding groups of three semiconductor structures at a substantially same time (i.e., in accordance with method 800) to form bonded semiconductor structures. Additionally, a third bonding cycle comprises bonding the two bonded semiconductor structures provided from the second bonding cycle in pairs (i.e., in accordance with method 700) to form the eighteen stack multi-layer semiconductor structure.

The eighteen stack semiconductor structure may further be fabricated in accordance with Embodiment 1 (i.e., method 700) in five (2-4-8-16-18) bonding cycles in a manner similar to the eight stack semiconductor structure shown in FIG. 14, for example.

Example 3 (Fabrication of an Equivalent Seven Stack Semiconductor Structure)

A seven stack semiconductor structure (i.e., a multi-layer semiconductor structure fabricated from seven semiconductor structures) may be fabricated in accordance with embodiment 4 in two bonding (3-7) cycles. A first bonding cycle comprises bonding a group of three semiconductor structures and remaining ones of the semiconductor structures (i.e., four semiconductor structures) in pairs at a substantially same time to form three bonded semiconductor structures. Additionally, a second bonding cycle comprises bonding the three semiconductor structures fabricated in the first bonding cycle (i.e., a group of three semiconductor structures) to complete bonding of the seven stack multi-layer semiconductor structure.

Example 4 (Fabrication of an Equivalent Eight Stack Multi-Layer Semiconductor Structure)

An eight stack semiconductor structure (i.e., a multi-layer semiconductor structure fabricated from eight semiconductor structures) may be fabricated in accordance with embodiment 3 in two bonding (3-8) cycles. A first bonding cycle comprises bonding two groups of three semiconductor structures and one group of two semiconductor structures at a substantially same time to form three bonded semiconductor structures. Additionally, a second bonding cycle comprises bonding the three semiconductor structures fabricated in the first bonding cycle (i.e., a group of three semiconductor structures) to complete bonding of the eight stack multi-layer semiconductor structure.

The eight stack semiconductor structure may also be fabricated in accordance with Embodiment 1 (i.e., method 700) in three (2-4-8) bonding cycles in a manner similar to that shown in FIG. 14, for example.

The above described methods and embodiments provide novel techniques for increasing efficiency of multi-layer semiconductor structure (e.g., 3DIC) fabrication. As illustrated, the methods comprise selection of a pair and/or group of semiconductor structures for bonding and bonding of the semiconductor structures through one or more bonding cycles. For example, the semiconductor structures may be aligned, bonded, and interconnected using via last and or via first processes or techniques. These methods (e.g., 3DIC fabrication techniques) offer many advantages over conventional techniques, for example, providing for an increase in chip stacking without the cumulative yield loss of sequential (build up) processing. These methods may also reduce fabrication cycle time, and provide for reduction in a number of bonding cycles that an individual semiconductor structure (e.g., a sensitive IC) experiences in fabricating a multi-layer semiconductor structure. In embodiments, these methods may be extended to the fabrication of substantially any 3D multi-layer semiconductor structure. Overall, these methods provide highly improved and "low" cost solutions for manufacturing multi-layer semiconductor structures.

As described above and will be appreciated by one of skill in the art, embodiments of the disclosure herein may be configured as a system, method, or combination thereof. Accordingly, embodiments of the present disclosure may be comprised of various means including hardware, software, firmware or any combination thereof. Furthermore, embodiments of the present disclosure may take the form of a computer program product on a computer-readable storage medium having computer readable program instructions (e.g., computer software) embodied in the storage medium. Any suitable non-transitory computer-readable storage medium may be utilized.

It is to be appreciated that the concepts, systems, circuits and techniques sought to be protected herein are not limited to use in a particular application (e.g., filter circuitry in mobile phones, tablets, digital cameras and the like). In contrast, the concepts, systems, circuits and techniques sought to be protected herein may be found useful in substantially any application where a semiconductor manufacturer desires to fabricate multi-layer semiconductor structures (and devices) including a plurality of semiconductor structures.

Having described preferred embodiments, which serve to illustrate various concepts, structures and techniques, which are the subject of this patent, it will now become apparent to those of ordinary skill in the art that other embodiments incorporating these concepts, structures and techniques may be used. Additionally, elements of different embodiments described herein may be combined to form other embodiments not specifically set forth above.

Accordingly, it is submitted that that scope of the patent should not be limited to the described embodiments but rather should be limited only by the spirit and scope of the following claims.

What is claimed is:

1. A method for fabricating a multi-layer semiconductor structure from a plurality of semiconductor structures, each of the semiconductor structures having first and second opposing surfaces and including at least one active layer disposed between the first and second surfaces, the method comprising:

performing a first bonding cycle, comprising:
identifying a number of the semiconductor structures to bond in the first bonding cycle;
forming bonding pairs from selected ones of the identified number of semiconductor structures to bond in the first bonding cycle;
bonding active layers of two or more selected bonding pairs at a substantially same time to provide bonded semiconductor structures; and
performing a first post bond process to remove one or more handles from each of the bonded semiconductor structures to expose one or more active layers in the bonded semiconductor structures; wherein, in at least one of the bonded semiconductor structures from the first post bond process a via is created that electrically interconnects the bonded semiconductor structures and the via to produce an additional metal layer to the bonded semiconductor structures, and the via is further converted to a filled half-via for performing a next bonding cycle, the next bonding cycle comprising:
identifying a number of semiconductor structures to bond in the next bonding cycle;
bonding active layers of selected pairs of the identified number of semiconductor structures at a substantially same time to provide bonded semiconductor structure pairs, the filled half-via bonded to a second filled half-via to create electrical connections between the semiconductor structures; and
performing a next post bond process to remove one or more handles from each of the bonded semiconductor structure pairs to expose one or more active layers in the bonded semiconductor structure pairs;
determining if there are more semiconductor structure pairs to bond in fabricating the multi-layer semiconductor structure; and
in response to there being more semiconductor structure pairs to bond, performing the next bonding cycle,
wherein the multi-layer semiconductor structure comprises at least $2^n$ semiconductor structures, and each of the semiconductor structures experiences a maximum of n bonding cycles in fabricating the multi-layer semiconductor structure, and having substantially small vertical interconnects between any semiconductor layers, where n is greater than or equal to 2;
wherein bonding active layers of selected ones of the bonding pairs comprises depositing multi-layer bondable oxide materials or layers on bonding surfaces of the selected ones of the bonding pairs; and
wherein the bondable oxide material or layer on the bonding surfaces comprises a combination of low temperature oxide (LTO) layer, a Phosphosilicate glass (PSG) layer, and a Borosilicate Glass (BSG) layer stacked on top of each other, and wherein the depositing the bondable oxide material or layer on the bonding surfaces comprises:
planarizing the bonding surfaces of the selected ones of the bonding pairs using chemical-mechanical planarization (CMP); and
depositing the bondable oxide material or layer on the planarized bonding surfaces to an angstrom and/or nano level surface roughness which requires minimum force to activate bonding when bonded with another surface having a substantially similar surface roughness as the deposited bonded oxide material or layer, wherein a low temperature post bond process is applied at a temperature of at least 150 degrees Celsius.

2. The method of claim 1 wherein identifying the number of semiconductor structures to bond in the next bonding cycle comprises: identifying the number of semiconductor structures from the bonded semiconductor structures and from other semiconductor structures of the plurality of semiconductor structures, wherein at least one interconnect structure from the bonded semiconductors includes at least one of a micro via-sub-micro via and micro via-sub-micro via-nano via combination.

3. The method of claim 1 wherein identifying the number of semiconductor structures to bond in the first bonding cycle comprises: selecting the number of semiconductor structures to bond in the first bonding cycle to reduce or minimize a number of bonding cycles which each of the semiconductor structures is subject to during fabrication of the multi-layer semiconductor structure.

4. The method of claim 1 wherein forming bonding pairs from selected ones of the identified number of semiconductor structures comprises: selecting semiconductor structures of the identified number of semiconductor structures to form bonding pairs such that at least one semiconductor structure in each bonding pair has two bondable sides or surfaces.

5. The method of claim 1 wherein bonding active layers of selected ones of the bonding pairs further comprises:
precision aligning the bonding surfaces to sub-micron accuracy;
initiating contact at a substantially center point on the bonding surfaces; and
bonding remaining portions of the bonding surfaces at a substantially same time to provide bonded semiconductor structures.

6. The method of claim 1 further comprising: forming one or more electrical connections between active layers in the bonded semiconductor structures using via last and/or via first techniques.

7. The method of claim 1 wherein performing the first post bond process comprises performing a combination of grinding and wet chemical etching on one or more handles from each of the bonded semiconductor structures to expose one or more active layers in the bonded semiconductor structures.

8. The method of claim 7 further comprising performing chemical mechanical polishing (CMP) and annealing on exposed surfaces of the active layers to prepare the exposed active layer surfaces for subsequent bonding.

9. The method of claim 1 wherein performing the next bonding cycle further comprises:
forming one or more through silicon vias (TSVs) in selected handles of the bonded semiconductor structure pairs.

10. The method of claim 1 wherein:
performing a first bonding cycle, further comprises:
arranging the identified number of semiconductor structures to bond in the first bonding cycle into groups of three semiconductor structures, with each semiconductor structure group including one double-sided bondable semiconductor structure and two single-sided bondable semiconductor structures, wherein each bondable surface includes a filled half-via, and each double-sided bondable semiconductor structure includes at least one TSV to electrically connect a top and bottom filled half-via;

for each of the semiconductor structure groups, bonding the single-sided bondable semiconductor structures to each side of the double-sided bondable semiconductor structure in a single bonding step to provide a bonded semiconductor structure, wherein electrical connections of a first single-sided bondable structure to a second single-sided bondable structure is achieved through the double-sided bondable semiconductor structure using TSV; and performing a first post bond process to remove one or more handles from each of the bonded semiconductor structures to expose one or more active layers in the bonded semiconductor structures; and performing a next bonding cycle, comprising:
identifying a number of semiconductor structures to bond in the next bonding cycle;
bonding active layers of selected groups of the identified number of semiconductor structures to bond in the next bonding cycle at a substantially same time to provide bonded semiconductor structure groups; and
performing a next post bond process to remove one or more handles from each of the bonded semiconductor structure groups to expose one or more active layers in the bonded semiconductor structure groups.

11. The method of claim 10 wherein identifying the number of semiconductor structures to bond in the next bonding cycle comprises: identifying the number of semiconductor structures from the bonded semiconductor structures and from other semiconductor structures of the plurality of semiconductor structures.

12. The method of claim 10 wherein identifying the number of semiconductor structures to bond in the first bonding cycle comprises: selecting the number of semiconductor structures to bond in the first bonding cycle to reduce or minimize a number of bonding cycles which each of the semiconductor structures is subject to during fabrication of the multi-layer semiconductor structure.

13. The method of claim 10 wherein performing the next bonding cycle further comprises: forming one or more electrical connections between the active layers in the bonded semiconductor structure pairs using via last and/or via first techniques.

14. The method of claim 13 further comprising:
forming one or more through silicon vias (TSVs) in selected handles of the bonded semiconductor structure pairs such that the TSVs are electrically coupled to one or more of the electrical connections formed in the active layers.

15. The method of claim 13 wherein performing the next bonding cycle further comprises:
arranging the identified number of semiconductor structures to bond in the next bonding cycle into groups of three semiconductor structures, with each semiconductor structure group including one double-sided bondable semiconductor structure and two single-sided bondable semiconductor structures.

16. The method of claim 10 further comprising:
in the next post bond process, further removing one or more handles from each of the bonded semiconductor structure groups to expose one or more active layers in the bonded semiconductor structure groups.

17. The method of claim 1 wherein the multi-layer semiconductor structure comprises less than $2^n$ but greater than $2^{n-1}$ semiconductor structures, and each of the semiconductor structures experiences a maximum of n bonding cycles in fabricating the multi-layer semiconductor structure, where n is greater than or equal to 3.

18. The method of claim 1 wherein the multi-layer semiconductor structure is fabricated in two or more bonding cycles with at least one of the bonding cycles comprising:
bonding a group of three semiconductor structures at a substantially same time; and
for each of the semiconductor structure groups, bonding single-sided bondable semiconductor structures to each side of a double-sided bondable semiconductor structure to provide a bonded semiconductor structure group, wherein at least one of the bonding cycles includes selecting semiconductor structures as a bonding pairs to bond in a single bonding cycle to produce the multi-layer semiconductor structure, wherein at least one of the bonded semiconductor structure group or pair from the post bond process includes a via that creates electrical connections to the bonded group or pair and the interconnect via produces an additional metal layer to the bonded group or pair, the interconnect via further converted to a filled half-via for performing a next bonding cycle.

19. The method of claim 1 wherein the multi-layer semiconductor structure is fabricated in two or more bonding cycles with at least one of the bonding cycles comprising:
bonding a group of three semiconductor structures at a substantially same time; and
for each of the semiconductor structure groups, bonding single-sided bondable semiconductor structures to each side of a double-sided bondable semiconductor structure to provide a bonded semiconductor structure group; and wherein one or more of remaining ones of the bonding cycles comprise:
selecting bonding pairs to bond in a single bonding cycle to produce the multi-layer semiconductor structure, wherein the multi-layer semiconductor structure comprises less than $2^n$ but greater than $2^{n-1}$ semiconductor structures, and each of the semiconductor structures experiences a maximum of n−1 bonding cycles in fabricating the multi-layer semiconductor structure, where n is greater than or equal to 3.

20. A multi-layer semiconductor structure provided from a plurality of semiconductor structures, each of the semiconductor structures having first and second opposing surfaces and including at least one active layer disposed between the first and second surfaces, the multi-layer semiconductor structure comprising:
at least two multi-layer semiconductor structures, each of the multi-layer semiconductor structures including at least $2^n$ semiconductor structures where n is greater than or equal to 2,
each of the semiconductor structures having first and second opposing surfaces and including:
a first section having first and second opposing surfaces and a plurality of electrical connections extending between select portions of the first and second surfaces, wherein the first surface of the first section corresponds to the first surface of the semiconductor structures;
a second section having first and second opposing surfaces, wherein the first surface of the second section is disposed over and coupled to the second surface of the first section, the second section including:

a device layer having first and second opposing surfaces and a plurality of electrical connections extending between the first and second surfaces, wherein the second surface of the device layer corresponds to the second surface of the second section; and an insulating layer having first and second opposing surfaces, wherein the first surface of the insulating layer corresponds to the first surface of the second section;

one or more conductive structures extending between select ones of the plurality of electrical connections in the first section, select ones of the plurality of electrical connections in the device layer of the second section, and select portions on or beneath the second surface of each of the semiconductor structures; and one or more interconnect pads having first and second opposing surfaces and one or more sides, wherein the first surface of each one of the interconnect pads is disposed over or beneath select portions of at least the second surface of each of the semiconductor structures and select ones of the one or more interconnect pads are electrically coupled to the one or more conductive structures; the multi-layer semiconductor structures further including:

a via joining layer disposed between and coupled to second surfaces of each of the semiconductor structures of the multi-layer semiconductor structures, the via joining layer having first and second opposing surfaces and at least one conductive structure extending between select portions of the first and second surfaces, wherein the at least one conductive structure is electrically coupled to second surfaces of select ones of the one or more interconnect pads on the semiconductor structures of the multi-layer semiconductor structures to form one or more electrical connections between the semiconductor structures of the multi-layer semiconductor structures;

wherein each of the multi-layer semiconductor structures includes a substantially same number of semiconductor structures and a substantially same number of interconnects, wherein each of the semiconductor structures is substantially the same in each of the multi-layer semiconductor structures and each of the interconnects is arranged substantially the same in each of the multi-layer semiconductor structures, and wherein the at least one conductive structure and/or the via joining layer in each of the multi-layer semiconductor structures has substantially different dimensions;

wherein each of the semiconductor structures experiences a maximum of n bonding cycles in fabricating the multi-layer semiconductor structure, and having substantially small vertical interconnects between any semiconductor layers, wherein a number of the semiconductor structures to bond in a first bonding cycle are identified, and bonded pairs from selected ones of the identified number of semiconductor structures to bond are formed with active layers of two or more selected bonding pairs being bonded at a substantially same time to provide bonded semiconductor structures; and one or more handles from each of the bonded semiconductor structures are removed via a first post bond process to expose one or more active layers in the bonded semiconductor structures with at least one of the bonded semiconductor structures from the first post bond process having a via that electrically interconnects the bonded semiconductor structures and the via to produce an additional metal layer to the bonded semiconductor structures, and the via is further converted to a filled half-via for use in a next bonding cycle, in which a number of semiconductor structures to bond are identified and active layers of selected pairs of the identified number of semiconductor structures are bonded to provide bonded semiconductor structure pairs, with the filled half-via bonded to a second filled half-via to create electrical connections between the semiconductor structures and one or more handles from each of the bonded semiconductor structure pairs are removed as part of a next post bond process to expose one or more active layers in the bonded semiconductor structure pairs, and wherein bonded active layers of selected ones of the bonding pairs comprises (a) multi-layer bondable oxide materials or layers deposited on bonding surfaces of the selected ones of the bonding pairs; and wherein the bondable oxide material or layer on the bonding surfaces comprises a combination of low temperature oxide (LTO) layer, a Phosphosilicate glass (PSG) layer, and a Borosilicate Glass (BSG) layer stacked on top of each other, and wherein the deposited bondable oxide material or layer on the bonding surfaces correspond to planarized bonding surfaces of the selected ones of the bonding pairs which are planarized using chemical-mechanical planarization (CMP); and the planarized bonding surfaces have deposited thereon the bondable oxide material or layer deposited to an angstrom and/or nano level surface roughness which requires minimum force to activate bonding when bonded with another surface having a substantially similar surface roughness as the deposited bonded oxide material or layer, wherein a low temperature post bond process is applied at a temperature of at least 150 degrees Celsius.

21. The multi-layer semiconductor device of claim 20 wherein the at least one conductive structure in each of the multi-layer semiconductor structures has substantially different resistances for each of the multi-layer semiconductor structures to substantially distinguish the multi-layer semiconductor structures from each other.

22. The multi-layer semiconductor device of claim 20 wherein the at least one conductive structure and/or the via joining layer in each of the multi-layer semiconductor structures has substantially different compositions for each of the multi-layer semiconductor structures to substantially distinguish the multi-layer semiconductor structures from each other.

23. The multi-layer semiconductor device of claim 20 wherein the at least one conductive structure in the via joining layer includes a plurality of conducting metals, the plurality of metals including at least one of Nickel (Ni), Copper (Cu), Aluminum (Al), Zinc (Zn) and Tin (Sn).

24. The multi-layer semiconductor device of claim 20 wherein the via joining layer comprises an oxide material and/or a dielectric material.

25. The multi-layer semiconductor device of claim 20 wherein the second section of a first one of the at least two semiconductor structures includes a first conductive structure of the one or more conductive structures, the first conductive structure having first and second opposing surfaces extending between the first and second surfaces of the second section of the first one of the at least two semiconductor structures, wherein the first surface of the first conductive structure has first dimensions and the second surface of the first conductive structure has second, different dimensions.

26. The multi-layer semiconductor device of claim 20 wherein at least one of the one or more conductive structures extending between select ones of the plurality of electrical connections in the first section and select ones of the plurality of electrical connections in the device layer of the second section is provided as at least one of a through insulator via (TIV), a micro-bump, a solder bump, a solder coated micro-pillar, a micro pillar, a through silicon via (TSV) conductive structure, or a combination thereof.

27. The multi-layer semiconductor device of claim 20 wherein the insulating layer of the second section is provided from an oxide material including at least one of silicon dioxide ($SiO_2$) and chemically treated silicon oxide (SiO).

* * * * *